US008280076B2

(12) United States Patent
Devantier et al.

(10) Patent No.: US 8,280,076 B2
(45) **Date of Patent: *Oct. 2, 2012**

(54) SYSTEM AND METHOD FOR AUDIO SYSTEM CONFIGURATION

(75) Inventors: Allan O. Devantier, Canyon County, CA (US); Todd S. Welti, Thousand Oaks, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 1831 days.

This patent is subject to a terminal disclaimer.

(21) Appl. No.: 10/964,229

(22) Filed: Oct. 12, 2004

(65) Prior Publication Data

US 2005/0063554 A1 Mar. 24, 2005

Related U.S. Application Data

(63) Continuation-in-part of application No. 10/684,222, filed on Oct. 10, 2003, which is a continuation-in-part of application No. 10/684,152, filed on Oct. 10, 2003, which is a continuation-in-part of application No. 10/684,043, filed on Oct. 10, 2003, which is a continuation-in-part of application No. 10/684,208, filed on Oct. 10, 2003.

(60) Provisional application No. 60/509,799, filed on Oct. 9, 2003, provisional application No. 60/492,688, filed on Aug. 4, 2003.

(51) Int. Cl.

| | |
|---|---|
| ***H03G 5/00*** | (2006.01) |
| ***H03G 7/00*** | (2006.01) |
| ***H04R 29/00*** | (2006.01) |
| ***H04R 5/02*** | (2006.01) |
| ***H04R 3/00*** | (2006.01) |

(52) U.S. Cl. ............ 381/99; 381/58; 381/104; 381/103; 381/98; 381/300; 381/307; 381/107

(58) Field of Classification Search ............ 381/98–100, 381/56–58, 300–307, 102–107
See application file for complete search history.

(56) References Cited

U.S. PATENT DOCUMENTS 4,638,505 A 1/1987 Polk et al.
(Continued)

FOREIGN PATENT DOCUMENTS

EP 1 349 427 A2 10/2003
(Continued)

OTHER PUBLICATIONS

Allison, Roy F., "The Influence of Room Boundaries on Loudspeaker Power Output", *Journal of the Audio Engineering Society*, Jun. 1974, vol. 22, No. 5, pp. 314-320.

(Continued)

*Primary Examiner* — Devona Faulk

(57) ABSTRACT

A system is provided for configuring an audio system for a given space. The system may statistically analyze potential configurations of the audio system to configure the audio system. The potential configurations may include positions of the loudspeakers, numbers of loudspeakers, types of loudspeakers, listening positions, correction factors, filters, or any combination thereof. The statistical analysis may indicate at least one metric of the potential configuration including indicating consistency of predicted transfer functions, flatness of the predicted transfer functions, differences in overall sound pressure level from seat to seat for the predicted transfer functions, efficiency of the predicted transfer functions, or the output of predicted transfer functions. The system also provides a methodology for selecting loudspeaker locations, the number of loudspeakers, the types of loudspeakers, correction factors, listening positions, crossover filters or a combination of these schemes in an audio system that has a single listening position or multiple listening positions.

20 Claims, 52 Drawing Sheets

U.S. PATENT DOCUMENTS

| | | | | |
|---|---|---|---|---|
| 4,888,809 | A | 12/1989 | Knibbeler | |
| 5,384,855 | A * | 1/1995 | Kwang | 381/100 |
| 5,581,626 | A | 12/1996 | Palmer | |
| 5,617,480 | A * | 4/1997 | Ballard et al. | 381/98 |
| 5,638,343 | A | 6/1997 | Ticknor | |
| 5,745,586 | A * | 4/1998 | Tagami et al. | 381/103 |
| 6,031,920 | A | 2/2000 | Wiener | |
| 6,061,648 | A | 5/2000 | Saito | |
| 6,195,435 | B1 | 2/2001 | Kitamura | |
| 7,184,556 | B1 | 2/2007 | Johnson et al. | |
| 7,266,207 | B2 | 9/2007 | Wilcock et al. | 381/310 |
| 2002/0196951 | A1 | 12/2002 | Tsai | |
| 2003/0058786 | A1 | 3/2003 | Sato et al. | |
| 2003/0179891 | A1 * | 9/2003 | Rabinowitz et al. | 381/103 |
| 2006/0153403 | A1 | 7/2006 | Lechner | |

FOREIGN PATENT DOCUMENTS

| | | | |
|---|---|---|---|
| EP | 1 088 298 | B1 | 11/2003 |
| JP | 2000-261900 | | 3/1999 |
| JP | 2000-261900 | A | 9/2000 |
| JP | 2005-151539 | | 6/2005 |

OTHER PUBLICATIONS

Allison, Roy F., "The Sound Field in Home Listening Rooms.II" *Audio Engineering Society*, 52nd Convention Oct. 31-Nov. 3, 1975, AES preprint 1081 (L-2), 15 pages.

Asano, Futoshi; Swanson, David C., "Sound Equalization in Enclosures using Modal Reconstruction", *J. Acoust. Soc. Am*, Oct. 1995, 98 (4), pp. 2062-2069.

Asano, Futoshi; Suzuki, Yoiti; and Swanson, David C., "A Method of Optimizing Source Configuration in Active Control Systems Using Gram-Schmidt Orthogonalization," Electrotechnical Laboratory, 1-1-4 Umezono Tsukuba 305 Japan, asano@etl.go.jp, R.I.E.C. Tohoku Univ., A.R.L. Pennsylvania State University, 4 pages.

Ballagh, K.O., "Optimum Loudspeaker Placement near Reflecting Planes", *J. Audio. Eng. Soc.*, Dec. 1983, vol. 31, No. 12, pp. 931-935.

Benjamin, Eric and Gannon, Benjamin, "Effect of Room Acoustics on Subwoofer Performance and Level Setting," *Journal of the Audio Engineering Society*, 109th Convention, Sep. 22-25, 2000, Los Angeles, California, AES preprint 5232, 36 pages.

Berkovitz, Robert, "Digital Equalization of Audio Signals," *Digital Audio*, pp. 226-238.

Bhartikar, Sunil; Kyriakakis, Chris, "New Factors in Room Equalization Using a Fuzzy Logic Approach," *Journal of the Audio Engineering Society*, Audio Engineering Society Convention Paper 5450, 111th Convention, Sep. 21-24, 2001, New York, New York, pp. 1-10.

Borwick, John (ed.), *Loudspeaker and Headphone Handbook*, Butterworth & Co. (Publishers) Ltd., 1988, ch. 7, pp. 264-318 (total 57 pages).

CARA (Computer Aided Room Acoustics), ELAC Technische Software GmbH, Rendsburger Landstrasse 215, D-24113 Kiel, Germany, http://www.cara.de/ENU/index.html, 1 page.

D'Antonio, Peter D., Cox, Trevor J., "Room Optimizer: A Computer Program to Optimize the Placement of Listener, Loudspeakers, Acoustical Surface Treatment and Room Dimensions in Critical Listening Rooms," RPG Diffuser Systems, Inc., pp. 45-61.

Elliott, S.J., Nelson, P.A., "Multiple-Point Equalization in a Room Using Adaptive Digital Filters", *Journal of the Audio Engineering Society*, Nov. 1989, vol. 37, No. 11, pp. 899-907.

Elliott, S.J.; Bhatia, L.P.; Deghan, F.S.; Fu, A.H.; Stewart, M.S.; Wilson, D.W.;, "Practical Implementation of Low-Frequency Equalization Using Adaptive Digital Filters," *Journal of the Audio Engineering Society*, Dec. 1994, vol. 42, No. 12, pp. 988-998.

Flikkema, Paul G., "*An Algebraic Theory of 3D Sound Synthesis with Loudspeakers*," AES 22nd International Conference on Virtual, Synthetic and Entertainment Audio, pp. 1-4.

Griesinger, David, "Multichannel Sound Systems and Their Interaction with the Room," *AES 15th International Conference*, pp. 159-173.

Groh, A.R., "High Fidelity Sound System Equalization by Analysis of Standing Waves", *Journal of the Audio Engineering Society*, Dec. 1974, vol. 22, No. 10, pp. 795-799.

Horbach, Dr.-Ing. Ulrich; Corteel, Etienne, "*Array Loudspeaker System for Virtual Sound Synthesis*," Patent Application, 10 pages.

Horbach, Ulrich, Karamustafaoglu, Attila, "Numerical Simulation of Wave Fields Created by Loudspeaker Arrays," *Journal of the Audio Engineering Society, AES* preprint 5021 (H-2), 107th Convention, Sep. 24-27, 1999, New York, 17 pages.

Horst, R.; Thoai, N.; Pardalos, Panos M., Thoai Nguyen V., "Introduction to Global Optimization", 2nd Edition, 2000, Kluwer Academic Publishers.

Jacobsen, Oluf, "Some Aspects of the Self and Mutual Radiation Impedance Concepts with Respect to Loudspeakers", *Journal of the Audio Engineering Society*, Mar. 1976, vol. 24, No. 2, pp. 82-92.

Kirkeby Ole; Nelson, Philip A.; Hamada, Hareo; Orduna-Bustamante, Felipe, "Fast Deconvolution of Multi-Channel Systems using Regularization," 1998 IEEE, 1063-6676/98, pp. 189-195.

Kleiner, Mendel; Lahti, Hans, "Computer Prediction of Low Frequency SPL Variations in Rooms as a function of Loudspeaker Placement," *Journal of the Audio Engineering Society*, AES preprint 3577 (G2-7), 94th Convention, Mar. 16-19, 1993, Berlin, 16 pages.

Korst-Fagundes, Bruno, "Acoustical Equalization at Multiple Listening Positions", Selected Portions, UMI Dissertation Services, Degree Date: 1996, 26 pages.

Morse, P.M., *Vibration and Sound*, 2nd. Edition, McGraw Hill, NY, 1948, 25 pages.

Morse, P.M., and Ingard, K.U., *Theoretical Acoustics*, 1968, p. 576-599.

Mourjopoulos, John H., "Digital Equalisation of Room Acoustics," *Journal of the Audio Engineering Society*, 92nd Convention, AES Preprint 3288, Mar. 24-27, Vienna, 1992, 32 pages.

Munshi, Anees Saeed, "Multi-Loudspeaker Multi-Point Room Equalization," Thesis (M.A.Sc.), University of Toronto, 1990, ISBN 0-315-56734-1, 103 pages.

Neely, Stephen T., Allen Jont B., "Invertibility of a room impulse response," *J. Acoust. Soc. Am 66* (1), Jul. 1979, 5 pages.

Olive, Sean E.; Schuck, Peter L.; Sally, Sharon L.; Bonneville, Mark E.; "The Effects of Loudspeaker Placement on Listener's Preference Ratings," *J. Audio Eng. Soc.*, Sep. 1994, vol. 42, No. 9, pp. 651-669.

Oppenheim, Alan V., Schafer, Ronald W., Stockham, Thomas G., Jr., "Nonlinear Filtering of Multiplied and Convolved Signals", IEEE Transactions on Audio and Electroacoustics, Sep. 1968, vol. AU-16, No. 3, pp. 437-466.

Oppenheim, Alan V.; Schafer, Ronald W.; Buck, John R., Discrete Signal Processing, 2nd Edition, 1999, Prentice Hall, 4 pages.

Pedersen, Jan A.; Hermansen, Kjeld; and Rubak, Per, "The Distribution of the Low Frequency Sound Field and its Relation to Room Equalization", *Journal of the Audio Engineering Society*, 96th Convention, AES preprint 3852 (P12.5), Feb. 26-Mar. 1, 1994, Amsterdam, 33 pages.

Santillin, Arturo Orozco, "Experimental Low-Frequency Sound Equalization in an Extended Region of an enclosure Using Adaptive Filters," *Journal of the Audio Engineering Society*, AES preprint 4755 (P8-4), 104th Convention, May 16-19, 1998, Amsterdam, 9 pages.

Walker, R., "Low-Frequency Room Responses: Part 2—Calculation Methods and Experimental Results," *BBC Research Dept*. Report BBD RD 1992/9, 1992, 21 pages.

Waterhouse, Richard V. "Output of a Sound Source in a Reverberation Chamber and Other Reflecting Environments," *The Journal of the Acoustical Society of America*, vol. 30, No. 1, pp. 4-13.

Welti, Todd, "How Many Subwoofers are Enough" *Journal of the Audio Engineering Society*, Audio Engineering Society Convention Paper, 112th Convention May 10-13, 2002, Munich Germany, pp. 1-15.

Welti, Todd, "Subwoofers: Optimum Number and Locations," 30 pages.

Zacharov, Nick; Bech, Soren; Meares, David, "The Use of Subwoofers in the Context of Surrond Sound Program Reproduction," *J. Audio Eng. Soc.*, Apr. 1998, vol. 46, No. 4, pp. 276-287.

Office Action from corresponding Japanese Appln. No. 2004-298282 dated May 1, 2009 (English Translation).

Allison, Roy F.; The Influence of Room Boundaries on Loudspeaker Power Output; Journal of the Audio Engineering Society; pp. 314-320.

Allison, Roy F.; The Sound Field in Home Listening Rooms II; 14pp.
Asano, Futoshi and Swanson, David C.; Sound Equalization in Enclosures Using Modal Reconstruction; J. Acoust. Soc. Am. 98 (4); Oct. 1995; pp. 2062-2069.
Asano, Futoshi; Suzuki, Yoiti; and Swanson, David C.; A Method of Optimizing Source Configuration in Active Control Systems Using Gram-Schmidt Orthogonalization; 4pp.
Ballagh, K.O.; Optimum Loudspeaker Placement Near Reflecting Planes; J. Audio Eng. Soc.; vol. 31, No. 12; Dec. 1983; pp. 931-935.
Benjamin, Eric and Gannon, Benjamin; Effect of Room Acoustics on Subwoofer Performance and Level Setting; 109th AES Convention; Sep. 22-25, 2000; Los Angeles, CA; pp. 1-35.
Berkovitz, Robert; Digital Equalization of Audio Signals; Digital Audio; pp. 226-238.
Bharitkar, Sunil and Kyriakakis Chris; New Factors in Room Equalization Using a Fuzzy Logic Approach; Convention Paper 5450; AES 111th Convention; Sep. 21-24, 2001; New York; pp. 1-10.
Borwick, John (ed); Loudspeaker and Headphone Handbook; Butterworths; pp. 264-318.
CARA—Computer Aided Room Acoustics; CARA 2.2 PLUS PowerPack; www.cara.de; 1pg.
D'Antonio, Peter and Cox, Trevor J.; Room Optimizer: A Computer Program to Optimize the Placement of Listener, Loudspeakers, Acoustical Surface Treatment and Room Dimensions in Critical Listening Rooms; pp. 45-61.
Elliott, S.J. and Nelson, P.A.; Multiple-Point Equalization in a Room Using Adaptive Digital Filters; J. Audio Eng. Soc.; vol. 37, No. 11; Nov. 1989; pp. 899-907.
Elliott, S. J.; Practical Implementation of Low-Frequency Equalization Using Adaptive Digital Filters; J. Audio Eng. Soc.; vol. 42, No. 12, Dec. 1994; pp. 988-998.
Flikkema, Paul G.; An Algebraic Theory of 3D Sound Synthesis with Loudspeakers; AES 22nd International Confererence on Virtual, Synthetic and Entertainment Audio; pp. 1-4.
Griesinger, David; Multichannel Sound Systems and Their Interaction with the Room; AES 15th International Conference; pp. 159-173.
Groh, Allen R.; High-Fidelity Sound System Equalization by Analysis of Standing Waves; Journal of the Audio Engineering Society; Dec. 1974; vol. 22, No. 10; pp. 795-799.
Horbach, Ulrich and Corteel, Etienne; Array Loudspeaker System for Virtual Sound Synthesis; Patent Application; 10pp.
Horbach, Ulrich; Karamustafaoglu, Attila; Rabenstein, Rudolf; Runze, Gerhard; and Steffen, Peter; Numercal Stimulation of Wave Fields Created by Loudspeaker Arrays; AES 107th Convention; Sep. 24-27, 1999; New York, NY; 17pp.
Horst, R.; Pardalos, Panos M.; and Thoai, Nguyen Van; Introduction fo Global Optimization—Section Edition (Nonconvex Optimization and its Applications); www.amazon.com.
Jacobsen, Oluf; Some Aspects of the Self and Mutual Radiation Impedance Concept with Respect to Loudspeakers; Journal of the Audio Engineering Society; 82-92.
Kirkeby; Ole; Nelson, Philip A.; Hamada, Hareo; and Orduna-Bustamante, Felipe; Fast Deconvolution of Multichannel Systems Using Regularization; IEEE Transactions on Speech and Audio Processing; vol. 6, No. 2; Mar. 1998; pp. 189-195.
Kleiner, Mendel and Lahti, Hans; Computer Prediction of Low Frequency SPL Variations in Rooms as a function of Loudspeaker Placement; AES 94th Convention; Mar. 16-19, 1993, Berlin, Germany: pp. 1-15.
Korst-Fagundes, Bruno; Acoustical Equalization at Multiple Listening Positions; UMI Dissertation Services; 26pp.
Morse, Philip M.; Vibration and Sound; McGraw-Hill Book Company, Inc.; 1948; 25 pp.
Morse, P.M. and Ku, Ingard; Theoretical Acoustics; Sound Waves in Ducts in Rooms; 1968; pp. 576-598.
Mourjopoulos, John; Digital Equalisation of Room Acoustics; AES 92nd Convention; Mar. 24-27, 1992; Vienna, Austria; pp. 1-31.
Munshi, Anees Saeed; Multi-Loudspeaker Multi-Point Room Equalization; 101 pp.
Neely, Stephen T. and Allen, Jon B.; Invertibility of a Room Impulse Response; J. Acoust. Soc. Am. 66(1); Jul. 1979; pp. 165-169.
Olive, Sean E.; Schuck, Peter L.; Sally, Sharon I.; and Bonneville, Marc E.; The Effects of Loudspeaker Placement on Listener Preference Ratings; J. Audio Eng. Soc.; vol. 42, pp. 651-669.
Oppenheim, Alan V.; Schafer, Ronald W. and Stockham, Thomas G.; Nonlinear Filtering Multiplied and Convoluted Signals; IEEE Transactions on Audio and Electroacoustics; vol. AU—No. 3; Sep. 1968; pp. 437-466.
Oppenheim, Alan V.; Schafer, Ronald W.; and Buck, John R.; Discrete-Time Signal Processing (second edition); 4pp.
Pederson, Jan Abildgaard; Hermansen, Kjeld; and Rubak, Per; The Distribution of the Low Frequency Sound Field and its Relation to Room Equalization; AES 96th Convention; Feb. 26-Mar. 1, 1994; Amsterdam, The Netherlands; 32pp.
Santillin, Arturo Orozco; Experimental Low-Frequency Sound Equalization in an Extended Region of an Enclosure Using Adaptive Filters; AES 104th Convention; May 16-19; Amsterdam; The Netherlands; 9pp.
Walker, R.; Low-Frequency Room Resopnses; Part 2—Calculation methods and experimental results; BBC Research Department Report; ; 1992; 21pp.
Waterhouse, Richard V.; Output of a Sound Source in a Reverberation Chamber and Other Reflecting Environments; The Journal of the Acoustical Society of America; vol. 30, No. 1; Jan. 1958: pp. 4-13.
Welti, Todd; How Many Subwoofers are Enough?; Audio Engineering Society; Convention Paper; AES 112th Convention; May 10-13, 2002; Munich, Germany; pp. 1-15.
Zacharov, Nick; Bech, Soren; and Meares, David; The Use of Subwoofers in the Context Surround Sound Program Reproduction; J. Audio Eng. Soc.; vol. 46, No. 4; Apr. 1998; pp. 276-287.

* cited by examiner

| | Raw Data | | | | | | | | | |
|---|---|---|---|---|---|---|---|---|---|---|
| frequency | seat 1 | seat 2 | seat 3 | seat 4 | seat 5 | Spatial Average | Spatial Variance | Spatial STDEV | Spatial Envelope | Spatial Max-ave |
| 20 | -17.71 | -16.38 | -18.13 | -14.51 | -12.99 | -15.94 | 4.72 | 2.17 | 5.14 | 2.96 |
| 22 | -16.60 | -15.62 | -15.44 | -5.07 | -6.21 | -11.79 | 31.88 | 5.65 | 11.53 | 6.72 |
| 24 | -17.26 | -24.25 | -20.21 | -10.22 | -13.12 | -17.01 | 31.00 | 5.57 | 14.03 | 6.79 |
| 26 | -11.73 | -14.44 | -16.10 | -8.19 | -9.83 | -12.06 | 10.53 | 3.25 | 7.92 | 3.87 |
| 28 | -11.72 | -14.14 | -13.79 | -3.30 | -8.24 | -10.24 | 20.54 | 4.53 | 10.83 | 6.94 |
| 30 | -19.70 | -17.51 | -13.79 | -8.16 | -8.69 | -13.57 | 26.58 | 5.16 | 11.54 | 5.41 |
| 32 | -22.44 | -22.50 | -19.69 | -13.33 | -12.41 | -18.07 | 23.96 | 4.90 | 10.09 | 5.66 |
| 34 | -19.80 | -19.50 | -21.25 | -17.85 | -16.70 | -19.02 | 3.14 | 1.77 | 4.55 | 2.32 |
| 36 | -19.06 | -19.48 | -18.22 | -13.00 | -19.80 | -17.91 | 7.89 | 2.81 | 6.80 | 4.91 |
| 38 | -19.83 | -17.91 | -20.68 | -14.88 | -23.61 | -19.38 | 10.54 | 3.25 | 8.73 | 4.50 |
| 40 | -18.75 | -16.72 | -17.08 | -20.89 | -22.82 | -19.25 | 6.71 | 2.59 | 6.10 | 2.53 |
| 42 | -15.02 | -13.59 | -14.73 | -18.38 | -21.44 | -16.63 | 10.41 | 3.23 | 7.85 | 3.04 |
| 44 | -13.85 | -12.98 | -13.78 | -21.20 | -18.60 | -16.08 | 13.10 | 3.62 | 8.22 | 3.10 |
| 46 | -15.85 | -13.80 | -12.74 | -18.62 | -13.84 | -14.97 | 5.43 | 2.33 | 5.88 | 2.23 |
| 48 | -16.58 | -12.29 | -15.48 | -14.20 | -10.02 | -13.71 | 6.80 | 2.61 | 6.55 | 3.69 |
| 50 | -6.76 | -4.32 | -7.56 | -12.47 | -6.48 | -7.52 | 9.09 | 3.02 | 8.15 | 3.20 |
| 52 | 0.47 | 2.07 | -0.50 | -7.13 | -0.89 | -1.19 | 12.33 | 3.51 | 9.21 | 3.27 |
| 54 | 5.22 | 7.20 | 5.79 | -0.33 | 5.60 | 4.70 | 8.45 | 2.91 | 7.53 | 2.50 |
| 56 | 5.60 | 7.68 | 6.99 | 2.99 | 8.86 | 6.42 | 5.07 | 2.25 | 5.87 | 2.44 |
| 58 | 4.13 | 5.71 | 5.20 | 2.36 | 8.14 | 5.11 | 4.52 | 2.13 | 5.78 | 3.03 |
| 60 | 1.31 | 2.94 | 3.23 | 2.15 | 6.85 | 3.30 | 4.50 | 2.12 | 5.54 | 3.55 |
| 62 | -0.95 | 0.43 | 1.43 | -0.04 | 2.53 | 0.68 | 1.80 | 1.34 | 3.47 | 1.85 |
| 64 | -6.34 | -4.22 | -2.79 | -1.93 | 0.77 | -2.90 | 7.00 | 2.64 | 7.11 | 3.67 |
| 66 | -6.57 | -3.47 | -1.77 | -6.68 | -4.59 | -4.62 | 4.37 | 2.09 | 4.91 | 2.85 |
| 68 | -2.12 | 0.25 | 1.84 | -18.61 | -7.12 | -5.15 | 68.03 | 8.25 | 20.45 | 6.99 |
| 70 | -6.24 | -4.01 | -0.33 | -5.86 | -1.09 | -3.51 | 7.29 | 2.70 | 5.91 | 3.17 |
| 72 | -5.02 | -1.94 | -3.21 | -4.27 | -1.03 | -3.09 | 2.68 | 1.64 | 3.99 | 2.06 |
| 74 | -6.33 | -1.93 | 0.01 | -9.78 | -10.56 | -5.72 | 21.88 | 4.68 | 10.57 | 5.73 |
| 76 | -8.14 | -3.79 | -1.29 | -12.48 | -18.59 | -8.86 | 47.82 | 6.92 | 17.30 | 7.57 |
| 78 | -21.63 | -9.69 | -4.21 | -16.46 | -8.91 | -12.18 | 47.03 | 6.86 | 17.42 | 7.97 |
| 80 | -5.65 | -10.12 | -6.63 | -11.59 | -5.71 | -7.94 | 7.50 | 2.74 | 5.94 | 2.29 |
| Mean Level | -10.16 | -8.66 | -8.22 | -9.74 | -8.08 | Mean Overall Level | Mean Spatial Variance | Mean Spatial STDEV | Mean Spatial Envelope | Mean Spatial Max-ave |
| Mean Overall Level | | | -8.97 | | | -8.97 | 15.24 | 3.52 | 8.55 | 4.09 |
| Variance of Mean Levels | | | 0.86 | | | | | | | |
| STDEV of Mean Levels | | | 0.93 | | | | | | | |
| Envelope of Mean Levels | | | 2.08 | | | | | | | |
| Max-ave of Mean Levels | | | 0.89 | | | | | | | |

| Variance of Spatial Average | STDEV of Spatial Average | Envelope of Spatial Average | Max-ave of Spatial Average |
|---|---|---|---|
| 62.7919 | 7.924135 | 25.80 | 15.39 |

FIG. 10

FIG. 13

Illustrative Solution Sets Ranked by Spatial Variance

| Solution | MSV | AE | VSA | S | Gain (dB) | Delay (ms) | Eq. Center (Hz) | Eq Bandwidth (Q) | Eq. Level (dB) |
|---|---|---|---|---|---|---|---|---|---|
| 1 | 4.0 | 12 | 18 | 1, 2 | 0, 0 | 0, 5 | 82, 37 | 1, 4 | 0, -6 |
| 2 | 4.4 | 19 | 15 | 1, 2, 3 | -6, 0, -12 | 0, 10, 0 | 22, 64, 85 | 1, 4, 1 | -12, 0, -6 |
| 3 | 5 | 14 | 13 | 2, 3 | -6, 0 | 10, 0 | 27, 41 | 8, 1 | -6, -12 |
| 4 | 6 | 10 | 16 | 3, 4 | -12, 0 | 0, 0 | 93, 51 | 1, 8 | -12, 0 |
| 5 | 10 | 23 | 20 | 1, 3, 4 | 0, -12, 0 | 5, 0 | 34, 86 | 1, 1, 8 | 0, 0, -12 |
| 10,000 | 17 | 2 | 56 | 1, 4 | -6, -12 | 0, 10 | 27, 91 | 8, 8 | -6, -12, -6 |

SYSTEM AND METHOD FOR AUDIO SYSTEM CONFIGURATION

RELATED APPLICATIONS

This application is a continuation-in-part of U.S. patent application Ser. No. 10/684,222, entitled "Statistical Analysis of Potential Audio System Configurations," filed on Oct. 10, 2003, which claims priority to U.S. Provisional Application Ser. No. 60/509,799 entitled "In-Room Low Frequency Optimization," filed on Oct. 9, 2003, and which claims priority to U.S. Provisional Application Ser. No. 60/492,688 filed on Aug. 4, 2003. This application is also a continuation-in-part of U.S. patent application Ser. No. 10/684,152, entitled "System for Selecting Correction Factors for an Audio System," filed on Oct. 10, 2003, which claims priority to U.S. Provisional Application Ser. No. 60/509,799 filed on Oct. 9, 2003, and which claims priority to U.S. Provisional Application Ser. No. 60/492,688 filed on Aug. 4, 2003. This application is also a continuation-in-part of U.S. patent application Ser. No. 10/684,043, entitled "System for Selecting Speaker Locations in an Audio System," filed on Oct. 10, 2003, which claims priority to U.S. Provisional Application Ser. No. 60/509,799, and which claims priority to U.S. Provisional Application Ser. No. 60/492,688 filed on Aug. 4, 2003. This application is also a continuation-in-part of U.S. patent application Ser. No. 10/684,208, entitled "System for Configuring Audio System," filed on Oct. 10, 2003, which claims priority to U.S. Provisional Application Ser. No. 60/509,799, and which claims priority to U.S. Provisional Application Ser. No. 60/492,688 filed on Aug. 4, 2003. U.S. patent application Ser. No. 10/684,222 is incorporated by reference herein in its entirety. U.S. patent application Ser. No. 10/684,152 is incorporated by reference herein in its entirety. U.S. patent application Ser. No. 10/684,043 is incorporated by reference herein in its entirety. U.S. patent application Ser. No. 10/684,208 is incorporated by reference herein in its entirety. U.S. Provisional Application Ser. No. 60/509,799 is incorporated by reference herein in its entirety. U.S. Provisional Application Ser. No. 60/492,688 is incorporated by reference herein in its entirety.

BACKGROUND OF THE INVENTION

1. Technical Field

This invention generally relates to improving sound system performance in a given space. More particularly, the invention relates to improving the frequency response performance for one or more listening positions in a given area thus providing a more enjoyable listening experience.

2. Related Art

Sound systems typically include loudspeakers that transform electrical signals into acoustic signals. The loudspeakers may include one or more transducers that produce a range of acoustic signals, such as high, medium and low-frequency signals. One type of loudspeaker is a subwoofer that may include a low frequency transducer to produce low-frequency signals.

The sound systems may generate the acoustic signals in a variety of listening environments. Examples of listening environments include, but are not limited to, home listening rooms, home theaters, movie theaters, concert halls, vehicle interiors, recording studios, and the like. Typically, a listening environment includes single or multiple listening positions for a person or persons to hear the acoustic signals generated by the loudspeakers. The listening position may be a seated position, such as a section of a couch in a home theater environment, or a standing position, such as a spot where a conductor may stand in a concert hall.

The listening environment may affect the acoustic signals, including the low, medium and/or high frequency signals at the listening positions. Depending on where a listener is positioned in a room, the loudness of the sound can vary for different tones. This may especially be true for low-frequencies in smaller domestic-sized rooms because the loudness (measured by amplitude) of a particular tone or frequency may be artificially increased or decreased. Low frequencies may be important to the enjoyment of music, movies, and most other forms of audio entertainment. In the home theater example, the room boundaries, including the walls, draperies, furniture, furnishings, and the like may affect the acoustic signals as they travel from the loudspeakers to the listening positions.

The acoustic signals received at the listening positions may be measured. One measure of the acoustical signals is a transfer function that may measure aspects of the acoustical signals including the amplitude and/or phase at a single frequency, a discrete number of frequencies, or a range of frequencies. The transfer function may measure frequencies in various ranges.

The amplitude of the transfer function indicates the loudness of a sound. Generally, the amplitude of a single frequency or a range of frequencies is measured in decibels (dB). Amplitude deviations may be expressed as positive or negative decibel values in relation to a designated target value. When amplitude deviations are considered at more than one frequency, the target curve may be flat or of any shape. An amplitude response is a measurement of the amplitude deviation at one or more frequencies from the target value at those frequencies. The closer the amplitude values measured at a listening position correspond to the target values, the better the amplitude response. Deviations from the target reflect changes that occur in the acoustic signal as it interacts with room boundaries. Peaks represent an increased amplitude deviation from the target, while dips represent a decreased amplitude deviation from the target.

These deviations in the amplitude response may depend on the frequency of the acoustic signal reproduced by the subwoofer, the subwoofer location, and the listener position. A listener may not hear low-frequencies as they were recorded on the recording medium, such as a soundtrack or movie, but instead as they were distorted by the room boundaries. Thus, the room can change the acoustic signal that was reproduced by the subwoofer and adversely affect the frequency response performance, including the low-frequency performance, of the sound system.

Many techniques attempt to reduce or remove amplitude deviations at a single listening position. One such technique comprises global equalization, which applies filters equally to all subwoofers in the system. Generally, the amplitude is measured at multiple frequencies at a single position in the room. For example, an amplitude measurement may be taken at 25, 45, 65, and 80 Hz to give an amplitude deviation for each measured frequency. Global equalization may comprise applying filters at each of the subwoofers to reduce a +10 dB deviation at 65 Hz. Global equalization may thus reduce amplitude deviations by either reducing the amplitude of the frequency range having positive deviations from the target or boosting the output of the subwoofers at the frequency range having the greatest negative deviation from the target. Global equalization, however, may only correct amplitude deviations at a single listening position.

Another technique which attempts to reduce or remove amplitude deviations is spatial averaging. Spatial averaging, which is a more advanced equalization method, calculates an average amplitude response for multiple listening positions, and then equally implements the equalization for all subwoofers in the system. Spatial averaging, however, only corrects for a single "average listening position" that does not exist in reality. Thus, even when using spatial averaging techniques, some listening positions still have a significantly better low-frequency performance than other positions. Moreover, attempting to equalize for a single location potentially creates problems. While peaks may be reduced at the average listening position, attempting to reduce the dips requires significant additional acoustic output from the subwoofer, thus reducing the maximum acoustic output of the system and potentially creating large peaks in other areas of the room.

Apart from equalization and spatial averaging, prior techniques have attempted to improve the sound quality at a specific listening position using loudspeaker positioning. One technique analyzes standing waves in order to optimize the placement of the loudspeakers in a room. Standing waves may result from the interaction of acoustic signals with the room boundaries, creating modes that have large amplitude deviations in the low-frequency response. Modes that depend only on a single room dimension are called axial modes. Modes that are determined by two room dimensions are called tangential modes and, modes that are the result of all three room dimensions are called oblique modes.

FIG. 1 is a pictorial representation of the first four axial modes for a single room dimension for an instant in time. Sound pressure maxima exist at the room boundaries (i.e., the two ends in FIG. 1). The point where the sound pressure drops to its minimum value is commonly referred to as a "null." If there is no mode damping at all the sound pressure at the nulls drops to zero. However, in most real rooms the response dip at the nulls are in the −20 dB range. As shown in FIG. 1, standing waves may have peaks and dips at different positions throughout the room so that large amplitude deviations may occur depending on where a listener is positioned. Thus, if listener C is positioned in a 30 Hz peak, any 30 Hz frequency produced by the subwoofer will sound much louder than it should. Conversely, if listener D is positioned in a 30 Hz dip, any 30 Hz frequency produced by the subwoofer will sound much softer than it should. Neither corresponds to the acoustic signal reproduced by the subwoofer or previously recorded on the recording medium.

There are several methods to reduce standing waves in a given listening room through positioning of loudspeakers. One method is to locate the subwoofer at the nulls of the standing waves. Specifically, the loudspeaker and a specific listening position may be carefully selected within the room so that the transfer function may be made relatively smooth at the specific listening position. A potential loudspeaker-listener location combination is shown in FIG. 2 with the first four axial modes along the length of the room. The specific listening position may be located away from the maxima and nulls for the first, second and fourth order modes, while the loudspeaker may be located on the null of the third order mode. As a result, if these are the only resonant modes in the room, this specific listening position should have a relatively smooth transfer function. However, this method merely focuses on a single, specific listening position in order to reduce the effects of standing waves in the listening environment; it does not consider multiple listening positions or a listening area. In practice, the presence of other axial, tangential, and oblique room modes make prediction using this method unreliable.

Another method is to position multiple subwoofers in a "mode canceling" arrangement. By locating multiple loudspeakers symmetrically within the listening room, standing waves may be reduced by exploiting destructive and constructive interference. However, the symmetric "mode canceling" configuration assumes an idealized room (i.e., dimensionally and acoustically symmetric) and does not account for actual room characteristics including variations in shape or furnishings. Moreover, the symmetric positioning of the loudspeakers may not be a realistic or desirable configuration for the particular room setting.

Still another technique to configure the audio system in order to reduce amplitude deviations is using mathematical analysis. One such mathematical analysis simulates standing waves in a room based on room data. For example, room dimensions, such as length, width, and height of a room, are input and the various algorithms predict where to locate a subwoofer based on data input. However, this mathematical method does not account for the acoustical properties of a room's furniture, furnishings, composition, etc. For example, an interior wall having a masonry exterior may behave very differently in an acoustic sense than its wood framed counterpart. Further, this mathematical method cannot effectively compensate for partially enclosed rooms and may become computationally onerous if the room is not rectangular.

Another mathematical method analyzes the transfer functions received at the listening positions and solves for equal transfer functions received at the listening positions. FIG. 3 illustrates an example of a multi-subwoofer multi-receiver scenario in a room. Reference 1 is the signal input to the system. The loudspeaker/room transfer functions from loudspeaker 1 and loudspeaker 2 to two receiver locations in the room are shown as $H_{11}$ through $H_{22}$, while $R_1$ and $R_2$ represent the resulting transfer functions at two receiver locations. Each source has a transmission path to each receiver, resulting in four transfer functions in this example. Assuming the signal sent to each loudspeaker can be electrically modified, represented by $M_1$ and $M_2$, the modified signals may be added. Here, M is a complex modifier that may or may not be frequency dependent. To illustrate the complexity of the mathematical solution, the following equations solve a linear time invariant system in the frequency domain:

$$R_1(f)=IH_{11}(f)M_1(f)+IH_{21}(f)M_2(f)$$

$$R_2(f)=IH_{12}(f)M_1(f)+IH_{22}(f)M_2(f) \tag{1}$$

where all transfer functions and modifiers are understood to be complex. This is recognized as a set of simultaneous linear equations, and can be more compactly represented in matrix form as:

$$\begin{bmatrix} H_{11} & H_{21} \\ H_{12} & H_{22} \end{bmatrix} \begin{bmatrix} M_1 \\ M_2 \end{bmatrix} = \begin{bmatrix} R_1 \\ R_2 \end{bmatrix}, \tag{2}$$

or simply, $$HM=R, \tag{3}$$

where the input 1 has been assumed to be unity.

A typical goal for optimization is to have R equal unity, i.e. the signal at all receivers is identical to each other. R may be viewed as a target function, where $R_1$ and $R_2$ are both equal to 1. Solving equation (3) for M (the modifiers for the audio system), $M=H^{-1}$, the inverse of H. Since H is frequency dependent, the solution for M must be calculated at each frequency. The values in H, however, may be such that an inverse may be impossible to calculate or unrealistic to implement (such as unrealistically high gains for some loudspeakers at some frequencies).

As an exact mathematical solution is not always feasible to determine, prior approaches have attempted to determine the best solution calculable, such as the solution with the smallest error. The error function defines how close is any particular configuration to the desired solution, with the lowest error representing the best solution. However, this mathematical methodology requires a tremendous amount of computational energy, yet only solves for a two-parameter solution. Acoustical problems that examine a greater number of parameters are increasingly difficult to solve.

Therefore, a need exists for a system to accurately determine a configuration for an audio system such that the audio performance for one or more listening positions in a given space is improved.

SUMMARY

This invention is a system for configuring an audio system for a given space, such as a room or an interior of a vehicle. The system may analyze any variable or parameter in the audio system configuration that affects the transfer function at a single listening position or multiple listening positions. Examples of parameters include the position of the loudspeakers, the number of loudspeakers, the type of loudspeakers, the listening positions, correction factors (e.g., filtering (one example is parametric equalization), frequency independent gain, and delay), and crossover filters.

The system provides a statistical analysis of predicted transfer functions. The statistical analysis may be used to configure a single or multiple listener audio system, such as to select a value for a parameter or values for parameters in the audio system. Transfer functions, including amplitude and phase, may be measured at a single listening position or multiple listening positions. The transfer functions may comprise raw data measured by placing a loudspeaker at potential loudspeaker locations and by registering the transfer functions at the listening positions using a microphone or other acoustic measuring device. The transfer functions may then be modified using potential configurations of the audio system, such as potential parameter values. Examples of potential parameter values include potential positions for the loudspeakers, potential numbers of loudspeakers, potential types of loudspeakers, potential values for correction factors, and/or potential values for crossover filters. The modified transfer functions may represent predicted transfer functions for the potential configurations. At least a portion of the predicted transfer functions, such as the amplitude or the amplitude within a particular frequency band, may then be statistically analyzed for the single listening position or the multiple listening positions. The statistical analysis may represent a particular metric of the predicted transfer functions, such as flatness, consistency, efficiency, smoothness, etc. Based on the statistical analysis, the audio system may be configured. For example, values for a single or multiple parameters may be selected based on the statistical analysis, such as the parameters in the predicted transfer functions that maximize or minimize the particular metric. In this manner, the configuration of the audio system may be improved or optimized for the listening positions. Where the space is an interior of a vehicle, an audio system for the vehicle may be configured using the single or multiple parameters selected based on the statistical analysis. Where the space is a room, an audio system for the room may be configured using the single or multiple parameters selected based on the statistical analysis.

There are many types of statistical analyses that may be performed with the predicted transfer functions. A first type of statistical analysis may indicate consistency of the predicted transfer functions across the multiple listening positions. Examples of the first type include mean spatial variance, mean spatial standard deviation, mean spatial envelope (i.e., min and max), and mean spatial maximum average, if the system is equalized. A second type of statistical analysis may measure flatness of the predicted transfer functions. Examples of the second type include variance of spatial average, standard deviation of the spatial average, envelope of the spatial average, and variance of the spatial minimum. A third type of statistical analysis may measure the differences in overall sound pressure level from seat to seat for the predicted transfer functions. Examples of the third type include variance of mean levels, standard deviation of mean levels, envelope of mean levels, and maximum average of mean levels. The statistical analysis may provide a metric of the differences, such as consistency, flatness or sound pressure level differences, so that the configuration that minimizes or maximizes the metrics (e.g., increases flatness) may be selected.

A fourth type of statistical analysis examines the efficiency of the predicted transfer functions at a single listening position or multiple listening positions. In effect, the statistical analysis may be a measure of the efficiency of the sound system for a particular frequency, frequencies, or range of frequencies at the single listening position or the multiple listening positions. An example of the fourth type includes acoustic efficiency. For a single listening position audio system, the acoustic efficiency may measure the mean level divided by the total drive level for each loudspeaker. For a multiple listening position audio system, the acoustic efficiency may measure the mean overall level divided by the total drive level for each loudspeaker. Acoustic efficiencies for the predicted transfer functions may be examined, and the configuration for the predicted transfer function with a higher or the highest acoustic efficiency may be selected.

A fifth type of statistical analysis examines output of predicted transfer functions at the single listening position or the multiple listening positions. The statistical analysis may be a measure of the raw output of the sound system for a particular frequency, frequencies, or range of frequencies at the single listening position or the multiple listening positions. For an audio system with a single listening position, an example of a statistical analysis examining output includes mean level. For an audio system with multiple listening positions, an example of a statistical analysis examining output includes mean overall level. A sixth type of statistical analysis examines flatness of predicted transfer functions at a single listening position. The statistical analysis may analyze variations of the predicted transfer functions at the single listening position, such as amplitude variance and amplitude standard deviation.

The system also provides a methodology for selecting loudspeaker locations, the number of loudspeakers, the types of loudspeakers, correction factors, listening positions, crossover filters, or a combination of these schemes in an audio system that has a single listening position or multiple listening positions. For example, in a given space, loudspeakers may be placed in a multitude of potential positions. The invention includes a system for selecting the loudspeaker locations for the given space. Transfer functions may be measured at the single listening position or the multiple listening positions by placing a loudspeaker at the potential loudspeaker locations and recording the transfer functions at the single listening position or the multiple listening positions. The transfer functions may then be modified based on the potential loudspeaker locations in order to generate predicted transfer functions. For example, based on different combinations of potential loudspeaker locations, the transfer functions may be combined to generate the predicted transfer functions. The predicted transfer functions may be statistically analyzed to indicate certain aspects of the predicted transfer functions, such as flatness, consistency, efficiency, etc. The selection of the loudspeaker locations may be based on a predicted transfer function that exhibits a desired aspect or set of aspects.

As another example, a given space may allow for different numbers of loudspeakers for the audio system. The invention includes a system for selecting the number of loudspeakers for an audio system in a given space. Transfer functions for the single listening position or the multiple listening positions in the audio system may be modified based on potential numbers of loudspeakers. For example, potential combinations of loudspeakers that are equal to one of the potential number of loudspeakers may be analyzed by combining the transfer functions to generate predicted transfer functions. The predicted transfer functions may be statistically analyzed to indicate certain aspects of the predicted transfer functions, such as flatness, consistency, efficiency, etc. The selection of the number of loudspeakers may be based on a predicted transfer function that exhibits a desired aspect or set of aspects. The selected number of loudspeakers may then be implemented in a particular audio system, such as an audio system in a vehicle.

As still another example, loudspeakers may differ from one another based on a quality or qualities. For example, loudspeakers may differ based on radiation pattern (e.g., monopole versus dipole). As another example, loudspeakers may differ based on changing the polarity. The invention includes a system for selecting a type or types of loudspeakers for an audio system having a single listening position or multiple listening positions. Transfer functions may be measured by placing types of loudspeakers at potential loudspeaker locations and recording the transfer functions. For example, each type of loudspeaker may be placed at each potential loudspeaker location and the transfer functions at the listening positions may be recorded. The transfer functions may be modified based on the type of loudspeakers. For example, potential combinations of different types of loudspeakers may be analyzed by combining the transfer functions to generate predicted transfer functions. The predicted transfer functions may be statistically analyzed to indicate certain aspects of the predicted transfer functions, such as flatness, consistency, efficiency, etc. The selection of the type or types of loudspeakers may be based on a predicted transfer function that exhibits a desired aspect or set of aspects. The type or types of loudspeakers may then be implemented in a particular audio system, such as an audio system in a vehicle.

Correction factors may be applied to the audio system. Correction factors may include, but are not limited to, delay, gain, amplitude, or filtering. The correction factors may be applied to a particular frequency range (such as a lower range, midrange, or higher frequencies) and may be applied to signals for one or more of the speakers in the audio system. Further, the correction factors may be temporal (such as delay or filtering which only changes the phase), or non-temporal. The system includes selecting a correction factor or multiple correction factors for an audio system in a given space. Transfer functions for the listening positions may be modified by the potential correction factors to generate predicted transfer functions. The predicted transfer functions may be statistically analyzed to indicate certain aspects of the predicted transfer functions, such as flatness, consistency, efficiency, etc. The selection of the correction factors may be based on a predicted transfer function that exhibits a desired aspect or set of aspects. The correction factors may then be implemented in a particular audio system, such as an audio system in a vehicle.

An audio system may include a plurality of potential listening positions. The system includes selecting a listening position or multiple listening positions from the plurality of potential listening positions. Transfer functions for the potential listening positions may be recorded. The transfer functions may be modified by potential parameters for the audio system, such as potential loudspeaker locations, potential types of speakers, potential correction factors, and/or crossover filters, to generate predicted transfer functions. The predicted transfer functions may be statistically analyzed to indicate certain aspects of the predicted transfer functions, such as flatness, consistency, efficiency, etc. The selection of the single listening position or multiple listening positions may be based on a predicted transfer function that exhibits a desired aspect or set of aspects.

Crossover filters may be applied to the audio system. The crossover filters may be associated with one or a multitude of speakers. For example, if a speaker is intended to operate in a certain frequency range, the filter may be selected so that the speaker operates in the intended range. There are several characteristics of a filter including the type of filter (e.g., low pass, high pass, notch, bandpass, or a combination of such filters), the 3 dB down point, the order of the filter, etc. The invention includes selecting the characteristics of the crossover filter for a given space, such as a vehicle. Transfer functions for the single listening position or the multiple listening positions in the audio system may be modified based on potential values for the crossover filters. The predicted transfer functions may be statistically analyzed to indicate certain aspects of the predicted transfer functions, such as flatness, consistency, efficiency, etc. The selection of the characteristics of the crossover filter, such as the 3 dB point, the order of the filter, etc. may be based on a predicted transfer function that exhibits a desired aspect or set of aspects. The selected crossover filter may then be used in an audio system, such as an audio system for a vehicle.

Other systems, methods, features, and advantages of the invention will be, or will become, apparent to one with skill in the art upon examination of the following figures and detailed description. It is intended that all such additional systems, methods, features, and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 10 is a table of illustrative transfer functions and calculations for various statistical analyses that may be performed in block 608 from FIG. 6.

FIG. 13 is a table of illustrative solution sets for selected parameters generated in response to a statistical analysis.

DETAILED DESCRIPTION OF THE PREFERRED EMBODIMENTS

Figure 4:
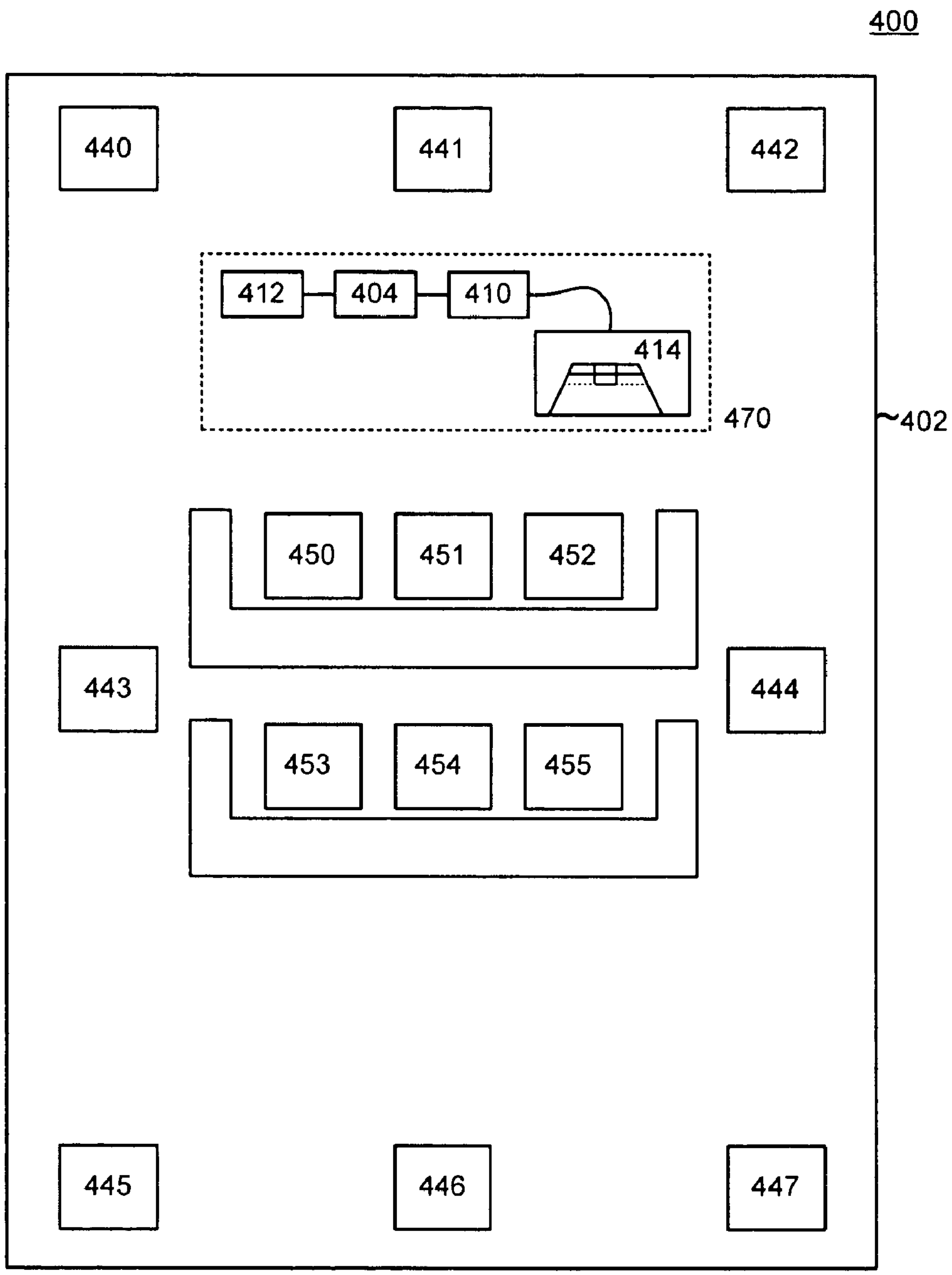
FIG. 4 depicts a room having multiple potential subwoofer locations, multiple listening positions, and sound system.

FIG. 4 depicts a room 400 defined by room boundary walls 402 where audio performance, such as low-frequency performance, may be improved by the described method. Room 400 may comprise any type of space in which the loudspeaker is placed. The space may have fully enclosed boundaries, such as a room with the door closed or a vehicle interior (such as an automobile or a truck); or partially enclosed boundaries, such as a room with a connected hallway, open door, or open wall; or a vehicle with an open sunroof. Low-frequency performance in a space will be described with respect to a room in the specification and appended claims; however, it is to be understood that vehicle interiors, recording studios, domestic living spaces, concert halls, movie theaters, partially enclosed spaces, and the like are also included. Room boundaries, such as room boundary walls 402, include the partitions that partially or fully enclose a room. Room boundaries may be made from any material, such as gypsum, wood, concrete, glass, leather, textile, and plastic. In a home, room boundaries are often made from gypsum, masonry, or textiles. Boundaries may include walls, draperies, furniture, furnishings, and the like. In vehicles, room boundaries are often made from plastic, leather, vinyl, glass, and the like. Room boundaries have varying abilities to reflect, diffuse, and absorb sound. The acoustic character of a room boundary may affect the acoustic signal.

Room 400 includes a sound system 470 that may include a source 412, such as a CD player, tuner, DVD player, and the like, an optional processor 404, an amplifier 410, and a loudspeaker 414. Dashed line 470 represents that the source 412, optional processor 404, amplifier 410, and loudspeaker 414 may be included in the sound system.

Loudspeaker 414 may include a loudspeaker enclosure that typically has a box-like configuration enclosing the transducer. The loudspeaker enclosure may have other shapes and configurations including those that conform to environmental conditions of the loudspeaker location, such as in a wall or vehicle. The loudspeaker may also utilize a portion of the wall or vehicle as all or a portion of its enclosure.

The loudspeaker may provide a full range of acoustical frequencies from low to high. Many loudspeakers have multiple transducers in the enclosure. When multiple transducers are utilized in the loudspeaker enclosure, it is common for individual transducers to operate more effectively in different frequency bands. The loudspeaker or a portion of the loudspeaker may be optimized to provide a particular range of acoustical frequencies, such as low-frequencies. The loudspeaker may include a dedicated amplifier, gain control, equalizer, and the like. The loudspeaker may have other configurations including those with fewer or additional components.

A loudspeaker or a portion of a loudspeaker including a transducer that is optimized to produce low-frequencies is commonly referred to as a subwoofer. A subwoofer may include any transducer capable of producing low-frequencies. Unless stated otherwise, loudspeakers capable of producing low-frequencies will be referred to by the term subwoofer in the specification and appended claims; however, any loudspeaker or portion of a loudspeaker capable of producing low-frequencies and responding to a common electrical signal is included.

The room includes eight potential loudspeaker locations 440-447, where one or more loudspeakers may be placed. Fewer or greater numbers of potential loudspeaker locations may be included. Loudspeaker location or "location" is a physical place in a space where a loudspeaker, such as a subwoofer, may be situated. Locations may include the corners, walls, or ceiling of a room in a house, or the interior panels of a vehicle.

The room also includes six listening positions 450-455, where listeners may sit. Fewer or greater numbers of listening positions may likewise be included. Listening position or "position" is a physical area in a space where a listener may be seated or standing. Positions may include couches or chairs in a home or the driver's or pilot's seat in a vehicle. While a listening position may be anywhere in the room, they are generally selected based on aesthetic and ergonomic concerns. Listening positions may also be selected on the basis of good high- and mid-frequency acoustic performance.

By positioning the loudspeaker 414 at each of the potential loudspeaker locations 440-447 and measuring at each of the listening positions 450-455, a transfer function may be determined at each of the listening positions 450-455 for each of the potential loudspeaker locations 440-447. The transfer function may measure frequencies in various ranges, such as below about 120 Hertz (Hz), below about 100 Hz, below about 80 Hz, below about 60 Hz, below about 50 Hz, below about 40 Hz, or between 20 Hz and 80 Hz. For example, a transfer function, such as a frequency response, may be determined at the first listening position 450 for the first potential loudspeaker location 440. The determination may then be repeated at the first listening position 450 for each of the remaining potential loudspeaker locations 441-447. When multiple listening positions are considered, the transfer function determination may be repeated at the second listening position 451 for each of the potential loudspeaker locations 440-447, and so on until reaching the last listening position 455. In the configuration shown in FIG. 4, eight transfer functions may be determined for each of the listening positions 450-455, resulting in a total of 48 transfer functions being determined for room 400.

If more than one type of loudspeaker is used, such as type A loudspeaker and type B loudspeaker, two transfer functions may be determined for each potential location. Type A loudspeaker and type B loudspeaker may have different qualities. As merely one example, type A loudspeaker may be a dipole loudspeaker and type B loudspeaker may be a convention (monopole) loudspeaker. In the example of eight potential loudspeaker locations, for each potential location, such as location 440, a 140A transfer function and a 140B transfer function may be determined for each listening position 450-455. While further use of the term location is limited to the use of one type of loudspeaker for simplicity, multiple types of loudspeakers may be considered.

The determined transfer function may measure any acoustical aspect. For example, the determined transfer function may comprise an amplitude or loudness component and a phase component. Any method that yields amplitude and phase values, if desired, may be appropriate to determine a transfer function. The amplitude and phase components of the transfer function may be expressed as vectors. The transfer function may be determined at one or at a plurality of frequencies or tones, such as periodically at every 2 Hz from 20 Hz to 20,000 Hz. The spacing of frequencies considered may be referred to as the frequency resolution.

The transfer function may reflect the amplitude and/or phase deviations that occur in an acoustic signal as it travels from the loudspeaker 414, interacts with the room boundaries 402, and reaches the listening positions 450-455. The transfer function may reflect the deviations introduced by irregular, non-parallelogram shaped rooms and rooms that are not fully enclosed. It is not necessary to measure room dimensions, the acoustic effect of room boundary 402, and the like to determine a transfer function. Instead, an acoustic signal may be output from the loudspeaker 414 that is located at one of the potential locations 440-447 and recorded by a microphone or other acoustic measuring device located at one of the listening positions 450-455.

Figure 5:
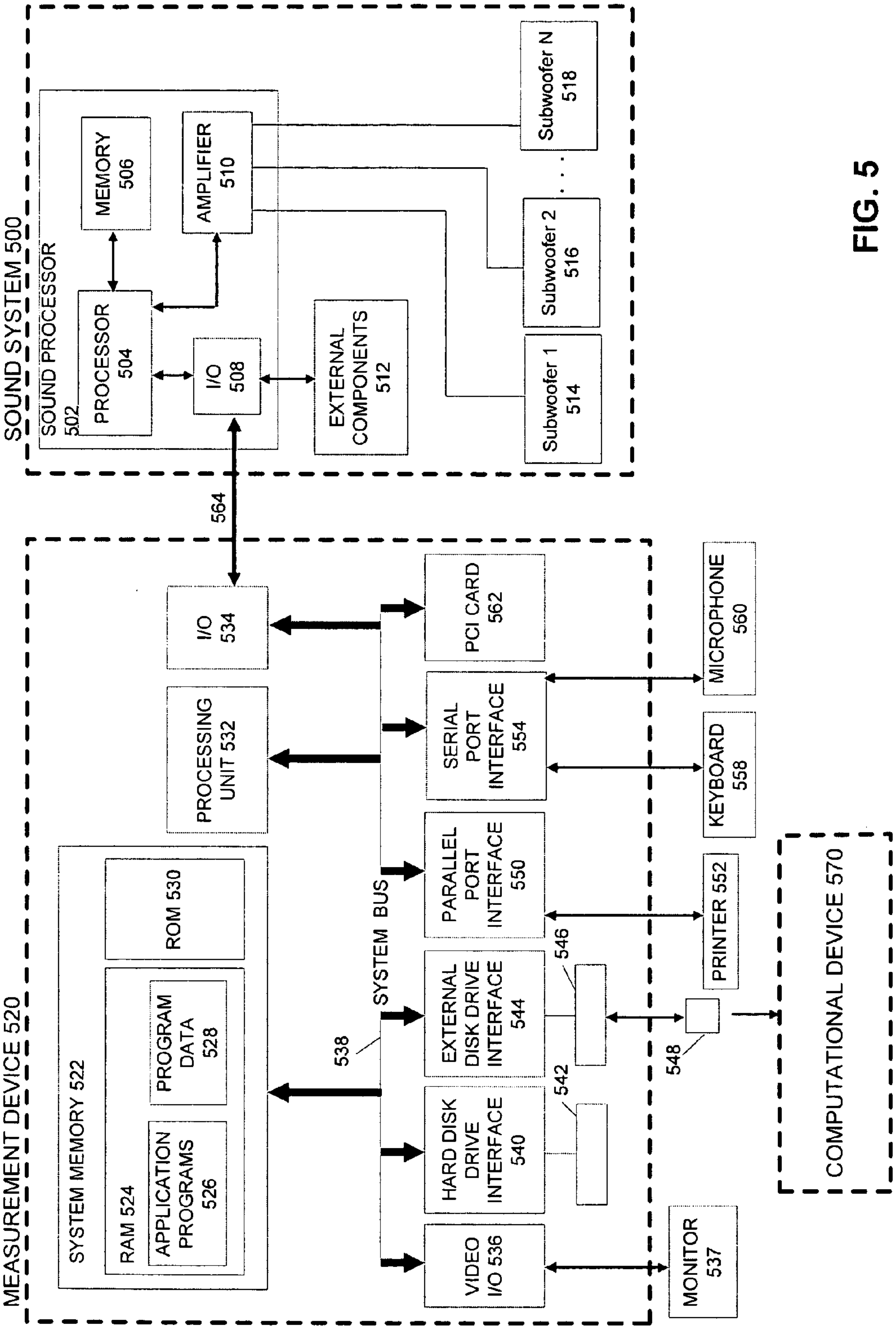
FIG. 5 depicts an example sound system 500, measurement device 520, and computational device 570.

With reference to FIG. 5, a system for implementing the invention may comprise a sound system 500, a measurement device 520, and a computational device 570. The sound system may comprise a general purpose sound system with a sound processor 502, external components 512, and loudspeakers 1 to N 514, 516, and 518. The sound system may have other configurations including those with fewer or additional components.

The sound processor 502 may comprise a receiver, a preamplifier, a surround sound processor, and the like. The sound processor 502 may operate in the digital domain, the analog domain, or a combination of both. The sound processor 502 may include a processor 504 and a memory 506. The processor 504 may perform arithmetic, logic and/or control operations by accessing system memory 506. The sound processor 502 may further include an input/output (I/O) 508. The I/O 508 may receive input and send output to measurement device 520 and to external components 512, as discussed below.

The sound processor 502 may further include amplifier 510 that is in communication with processor 504. Amplifier 510 may operate in the digital domain, the analog domain, or a combination of both. Amplifier 510 may send control information (such as current) to one or more loudspeakers in order to control the audio output of the loudspeakers. Examples of loudspeakers include loudspeakers 1 to N 514, 516, and 518. Alternatively, loudspeakers 1 to N 514, 516, and 518 may include amplifiers and/or other control circuitry. Loudspeakers 1 to N 514, 516, and 518 may be identical loudspeakers in terms of efficiency (acoustic output for a given power input) and design. Alternatively, loudspeakers 1 to N 514, 516, and 518 may be different from one another in terms of efficiency and design. Sound processor 502 may receive input from and send output to external components 512. Examples of external components 512 include, without limitation, a turntable, a CD player, a tuner, and a DVD player. Depending on the configuration, one or more digital to analog converters (DAC) (not shown) may be implemented after external components 512, processor 504, or amplifier 510.

Measurement device 520 enables measurement of acoustic signals output from sound system 500 including, for example: (1) the amplitude of the acoustic signal output at one, some, or a range of frequencies; and/or (2) the amplitude and phase of the acoustic signal output at one, some, or a range of frequencies. One example of a measurement device is a sound pressure level meter, which may determine the amplitude of the acoustic signals. Another example of a measurement device is a transfer function analyzer, which may determine the amplitude and phase of the acoustic signals. The transfer function analyzer may plot the data and produce output files that may be sent to a computational device 570 for processing, as discussed below.

Measurement device 520 may comprise a general purpose computing device that includes the ability to measure acoustic signals. For example, a transfer function analyzer PCI Card 562 may be included in measurement device 520 to provide the audio measuring functionality. Alternatively, the measurement device 520 may comprise a device with functionality dedicated to a transfer function analyzer.

Measurement device 520 may include a processing unit 532, a system memory 522, and a system bus 538 that couples various system components including the system memory 522 to the processing unit 532. The processing unit 532 may perform arithmetic, logic and/or control operations by accessing system memory 522. The system memory 522 may store information and/or instructions for use in combination with the processing unit 532. The system memory 522 may include volatile and non-volatile memory, such as random access memory (RAM) 524 and read only memory (ROM) 530. A basic input/output system (BIOS) may be stored in ROM 530. The BIOS may contain the basic routines that helps to transfer information between elements within the measurement device 520, such as during start-up, may be stored in ROM 530. The system bus 538 may be any of several types of bus structures including a memory bus or memory controller, a peripheral bus, and a local bus using any of a variety of bus architectures.

The measurement device 520 may further include a hard disk drive 542 for reading from and writing to a hard disk (not shown), and an external disk drive 546 for reading from or writing to a removable external disk 548. The removable disk may be a magnetic disk for a magnetic disk driver or an optical disk such as a CD ROM for an optical disk drive. Output files generated by the transfer function device, discussed above, may be stored on removable external disk 548, and may be transferred to computational device 570 for further processing. The measurement device may have other configurations including those with fewer or additional components.

The hard disk drive 542 and external disk drive 546 may be connected to the system bus 538 by a hard disk drive interface 540 and an external disk drive interface 544, respectively. The drives and their associated computer-readable media may provide nonvolatile storage of computer readable instructions, data structures, program modules, and other data for the measurement device 520. Although the exemplary environment described in FIG. 4 employs a hard disk and an external disk 548, other types of computer readable media may be used which can store data that is accessible by a computer, such as magnetic cassettes, flash memory cards, random access memories, read only memories, and the like, may also be used in the exemplary operating environment.

A number of program modules may be stored on the hard disk, external disk 548. ROM 530 or RAM 524, including an operating system (not shown), one or more application programs 526, other program modules (not shown), and program data 528. One such application program may include the functionality of the transfer function analyzer that may be downloaded from the transfer function PCI card 562.

A user may enter commands and/or information into measurement device 520 through input devices such as keyboard 558. Audio output may be measured using microphone 560. Other input devices (not shown) may include a mouse or other pointing device, sensors other than microphone 560, joystick, game pad, scanner, or the like. These and other input devices may be connected to the processing unit 532 through a serial port interface 554 that is coupled to the system bus 538, or may be collected by other interfaces, such as a parallel port interface 550, game port or a universal serial bus (USB). Further, information may be printed using printer 552. The printer 552 and other parallel input/output devices may be connected to the processing unit 532 through parallel port interface 550. A monitor 537, or other type of display device, is also connected to the system bus 538 via an interface, such as a video input/output 536. In addition to the monitor 537, measurement device 520 may include other peripheral output devices (not shown), such as loudspeakers or other audible output.

As discussed in more detail below, measurement device 520 may communicate with other electronic devices such as sound system 500 in order to measure acoustic signals in various parts of a room. One of the loudspeakers 514, 516, and 518 may be positioned at one, some, or all of the potential loudspeaker locations 440-447. The microphone 560, or other type of acoustic signal sensor, may be positioned at one, some, or all of the potential listening positions 450-455. The sound system 500 may control the loudspeaker to emit a predetermined acoustic signal. The acoustic signal output from the loudspeaker may then be sensed at the listening position by the microphone 560. The measurement device 520 may then record the various aspects of the output acoustic signal, such as amplitude and phase.

Control of the sound system 500 to emit the predetermined acoustic signals may be performed in several ways. The measurement device 520 may provide commands from the input/output (I/O) 534 via the line 564 to the I/O 508 in order to control the sound system 500. The sound system may then emit a predetermined acoustic signal based on the command from the measurement device. The sound system also may send a predetermined signal to the positioned loudspeaker without receiving commands from measurement device. For example, external component 212 may comprise a CD player. A specific CD may be inserted into the CD player and played. During play, the acoustic signal output from the loudspeaker may be sensed at the listening position by microphone 560.

The measured acoustic signal output from the different loudspeaker locations for the different listening positions may be stored, such as on the external disk 548. The external disk 548 may be input to the computational device 570. The computational device 570 may be another computing environment and may include many or all of the elements described above relative to the measurement device 520. The computational device 570 may include a processing unit with capability greater than the processing unit 532 in order to perform the numerically intensive statistical analyses discussed below.

As discussed further below, corrections may be implemented in the sound processor 502, the processor 504, the amplifier 510, the loudspeaker 1 to N 514, 516, and 518, or at multiple locations in sound system 500. The sound processor 502 may implement a tine delay prior to digital to analog conversion. Sound processor 502 may implement gain correction and/or equalization in the analog or digital domain. Correction settings, such as a 6 dB amplitude reduction for the loudspeaker 514, may be input to the sound processor 502 by the user. The implementation of the settings also may be automated by the sound system 500.

As shown in FIG. 5, the measurement device 520 is separate from the sound system 500. Alternatively, the functionality of the measurement device 520 may be incorporated within the sound system 500. Further, as shown in FIG. 5, the measurement device 520 is separate from the computational device 570. If the measurement device 520 has sufficient computation capability, computational device 570 need not be used so that measurement device 520 may both measure and provide the below described computations. The sound system 500, the measurement device 520, and the computational device 570 may have other configurations including those with fewer or additional components.

Figure 6:
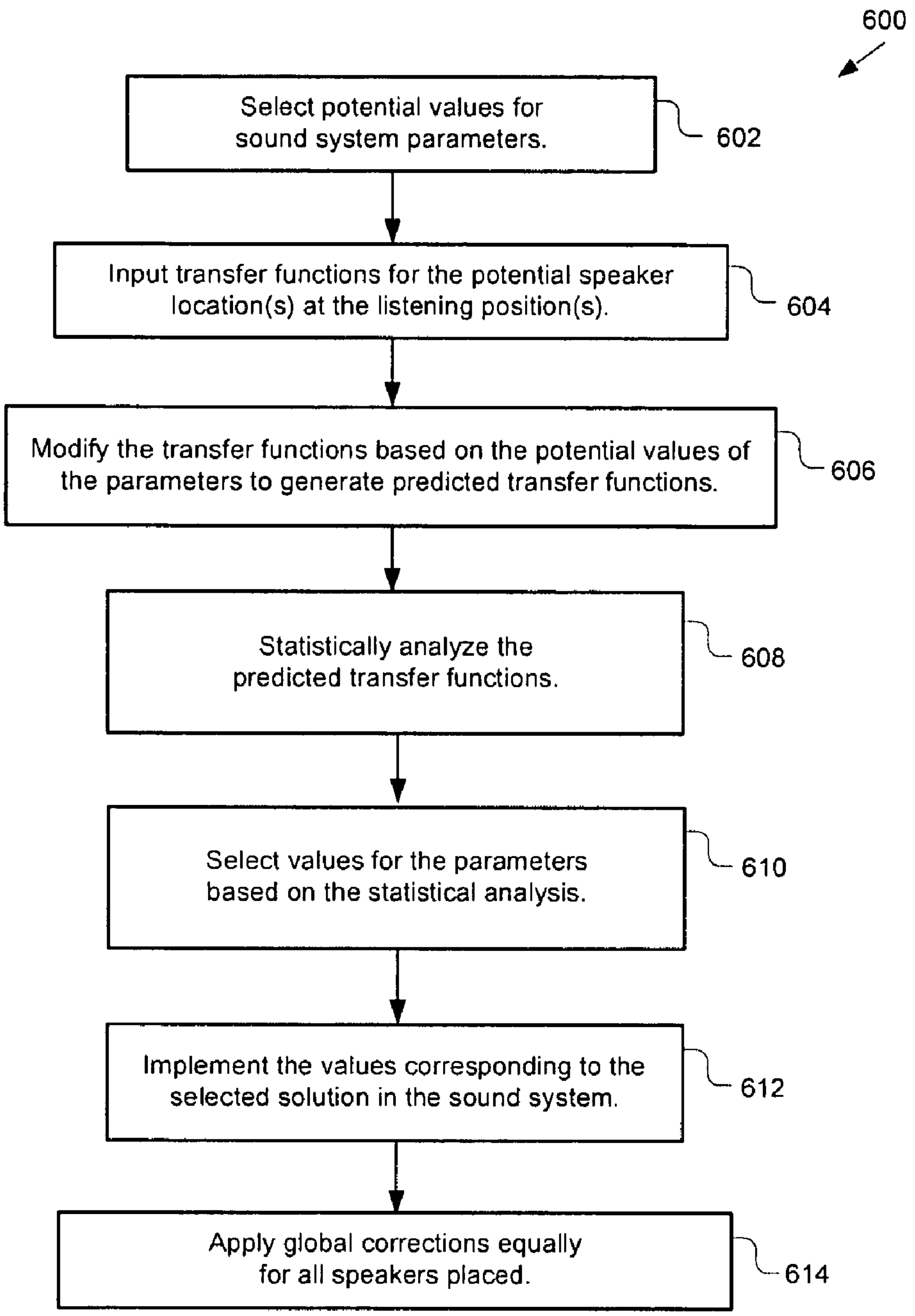
FIG. 6 is a flow chart of a scheme for improving the lower-frequency performance of a sound system.

FIG. 6 is a flow chart 600 depicting an overview of a methodology for selecting a configuration to improve the performance, such as low-frequency performance, of a sound system. The configuration of the sound system may comprise a parameter or set of parameters for the sound system. Parameters may include any aspect that affects transfer functions at the listening position or positions including, for example: (1) the location for loudspeakers; (2) the number of loudspeakers; (3) the type of loudspeakers; (4) correction settings; (5) the listening positions; and/or (6) crossover filters.

To analyze the potential configurations of the audio system, potential values for the parameters may be selected, as shown at block 602. For example, potential locations for loudspeakers may be selected. The potential locations may comprise any location in the given space where a loudspeaker may be positioned. For example, the potential locations may comprise a discrete set of potential locations input by a user, such as the eight potential loudspeaker locations 440-447 shown in FIG. 4. In a space such as a vehicle, the potential locations for the loudspeakers may be predefined. As another example, the potential number of loudspeakers may be selected. The potential number of loudspeakers may comprise any possible number of loudspeakers in a given space. The number may comprise an upper limit, a lower limit, or an upper and lower limit. For example, the potential number of loudspeakers may comprise a minimum and a maximum number of loudspeakers. As still another example, the potential type of loudspeakers may be selected. The type of loudspeakers may comprise different qualities of the loudspeakers. For example, the types of loudspeaker may include dipole loudspeakers and monopole loudspeakers. In still another example, a space may include a discrete number of potential listening positions. Typically, the listening positions are predetermined and not subject to change. However, flexible space configurations may allow for selection of one or more listening positions from a plurality of potential listening positions.

Potential values for correction settings may also be selected. The correction settings may comprise adjustments that provide improved low-frequency performance independent of loudspeaker placement when implemented in the sound system 500. The corrections may be applied to one or more of the loudspeakers. While corrections may be combined with optimized loudspeaker number and location, either may be independently considered to improve frequency performance, including low-frequency performance. Examples of correction settings include corrections to gain, delay, and filtering. Examples of filtering may include bandcut or notch, bandpass, low-pass, high-pass, all-pass (change phase but not the magnitude), and FIR (finite impulse response). The filtering correction setting may attempt to equalize the frequency responses for the various listening position, and may be termed an equalization correction setting. The selection of sound system parameters is discussed in greater detail with regard to FIG. 7.

Transfer functions for the potential loudspeaker locations at the single or multiple listening positions may be input, as shown at block 604. The measurements for the determined transfer functions may be performed using MLSSA Acoustical Measurement System with 2 Hz resolution. A more detailed description of a flow chart for transfer function determination is discussed below with regard to FIG. 8.

The transfer functions may be modified based on the potential values for the sound system parameters, as shown at block 606. The potential values for the sound system parameters may be combined to represent potential configurations of the audio system. For example, the potential values may represent potential combinations of speakers, potential correction factors, potential crossover filters, potential types of loudspeakers, potential listening positions, or any combination of potential parameters, such as potential combination of speakers and potential correction factors. The transfer functions previously recorded may be combined and/or adjusted based on the potential configurations of the system. The modified transfer functions may therefore represent predicted transfer functions for a sound system in the potential configurations. The modification of the transfer functions is discussed in greater detail with regard to FIG. 9.

One or more analysis techniques, such as statistical analysis techniques, may then be applied to the predicted transfer functions, as shown at block 608. The statistical analysis may be used to evaluate different configurations of the audio system, including one or more values for the potential values for the parameters. Specifically, the statistical analysis may provide a rational approach to improving the frequency performance for the sound system, including improving low-frequency performance, by considering the combined effect of multiple sound system parameters, individually or in concert. The statistical analysis may measure an aspect or metric, or multiple aspects or metrics regarding the predicted transfer functions. For example, the statistical analysis may indicate certain aspect or aspects of the predicted transfer functions, such as flatness, consistency, efficiency, etc. Specifically, when examining an audio system with a single listening position, the statistical analysis may analyze efficiency or flatness of the predicted transfer functions for the single listening position. When examining an audio system with multiple listening positions, the statistical analysis may analyze the predicted transfer functions for efficiency, flatness, or variation across the listening positions. Examples of the statistical analyses are discussed with respect to FIGS. 10-12.

Based on the statistical analysis, values for the parameters may be selected, as shown at block 610. The statistical analysis, which may measure various aspects of the predicted transfer functions, may be used to compare the predicted transfer functions with one another. One method of comparison is by ranking the potential configurations with regard to a determined value, such as an amplitude or variance. For example, after mean spatial variance, variance of the spatial average, and acoustic efficiency for each potential solution are calculated, results may be ranked and the best configuration selected. Assuming that there is no configuration that is highest ranked in all categories (e.g., lowest mean spatial variance, lowest variance of the spatial average, and highest acoustic efficiency factor), these metrics may be prioritized or weighted. The parameters for the potential configuration that is better, or the best, when compared with other potential configurations, may then be selected.

Figure 14:
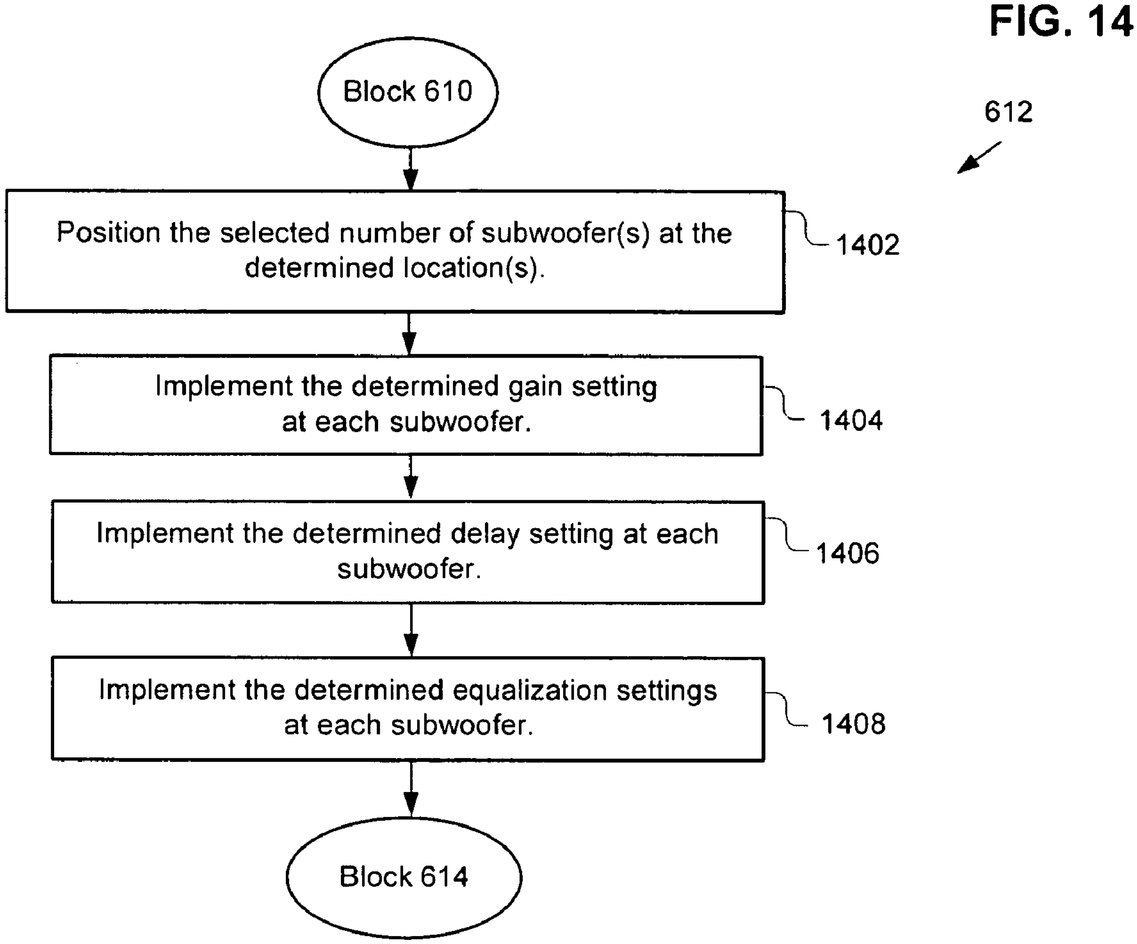
FIG. 14 is an expanded block diagram of block 612 from FIG. 6 depicting the implementation of values for the selected solution in the sound system.

Values corresponding to the selected solution may then be implemented in the sound system, as shown at block 612 and described in more detail in FIG. 14. After implementation of the solution values, global correction methods of improving low-frequency performance may be applied equally or substantially equally to all loudspeakers in the system 500 to improve low frequency performance further, as shown at block 614. The transfer function of the sound system may then be re-measured to confirm the improvement in performance. Further, the values corresponding to the selected solution and the global correction factors may be implemented. For example, in a vehicle, the audio system for the vehicle may be configured with the values corresponding to the selected solution and/or the global correction factors at various times, such as prior to installation of the audio system in the vehicle, during installation of the audio system in the vehicle, or after the vehicle has been installed in the vehicle (such as at the point of sale of the vehicle). Flow chart 600 may include fewer or additional steps not depicted in FIG. 6.

Global equalization is one type of global correction method for improving low-frequency performance. Global equalization may be applied equally or substantially equally to all loudspeakers in the sound system 500. Since the statistical analysis may determine solutions that favor peaks in relation to dips in the amplitude response, global equalization may be applied to reduce the amplitude of the resultant peak or peaks. Thus, a further improvement of low-frequency performance may be achieved after a solution is selected and implemented in blocks 610 and 612. Additional parametric or any other type of equalization may be utilized to implement global equalization, as shown at block 614. The statistical analysis may determine optimized global equalization parameters by modifying the previously modified amplitude values for all loudspeakers in a substantially equal manner.

Selecting Potential Parameters

Figure 7:
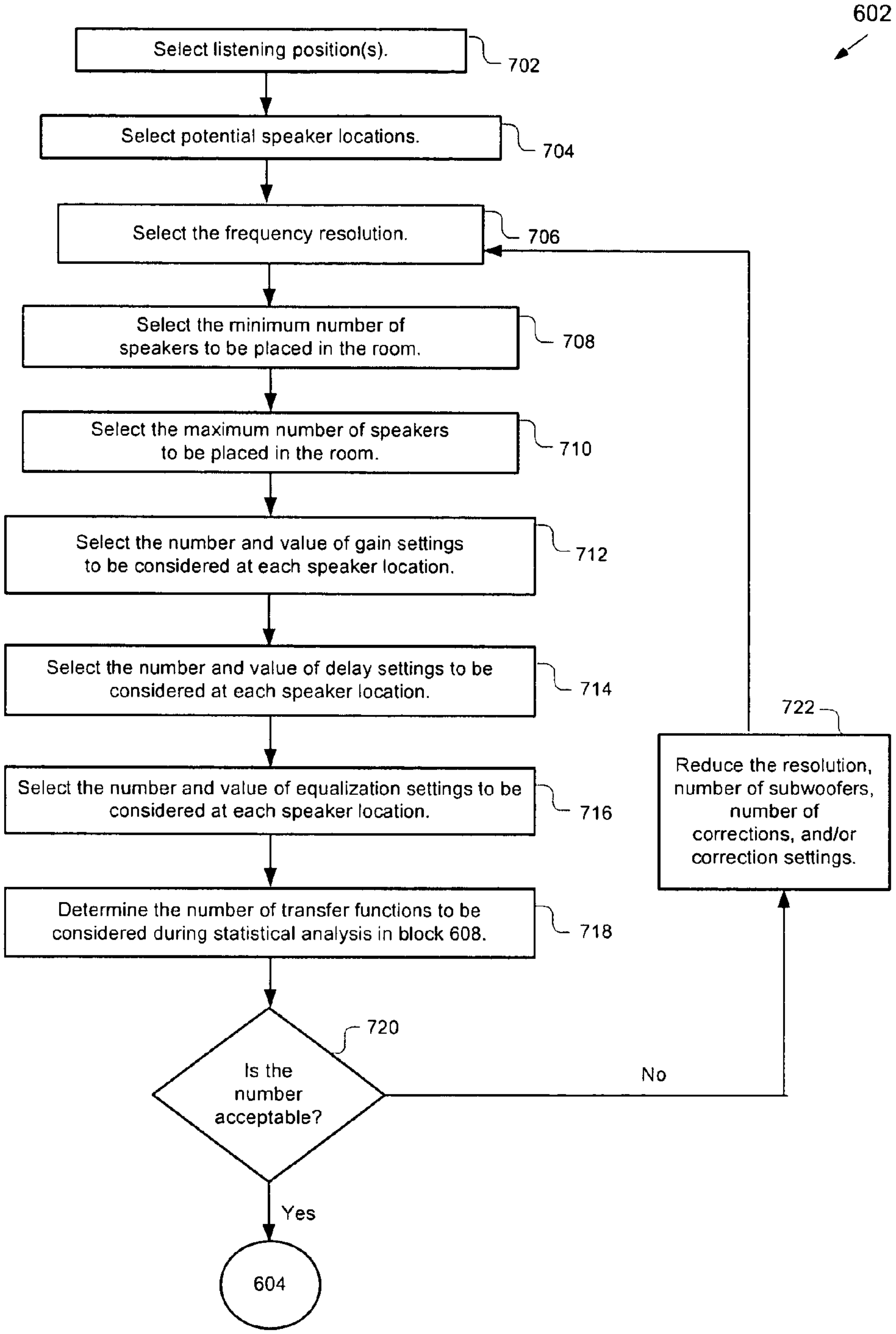
FIG. 7 is an expanded block diagram of block 602 from FIG. 6 depicting the selection of sound system parameters.

FIG. 7 is an expanded block diagram of block 602 from FIG. 6, depicting the selection of potential audio system parameters. The method may include selecting one listening position or a plurality of listening positions over which to improve frequency performance, as shown at block 702. For example, in instances where the listening positions may be selected from a plurality of potential listening positions (e.g., selecting two listening positions from five potential listening positions), the potential listening positions may be input. The method may further include selecting the potential locations where loudspeakers can be placed, as shown at block 704. This selection may be based on aesthetic or other considerations. In addition, if more than one type of loudspeaker is contemplated in the analysis, the types of loudspeakers may be selected. The frequency resolution may also be selected, as shown at block 706. The selection of the frequency resolution may be based on the level of resolution desired and the computational capability of computational device 570. The user may further select the minimum and maximum number of loudspeakers that will be placed at the potential locations, as shown at blocks 708 and 710. For example, a minimum of 1 loudspeaker and a maximum of 3 loudspeakers may be considered for 4 potential loudspeaker locations.

Blocks 712, 714 and 716 depict the selection of correction settings or "corrections" that may be considered for later implementation at a specific loudspeaker location or locations. As discussed above, corrections comprise adjustments that may provide improved frequency performance, such as low-frequency performance, independent of loudspeaker placement when implemented in the sound system. Corrections may be independently determined during statistical analysis for each potential loudspeaker location and independently implemented for each loudspeaker placed.

The number and value of gain settings to be considered at each potential loudspeaker location may be selected, as shown at block 712. Unlike the equalization levels discussed below, gain settings may affect all frequencies reproduced by the loudspeaker, thus being frequency-independent, and are commonly referred to as loudness or volume settings. While any number and value of gain settings may be selected to consider at each potential loudspeaker location, three gain settings of 0, −6, and −12 dB may be selected. These values are expressed in terms of dB reductions from a baseline acoustic output of 0 dB or unity; however, dB values are relative, so increases may also be utilized.

The number and value of delay settings to be considered at each potential loudspeaker location may be selected, as shown at block 714. By introducing a delay into a loudspeaker, the phase of the reproduced acoustic signal may be altered. Any number and value of delay settings may be selected for consideration at each potential loudspeaker location. For example, three delay settings of 0, 5, and 10 milliseconds may be selected.

Filtering may be applied one, some or all of potential loudspeaker locations. An example of filtering includes equalization. The number and value of equalization settings to be applied at each potential loudspeaker location may be selected, as shown at block 716. Equalization may comprise various types of analog or digital equalization including parametric, graphic, paragraphic, shelving, FIR (finite impulse response), and transversal equalization. Equalization settings may include a frequency setting (e.g., a center frequency), a bandwidth setting (e.g., the bandwidth around the center frequency to apply the equalization filter), a level setting (e.g., the amount that the amplitude reduces or increases the signal), and the like. Thus, for one potential loudspeaker location, more than one equalization setting may be applied, such as a first equalization setting at a first center frequency and a second equalization setting at a second center frequency or such as different types of equalizations. Further, equalization may be applied to all frequencies of interest. For example, in low-frequency analysis focusing on 20-80 Hz, equalization may be applied to all frequencies of interest. To reduce processing time, the frequency having the greatest variance may be selected as further described in relation to block 1106 of FIG. 11. If frequency selection is limited in this manner, three bandwidth and three level parameters may be selected. Bandwidth may be conveniently expressed in terms of Filter Q (Q). Q may be defined as the center frequency in Hertz divided by the frequency range in Hz over which the level adjustment is applied. For example, if a center frequency of 50 Hz is chosen, the bandwidth is 25 Hz for a Q of 2. Suitable Q parameters include, but are not limited to, 1, 4, and 16. Suitable level parameters include, but are not limited to, 0, −6, and −12 dB.

Based on the selections made in 702 through 716, the number of transfer functions to be considered during statistical analysis may be determined, as shown at block 718. These transfer functions may include those modified with one or more correction settings, those for a single loudspeaker location, and those combined to represent a plurality of loudspeaker locations. It may be impractical to search all possible combinations of loudspeaker location, loudspeaker number, gain settings, delay settings, equalization settings, and the like. If impractical, a subset of the potential solutions may be examined. The subset may be chosen with sufficient resolution, which is not too coarse that it may miss the best solutions or too fine that it may take too long to search. Changing search parameter step size greatly affects computation time. Changing the search parameters may be estimated using (4):

$$T \approx \binom{N}{K} A^K T^K F_L F_Q Perm(k) S T_{ref} \tag{4}$$

where: T is the estimated calculation time $T_{ref}$ is the time required to search one unique combination of loudspeaker location, loudspeaker number, gain settings, delay settings, equalization settings, and the like N is the number of potential loudspeaker locations;

K is the actual number of loudspeakers to be used;

A is the number of loudspeaker amplitude levels searched;

T is the number of signal delay values searched;

$F_L$ is the number of filter cut levels searched;

$F_Q$ is the number of filter Q values searched;

S is the number of listening positions being optimized;

$$\binom{X}{Y}$$

is the number of possible ways of choosing from N possible loudspeaker locations K at a time, with $$= \binom{X}{Y} = \frac{X!}{Y!(X-Y)!}$$

perm(K) is the number of permutations of K loudspeakers, with perm(K)=K!

While any number of transfer functions may be considered during statistical analysis in block 606, if a shorter calculation time is desired, the selected frequency resolution, selected number of loudspeakers, selected number of corrections, and/or correction settings, for example, may be reduced, as shown at block 722. When an acceptable number of transfer functions for statistical analysis is determined, as shown at block 720, the transfer functions may be input. Block 602 may contain fewer or additional steps not depicted in FIG. 7.

Recording Transfer Functions

Figure 8:
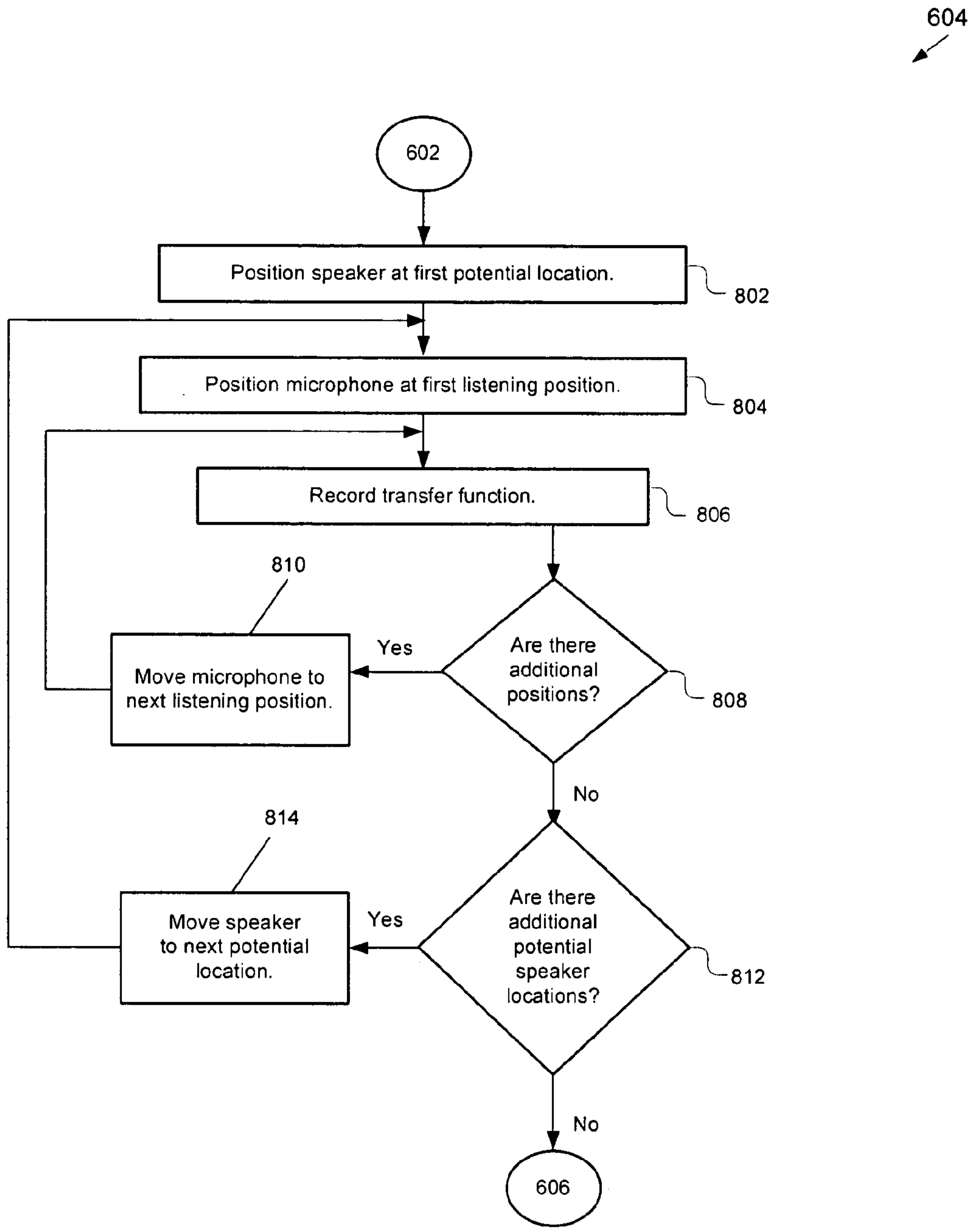
FIG. 8 is an expanded block diagram of block 604 from FIG. 6 depicting the input of transfer functions.

FIG. 8 is an expanded block diagram of block 604 from FIG. 6 depicting the input of transfer functions corresponding to a specific loudspeaker location for each listening position. A loudspeaker may be placed at the first potential location, such as location 440 of FIG. 4, as shown at block 802. A microphone (or other acoustic sensor) may then be placed at the first listening position, such as position 450 of FIG. 4, as shown at block 804. A transfer function for the first potential loudspeaker location at the first listening position may then be recorded in response to an acoustic signal generated by the sound system 500 with measurement device 520, as shown at block 806. This procedure is described in greater detail with regard to FIGS. 4 and 5.

If additional listening positions remain (including additional potential listening positions), as shown at block 808, the microphone may be moved to the next listening position, as shown at block 810. For example, the microphone may be moved to position 451 of FIG. 4. The measurement may then be repeated, as shown at block 806. If additional potential loudspeaker locations remain, as shown at block 812, the loudspeaker may be moved to the next potential location, as shown at block 814. For example, the loudspeaker may be moved to location 441 of FIG. 4. The measurement may then be repeated, as shown at block 806. This procedure may be repeated until transfer functions are recorded for all potential loudspeaker locations at each listening position. Block 604 may contain fewer or additional steps not depicted in FIG. 8.

Modifying the Transfer Functions

The recorded transfer functions may be modified based on potential configurations of the audio system in order to determine predicted transfer functions. The potential configurations may include any single potential parameter value, or any combination or sub-combination of potential parameter values in the audio system, and various permutations thereof. For example, the potential configurations may comprise different loudspeaker locations, different types of loudspeakers, different correction factors, different crossover filters, or any combination or sub-combination of loudspeaker locations, types of loudspeakers, correction factors or crossover filters. The modification of the transfer functions may include combining transfer functions and/or adjusting transfer functions. The modified transfer function may represent the predicted transfer function at the single listening position for the potential parameter values (i.e., the potential positions of the loudspeakers, the potential types of loudspeakers, the potential correction settings, potential crossover filters, etc.).

In one example of combining transfer functions, a potential configuration may include placing loudspeakers in positions 440 and 442, and a listening position of interest 451. Two transfer functions (one for registering a transfer function at position 451 when loudspeaker is at position 440 and a second for registering a transfer function at position 451 when loudspeaker is at position 442) may be accessed from memory and combined in order to predict the two-loudspeaker configuration. As discussed below, superposition may be used to combine the transfer functions. The combined transfer functions thus describe the acoustic signal at a listening position generated by multiple loudspeakers at positions 440 and 442. As another example of combining transfer functions, the transfer functions for specific types of loudspeaker may be accessed. If one potential loudspeaker solution includes placing loudspeaker of type A in position 440 and loudspeaker of type B in position 442, and the listening position of interest is 451, two transfer functions (one for registering a transfer function at position 451 when a loudspeaker of type A is at position 440 and a second for registering a transfer function at position 451 when a loudspeaker of type B is at position 442) may be accessed from memory and combined to predict the configuration.

Moreover, an example of adjusting the transfer functions may include changing the transfer functions based on correction settings. After selecting the desired transfer functions, the one or more selected transfer functions may be modified with one or more potential correction settings, such as a gain setting, delay setting, or equalization setting. The modified transfer functions may represent predicted transfer functions for the potential correction settings.

Figure 9:
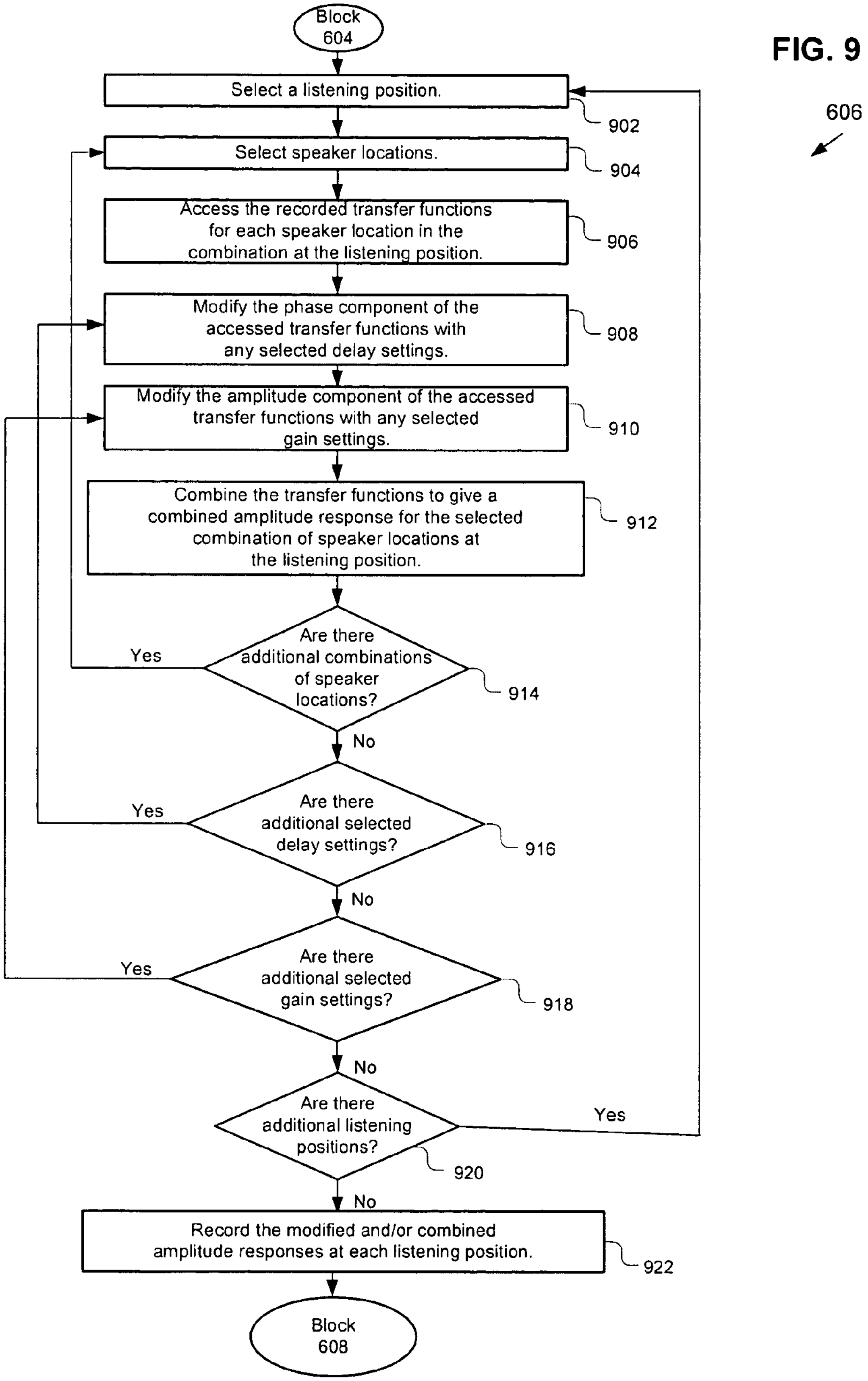
FIG. 9 is an expanded block diagram of block 606 from FIG. 6 depicting modification of the transfer functions.

FIG. 9 is an expanded block diagram of block 606 from FIG. 6 depicting the modification of the transfer functions. The user or the program executing in computational device 570 may select a specific listening position, as shown at block 902. For example, if the room environment includes two listening positions (e.g., 451 and 452 in FIG. 4), either listening position may be selected. The user or the program executing in computational device 570 may then select a single or a combination of potential loudspeaker locations, as shown at block 904. For example, if the room environment includes two potential loudspeaker locations (e.g., 440 and 442 in FIG. 4), any single or combination of loudspeaker locations (e.g., 440, 442, or 440 and 442) may be selected. The user or the program executing in computational device 570 may then select transfer functions for the selected listing position that corresponds to the selected loudspeaker location or the combination of loudspeaker locations, as shown at block 906. For example, if the listening position is 451 and the potential loudspeaker locations are 440 and 442, the transfer functions at position 451 when loudspeaker is at position 440 and at position 451 when loudspeaker is at position 442 may be selected.

If the transfer functions include a phase component, the program executing in computational device 570 may modify the phase component of the measured transfer function stored in memory with any delay settings selected in block 714, as shown at block 908. For example, if one of the optional delay settings comprises a 10 millisecond differential delay between two loudspeakers, the phase component of one of the transfer functions may be modified to reflect the introduction of a 10 millisecond time delay factor. In the example discussed above, if the potential loudspeaker locations are 440 and 442, the transfer function at position 451 for the loudspeaker at location 440 may be delayed 10 milliseconds relative to the transfer function at position 451 for the loudspeaker at location 442. For example, the transfer function at position 451 for the loudspeaker at location 440 may be delayed by 10 milliseconds. Or, the transfer function at position 451 for the loudspeaker at location 442 may be advanced by 10 milliseconds. Or, a combination of changing both transfer functions may result is a relative delay between the transfer functions of 10 milliseconds. In this manner, one or a plurality of delay settings may be applied to modify the recorded transfer function at each loudspeaker location.

The program executing in computational device 570 may modify the amplitude component of the measured transfer function stored in memory with any gain settings selected in block 712, as shown at block 910. Thus, numerical amplitude components can be increased or reduced by a set amount, such as 6 dB. Specifically, one, some, or all of the amplitudes of the transfer functions may be modified. In the example discussed above, the amplitude of the transfer function at position 451 for the loudspeaker at location 442 may be increased or decreased relative to the amplitude of the transfer function at position 451 for the loudspeaker at location 440. For example, the transfer function at position 451 for the loudspeaker at location 442 may be decreased by 6 dB. Or, the transfer function at position 451 for the loudspeaker at location 440 may be increased by 6 dB. Or, a combination of changing both transfer functions may result is a relative amplitude difference between the transfer functions of 6 dB. In this manner, one of a plurality of gain settings may be applied to each subwoofer to modify the recorded transfer function at each listening position.

While not depicted in FIG. 9, prior to the combination in block 912, the program executing in computational device 570 shown in FIG. 5 may modify the amplitude component of the stored transfer function with any equalization settings, such as the equalization settings selected in block 716. As discussed above, equalization settings, including a center frequency, a bandwidth and an amplitude adjustment, may modify the transfer function. The choice of the center frequency, the bandwidth, and amplitude adjustment, may be limited due to computational complexity. Specifically, calculating and applying the equalization filters at all possible frequencies with multiple boost/cut levels and Q values may increase calculation time enormously if equalization modifications are performed prior to the combination in block 912. If shorter calculation times are desired, equalization setting modifications may be performed in block 1108 after determining the frequency of the maximum spatial variance, as discussed more fully in regard to FIG. 11 below. For example, an equalization filter may be applied with a center frequency equal to the frequency of a solution with the maximum variance, thereby reducing spatial variance. This greatly reduces the computation time, since only one frequency is calculated for each filter/loudspeaker. Or, the equalization settings may be implemented prior to maximum variance determination.

The program executing in computational device 570 may combine the recorded or modified transfer functions (e.g., modified by correction factors such as delay, gain, and/or equalization) to give a combined amplitude response for the selected combination of loudspeaker locations at the listening position, as shown in block 912. For example, the transfer function at position 451 for the loudspeaker at location 440 may be unmodified (no correction factors applied) and the transfer function at position 451 for the loudspeaker at location 440 may be modified to introduce a delay and an amplitude change. At least a portion of the transfer functions may be combined to give a combined response. For example, the amplitude component of the transfer functions may be combined. For example, the amplitude and the phase components of the transfer functions may be combined.

One method of combining the transfer functions may include superposition. The principle of superposition may apply if it is assumed that the loudspeaker, room, and signal processing comprise a linear system. Superposition includes the linear addition of transfer function vectors. The vectors may be added or summed for each individual frequency of the transfer function. For example, if transfer function vectors are measured at listening position 451 for loudspeaker locations 440, 441, and 442, the vectors at each frequency may be summed to give a three-loudspeaker location combined amplitude response at each frequency. Transfer function or transfer function values modified with at least one correction setting, such as gain, equalization, or delay settings, may also be combined.

If there are unexamined combinations of loudspeaker locations for the listening position selected in block 902, blocks 904 through 912 may be repeated, as shown in block 914. If additional delay settings were selected in block 714, blocks 908 through 914 may be repeated, as shown in block 916. If additional gain settings were selected in block 712, blocks 910 through 916 may be repeated, as shown in block 918. If additional listening positions were selected in block 702, blocks 902 through 918 may be repeated, as shown in block 920. When all listening positions, potential loudspeaker locations, potential delay settings, and potential gain settings have been considered, the modified and/or combined transfer functions, which may represent predicted transfer functions, are recorded for each listening position 922. Block 606 may contain fewer or additional steps not depicted in FIG. 9.

Statistical Analysis

Various statistical analyses may be performed to analyze the predicted transfer functions. FIG. 10 is a table showing raw data for various listening positions (seats 1-5) for various frequencies (20-80 Hz in 2 Hz increments) and examples of statistical analyses that may be performed. As discussed previously, the raw data may be modified based on potential values of one or more parameters. For example, if potential values for correction include a filter with a center frequency at 30 Hz, a bandwidth of 10 Hz, and a level setting of dB, the raw data for frequencies 26-34 may be adjusted accordingly to generate the predicted transfer function.

In a multiple listening position audio system, the statistical analyses may be based on any mathematical tool that evaluates the predicted transfer functions, such as taking the average, standard deviation, spatial standard deviation, spatial envelope, or spatial maximum average across the seats. For example, the spatial average at 20 Hz is −15.94 dB, which is calculated by averaging the amplitude readings at 20 Hz for seats 1 to 5. The spatial variance at 20 Hz is −4.72 dB, which is calculated by taking the variance of the amplitude readings at 20 Hz for seats 1 to 5. The spatial standard deviation is 2.17 dB for 20 Hz and may be computed as the square root of the spatial variance. The spatial envelope may be the difference between the highest and lowest readings. At 20 Hz, the highest and lowest readings are −12.99 dB and −18.13 dB, so that the spatial envelope is 5.14 dB. The spatial maximum minus average may be computed by selecting the maximum value and subtracting the average. For 20 Hz, the maximum value is −12.99 dB and the average is 15.94 dB, so that the spatial max—average is 2.96.

Based on the spatial averages, a mean overall level may be calculated. Other calculations may be based on the spatial averages, such as a variance of the spatial averages, the standard deviation of the spatial averages, the envelope of the spatial averages, and the maximum—average of the spatial averages. For example, in FIG. 10, the maximum—average of the spatial average is 6.42—(−8.97, the mean overall level) or 15.39. Likewise, the mean spatial variance, mean spatial standard deviation, mean spatial envelope, and mean spatial maximum—average may be calculated based on the spatial variances, spatial standard deviations, spatial envelopes, and spatial maximum—average, as shown in FIG. 10.

An example equation is shown below for the mean spatial variance:

$$\text{Mean Spatial Variance} = \frac{\sum_{f=f1}^{f2} \text{var}_{\Delta}(R(s, f))}{F} \tag{5}$$

where: $\text{var}_s(R(s,f))$ is the variance in the magnitude (in dB) of the transfer functions across all listening positions s, calculated at any one frequency f.

The statistical analyses may also be based on the average of the frequencies by seat, such as the mean level. For example, all of the frequencies at seat 1 may be averaged to calculate a mean level of −10.16 dB. The mean levels at each of the seats may be used to calculate a mean overall level, a variance of the mean levels, a standard deviation of the mean levels, an envelope of the mean levels, and a maximum—average of the mean levels, as shown in FIG. 10.

Variance of the spatial average may be defined as:

$$\text{Variance of the Spatial Average} = \frac{\sum_{s=1}^{S} \text{var}_f(R(s, f))}{S} \tag{6}$$

where: $\text{var}(R_f(k))$ is the variance in the magnitude (in dB) of the transfer functions across all frequencies, calculated at any one listening position; and S is the total number of listening positions.

Acoustic efficiency may quantify the total efficiency in terms of overall output versus number of active loudspeakers. Acoustic efficiency may be defined as:

$$\text{Acoustic Efficiency} = \frac{\sum_{F1}^{F2}\sum_{s} R(s, f)}{FS\sum_{k} a} \quad (7)$$

where: a are the amplitudes of the loudspeakers k in any given configuration.

The statistical analyses may measure different metrics or aspects of the predicted transfer functions. One type of statistical analysis may indicate consistency of the predicted transfer functions across the multiple listening positions. Examples of the first type, discussed above, include mean spatial variance, mean spatial standard deviation, mean spatial envelope (i.e., min and max), and mean spatial maximum average, if the system is equalized. For example, a low value for the mean spatial variance indicates that the transfer functions tend to be consistent at each seat (i.e., the values at the seats are close to the spatial average).

A second type of statistical analysis may measure how much equalization is necessary for the predicted transfer functions. Specifically, the second type of statistical analysis may be a measure of flatness. Examples of the second type include variance of spatial average, standard deviation of the spatial average, envelope of the spatial average, and variance of the spatial minimum. Examining the variance of the spatial average, this analysis provides a measure of consistency from seat-to-seat on average.

A third type of statistical analysis may measure the differences in overall sound pressure level (SPL) from seat to seat for the predicted transfer functions. Examples of the third type include variance of mean levels; standard deviation of mean levels, envelope of mean levels, and maximum average of mean levels.

A fourth type of statistical analysis may examine the efficiency of the predicted transfer functions at the single listening position or the multiple listening positions. In effect, the statistical analysis may be a measure of the efficiency of the sound system for a particular frequency, frequencies, or range of frequencies at the single listening position or at the multiple listening positions. An example of the fourth type includes acoustic efficiency. The acoustic efficiency may measure the mean overall level divided by the total drive level for each loudspeaker. Acoustic efficiencies for the predicted transfer functions may be examined, and the parameter or parameters for the predicted transfer function with a higher or the highest acoustic efficiency may be selected.

A fifth type of statistical analysis may examine output of predicted transfer functions at the single listening position or the multiple listening positions. The statistical analysis may be a measure of the raw output of the sound system for a particular frequency, frequencies, or range of frequencies. For a single listening position system, an example of a statistical analysis examining output includes mean level. For a multiple listening position system, an example of a statistical analysis examining output includes mean overall level. The mean overall level may indicate how loud an audio system can play at a certain listening position or multiple listening positions. A sixth type of statistical analysis examines flatness of predicted transfer functions at a single listening position. The statistical analysis may analyze variance of the predicted transfer functions at the single listening position, such as amplitude variance and amplitude standard deviation.

Any of the statistical analyses may be band limited. For example, the mean overall level may be measured over a particular frequency band, such as frequencies under 40 Hz, to determine the amount of output at a certain frequency or set of frequencies. Typically, the maximum output of a subwoofer is limited below 40 Hz compared to frequencies above 40 Hz. Therefore, it may be advantageous to optimize the mean overall level below 40 Hz. Potential parameters that generate the highest or higher mean overall output at the listening positions in the 20-40 Hz range may then be used in the audio system. Likewise, in a single position audio system, it may be advantageous to optimize for mean level below 40 Hz.

Figure 11:
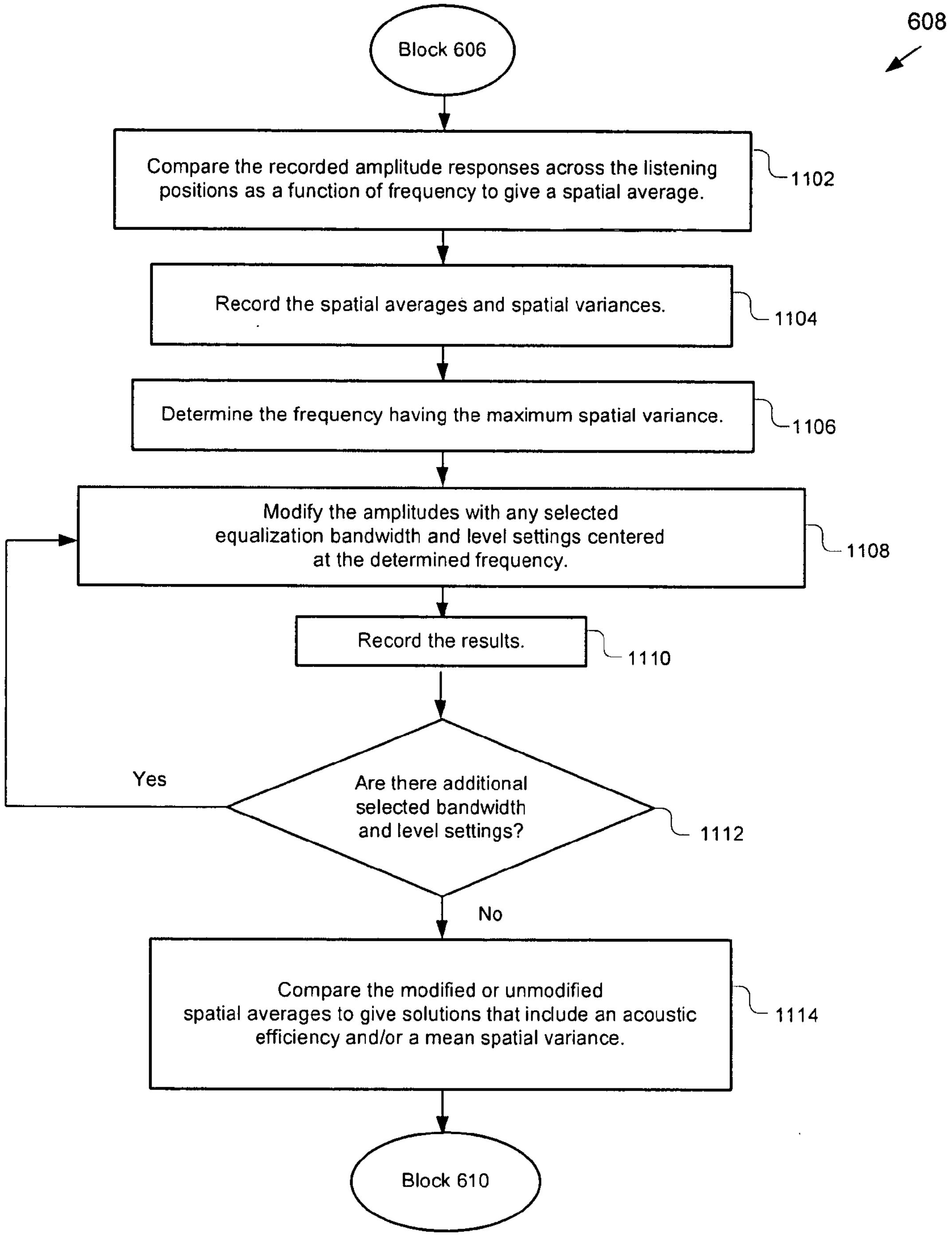
FIG. 11 is an expanded block diagram of block 608 from FIG. 6 depicting statistical analyses for acoustic efficiency and mean spatial variance.

As discussed above, various statistical analyses may be performed. FIG. 11 is one example of an expanded block diagram of block 608 from FIG. 6 depicting statistical analyses for acoustic efficiency and mean spatial variance. The program executing in computational device 570 shown in FIG. 5 may perform this comparison. Transfer functions may be compared across the listening positions as a function of frequency to give a spatial average, as shown in block 1102. For example, predicted transfer functions may be compared as a function of frequency.

The spatial average, which may comprise a mean position amplitude, may be viewed as numerically describing the acoustic output from one or a combination of loudspeaker locations perceived at multiple listening positions, such as 450-455 of FIG. 4. The spatial average may be determined by comparing, as a function of frequency, the amplitude components of the modified or unmodified transfer function from a single loudspeaker location across the positions or by comparing the modified or unmodified combined transfer functions from a plurality of loudspeaker locations across the positions. While any method may be used to perform the comparison, one method is to average the dB values of the amplitude components from all the listening positions to give a spatial average for each frequency, as shown in FIG. 10. How the amplitude components for each listening position vary from the spatial average may be expressed as a variance, such as a position variance. Thus, if amplitude values of 4 dB and 2 dB are compared by averaging to give the spatial average of the amplitude of 3 dB, the spatial variance value could be 2.

As discussed in FIG. 10, variability between the amplitude values may be expressed as sample variance, standard deviation (STD), spatial envelope, spatial maximum—average or by any other method of expressing the variability between numerical values. For example, if the 60 Hz transfer function for a loudspeaker at location 440 is +1 dB at position 450, +1 dB at position 451, −2 dB at position 452, +2 dB at position 453, +3 dB at position 454, and +3 dB at position 455, the spatial average amplitude would be +1.33 dB with a spatial variance of 3.47.

The spatial average and the spatial variances may be recorded, as shown in block 1104. The program executing in computational device 570 may determine the frequency having the largest spatial variance across all the listening positions for each potential loudspeaker location and each combination of potential loudspeaker locations, as shown at block 1106. This frequency may be used as the center frequency to apply equalization. Multiple center frequencies may also be determined, such as the three center frequencies having the largest spatial variances, if multiple equalizations are implemented.

The program executed in computational device 570 may then modify the amplitudes of the determined center frequency with the equalization bandwidth and level settings selected in block 716, as shown in block 1108. Thus, the numerical amplitude components for specific frequencies may be increased or reduced for a selected bandwidth of the determined (or selected if equalization modifications were performed before combination 912) frequency. For example, a 12 dB reduction in amplitude could be applied at 60 Hz with a Q=4. Unlike frequency-independent gain settings, the numerical amplitude component at different frequencies may be modified by different equalization level settings. In this manner, one of a plurality of equalization settings may be applied to the spatial average for one or a combination of potential loudspeaker locations.

The modified spatial averages may be recorded, as shown in block 1110. If additional equalizations settings were selected in 716, blocks 1108 through 1110 may be repeated, as shown in block 1112. When the spatial averages have been modified with all selected equalization settings, the modified or unmodified spatial averages may be compared, as shown in block 1114. The program executed in computational device 570 may perform this comparison.

All spatial averages may be compared to provide a solution that includes an acoustic efficiency and a mean spatial variance for each potential loudspeaker location and each combination of potential loudspeaker locations with the selected corrections for all the listening positions, as shown in block 1114. FIG. 10 provides examples of the mean overall level, which may be used to determine the acoustic efficiency, and the mean spatial variance.

As discussed previously, the determined acoustic efficiency numerically describes the ability of a given sound system to generate higher sound levels at one or more listening positions from the same power input if the solution is implemented. Thus, acoustic efficiency is the ratio of the sound pressure level at one or more listening positions to the total low-frequency electrical input of the sound system. For example, the acoustic efficiency may comprise the mean overall level divided by the total drive for all active loudspeakers. The determined spatial variance numerically describes the similarity of the low-frequency acoustic signal perceived at each listening position if the solution is implemented.

Figure 1:
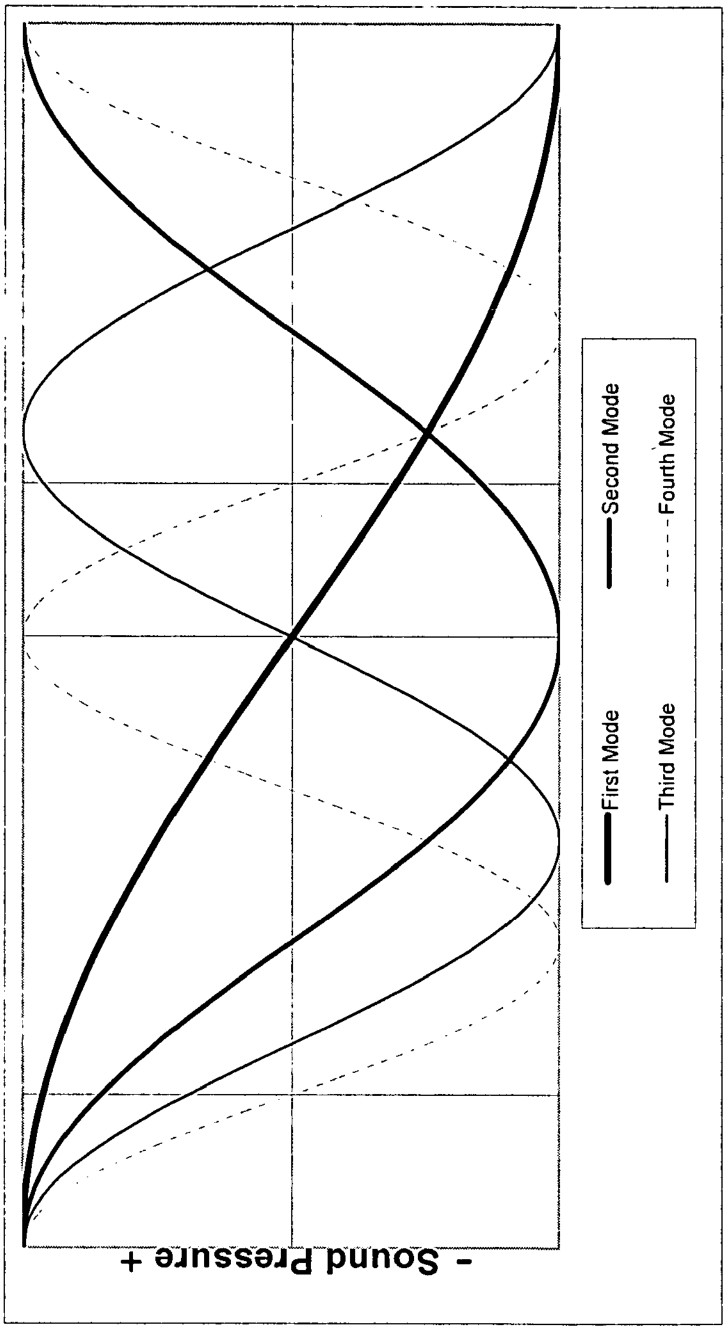
FIG. 1 is a pictorial representation of the first four axial modes for a single room dimension for an instant in time.
Figure 2:
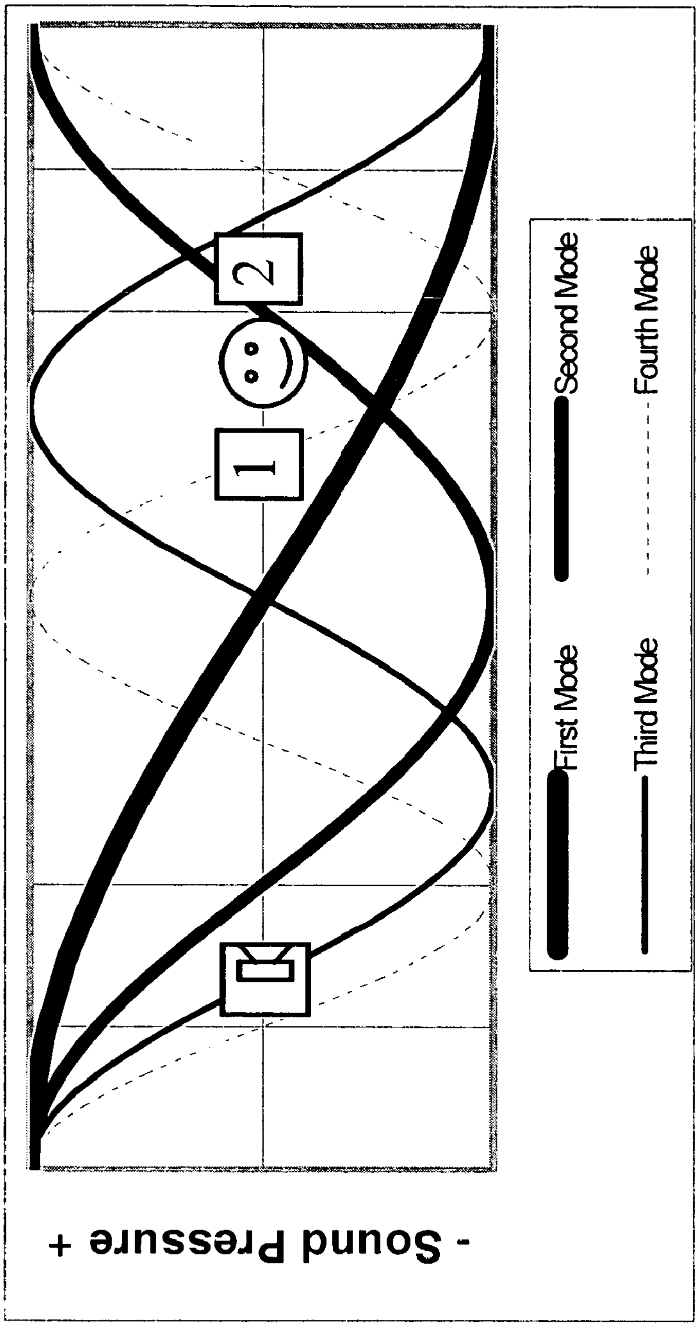
PRIOR ART FIG. 2
FIG. 2 is a pictorial representation of the first four axial modes shown in FIG. 1 and location for a loudspeaker and listener (smiley face) and two additional listening positions at 1 and 2.
Figure 3:
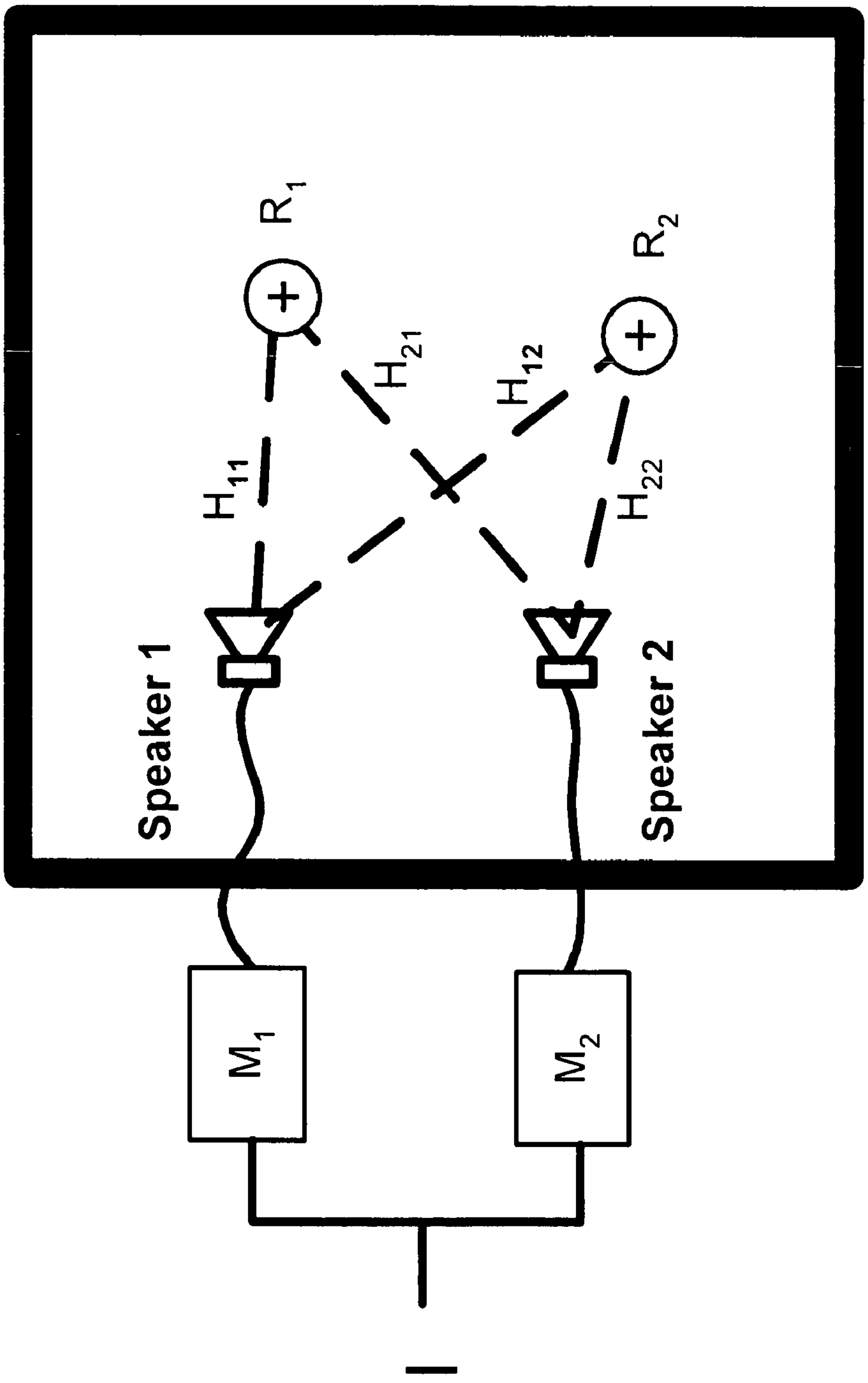
PRIOR ART FIG. 3
FIG. 3 is an example of a multi-subwoofer multi-receiver scenario in a room.
Figure 12:
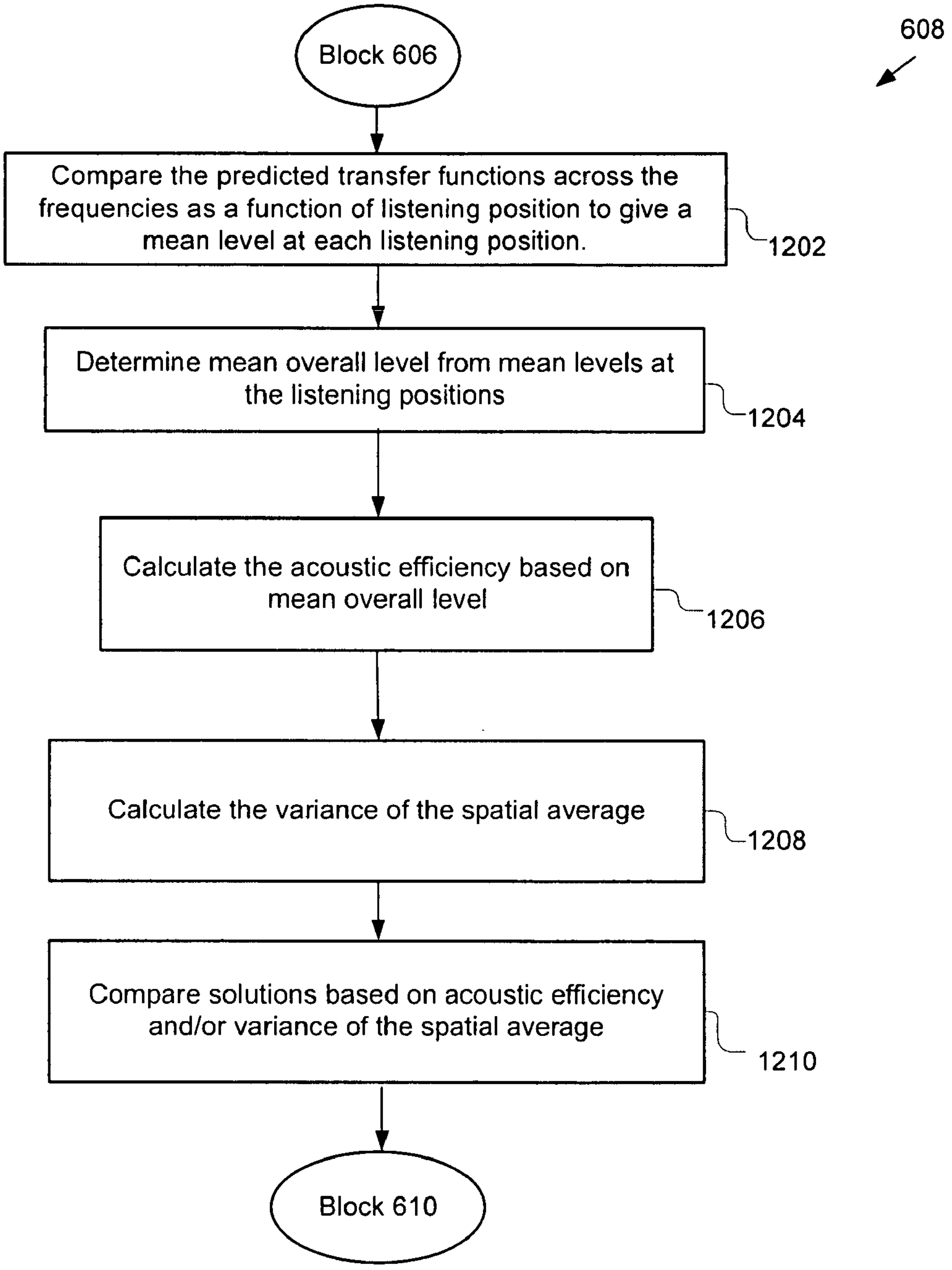
FIG. 12 is an expanded block diagram of block 608 from FIG. 6 depicting statistical analyses for acoustic efficiency and variance of the spatial average

FIG. 12 is another example of an expanded block diagram of block 608 from FIG. 6 depicting statistical analyses for acoustic efficiency and variance of the spatial average. Amplitude responses may be compared across the frequencies as a function of listening position to generate a mean level at each listening position, as shown in block 1202. FIG. 10 shows one example of calculating the mean level, where the amplitudes for a set of frequencies at a listening position are averaged to produce the mean overall level. Specifically, the mean level may be calculated for seat 1 shown in FIG. 1 by averaging the amplitudes for frequencies 20 through 80. The mean levels may be averaged to calculate the mean overall level, as shown in FIG. 10. Further, the mean levels may be analyzed to determine the variance of mean levels, standard deviation of mean levels, envelope of mean levels and maximum—average of mean levels, as shown in FIG. 10. In addition to the mean level, an amplitude variance or an amplitude standard deviation may be calculated. The amplitude variance may comprise variations of the amplitudes for a specific listening position. As one example shown in FIG. 10, the amplitude variance may comprise calculating the variance of the amplitude values for seat 1 (−177.71, −16.60 . . . −5.65). The amplitude variance may be a measure of smoothness of the transfer function (either predicted or unmodified transfer functions) for a specific listening position. In a multiple listening position audio system, the amplitude variances for each listening position may be averaged to determine a mean amplitude variance. In a single listening position audio system, the amplitude variance or amplitude standard deviation may be used to statistically evaluate the predicted configuration.

The recorded mean levels may be averaged to determine the mean overall level, as shown at block 1204. The mean overall level may be used to calculate the acoustic efficiency, as shown at block 1206. The acoustic efficiency may be determined by dividing the mean overall level by the total drive level for each loudspeaker. Acoustic efficiency numerically describes the ability of a given sound system to generate higher sound levels, such as low-frequency sound levels if the analysis is band limited, at one or more listening positions from the same power input. The variance of the spatial average may be calculated by first calculating the spatial averages across the listening positions, and calculating the variance of the spatial averages, as shown at block 1208. The determined variance of the spatial average numerically describes how closely the amplitude values will correspond to the target value if the solution is implemented. The acoustic efficiency and/or the variance of the spatial average may be used to compare the predicted transfer functions, as shown at block 1210.

FIG. 13 is a table of potential configurations for an audio system, where the potential configurations are ranked by mean spatial variance (MSV). The potential configurations include values corresponding to various combinations of the audio system parameters of loudspeaker location, loudspeaker number, and correction settings that include gain, delay, and equalization. The first four configurations and another configuration (such as solution 10,000) are shown. Further, FIG. 14 provides values for acoustic efficiency (AE), and variance of the spatial average (VSA) for illustrative purposes. Other types of statistical analyses may be used.

For the potential configurations in FIG. 13, six listening positions, a minimum of two loudspeakers, a maximum of three loudspeakers, and four potential loudspeaker locations are considered. Three possible gain settings of 0 dB, −6 dB, and −12 dB are considered. Delay settings of 0 ms, 5 ms, and 10 ms are considered. The center frequency for implementation of parametric equalization may comprise the frequency having the maximum variance, as determined at block 1106 of FIG. 11. Bandwidth settings of 1, 4, and 16 are considered. Equalization level settings of 0 dB, −6 dB, and −12 dB are considered.

The methodology may recommend at least one of the potential configurations based on the statistical analysis. The recommendation may be based on one or more statistical analysis. As shown in FIG. 13, the potential configurations are ranked based on mean spatial variance (MSV). Alternatively, the solutions may be ranked based on acoustic efficiency (AE) and/or variance of the spatial average (VSA). Or, the solutions may be based on a plurality of statistical analyses, such as ranking based on a weighting of various statistical analyses. For example, different weights may be assigned to mean spatial variance, acoustic efficiency and/or variance of the spatial average.

From the illustrative solutions presented in FIG. 13, the user or the program executing in computational device 570 may manually select a solution for the parameters in response to the statistical analysis. FIG. 13 illustrates that Solution 1 has the least mean spatial variance, meaning that the implementation of a loudspeaker at potential locations 1 and 2 with the depicted correction settings for each system parameter will result in the low-frequency signal heard by each listener being the most similar. Solution 5 results in acoustic efficiency being the greatest; however, the mean spatial variance is higher when compared to the other solutions. Thus, a user may wish to implement Solution 2, which has neither the lowest mean spatial variance nor the greatest acoustic efficiency, but results in a good balance when both are considered. Solution 3 results in the least variance of the spatial average at each listening position, but has higher mean spatial variance and lower acoustic efficiency when compared with Solution 2. Thus, Solution 2 may again be the desired choice when variance of the spatial average is considered because it has a good combination of spatial variance, acoustic efficiency, and variance of the spatial average.

While a particular solution simultaneously may improve acoustic efficiency, mean spatial variance, and variance of the spatial average, depending on the room and the sound system, a trade-off may be required. The user may review the ranked results and implement the values corresponding to the selected solution to provide the desired combination of low-frequency improvement. For example, the user may determine if some acoustic efficiency should be traded for less spatial variance or vice versa.

In addition to the user, the program executing in computational device 570 may select a solution to implement in the sound system by weighing the solutions from the statistical analysis. Specifically, if the solution resulting in the least mean spatial variance significantly decreases acoustic efficiency, the program may select the desired solution based on weighting factors selected by the user. For example, a user may want increases in acoustic efficiency to be twice as important as decreases in mean spatial variance. Thus, the program executing in computational device 570 may select a solution based on user-preferred weightings if a trade-off in low frequency performance is involved. As discussed above, other types of statistical analysis may be used in evaluating a potential configuration. For example, amplitude variance or mean amplitude variance may be used to evaluate potential configurations.

The S column in FIG. 13 shows the number of loudspeakers and the location for each loudspeaker in relation to the four potential locations. Each solution provides values corresponding to the potential location where a loudspeaker should be placed to implement that solution. Similarly, the number of loudspeakers required to implement the solution is also provided. For example, for Solution 1, two loudspeakers are placed at potential locations 1 and 2. For solution 5, three loudspeakers are placed at positions 1, 3, and 4.

In this manner, the solutions may illustrate the effect of using fewer or greater number of loudspeakers. Specifically, the solutions may illustrate that it is not beneficial, or even detrimental, in using more loudspeakers (e.g., selecting three verses two loudspeakers does not effect low frequency sound performance, or degrade low frequency sound performance at the selected listening positions). The solutions also allow the user to weigh the cost of additional loudspeakers and corrections relative to the potential improvement in low-frequency performance. For example, adding parametric equalization to one of a pair of loudspeakers may improve spatial variance to a greater extent than adding two additional loudspeakers.

The Gain column in FIG. 13 illustrates the gain setting to implement at each loudspeaker to generate the desired increase in low-frequency performance. As previously mentioned, the statistical analysis may independently determine gain settings for implementation at each potential loudspeaker location. For example, in Solution 3, a 6 dB decrease in gain is implemented for the loudspeaker at potential location 2 while a gain correction is not implemented for the loudspeaker placed at potential location 3.

Generally accepted acoustic theory predicts that two loudspeakers having identical positioning from opposing, perpendicular room boundaries must have equal gain settings to cancel room modes to improve low-frequency performance. While this may be true if loudspeaker placement is exact, the space is symmetrical, and the space boundaries have identical acoustic character, the acoustic character of space boundaries is generally quite varied. Thus, the statistical analysis may determine solutions having gain setting values that provide increased low-frequency performance when the loudspeakers are not identically spaced from the room boundaries. Solutions also may be provided having gain setting values that provide increased low-frequency performance when the space boundaries have varied acoustic character, are not perpendicular to each other, and have openings, such as doors.

The statistical analyses also may determine solutions that decrease the gain setting at a potential loudspeaker location to increase the low-frequency sound level heard at one or more listening positions. This can be seen by comparing Solution 1 with Solution 3, where Solution 3 shows that a 6 dB gain reduction for loudspeaker 2 provides a greater acoustic efficiency than obtained from Solution 1—where both loudspeakers have a unity gain of 0. This is counterintuitive to generally accepted acoustic theory, where it is expected that turning down the volume will reduce the sound level.

The Delay column in FIG. 13 shows the delay setting to implement at each loudspeaker for each solution. As previously mentioned, the statistical analysis may independently determine delay settings for implementation at each potential loudspeaker location. Thus, for Solution 3, a 10 ms delay is implemented for the loudspeaker at potential location 2 while delay is not implemented for the loudspeaker placed at potential location 3. Delay settings also may have a beneficial effect on acoustic efficiency.

The Center, Bandwidth, and Level columns in FIG. 13 provide potential filters, such as potential parametric equalization settings, to implement at one, some or each loudspeaker for each solution. As previously mentioned, various types of equalization may be investigated including parametric, graphic, paragraphic, shelving, FIR, and transversal. The statistical analysis may independently determine equalization settings for implementation at each potential loudspeaker location. In parametric equalization, center frequency determines the frequency at which the adjustment will be applied, for example 60 Hz. Bandwidth determines how broad the amplitude adjustment will be. For example, if Q=4, the bandwidth=15 Hz. Level determines the amount of amplitude adjustment that will be applied, such as −12 dB. While an amplitude increase or decrease may be applied, generally a decrease in amplitude is applied. Thus, for Solution 3, a 6 dB reduction in level is applied over a Q of 16 at a center frequency of 27 Hz for the loudspeaker at potential location 2 and a 0 dB reduction in level is applied over a Q of 1 at a center frequency of 41 Hz for the loudspeaker at potential location 3. Because frequency-dependent gain (equalization level) is another type of gain reduction, reducing the equalization level setting at one or at a plurality of frequencies on one or a plurality of loudspeakers may also increase the acoustic efficiency of low-frequencies produced at one or more seating positions.

Of note, acoustic efficiency and mean overall level in a particular frequency band (such as frequencies below 50 Hz) may increase by decreasing frequency-independent or dependent gain and/or delay. For example, the acoustic efficiency and mean overall level may be increased by decreasing the volume at one or more loudspeakers. This increase in acoustic efficiency and mean overall level may arise because amplitude peaks generally cover a larger physical volume of the room than amplitude dips. For example, a peak may cover two to three listening positions while a dip may only cover one listening position. When the statistical analysis determines solutions providing reduced mean spatial variance and/or variance of spatial average, the implementation of the solution values into the sound system may provide for an increase in peaks (constructive interference) at the expense of dips (destructive interference) in the amplitude response. This increase in peaks in relation to dips at the listening positions may be attributable to a reduction in destructive interference between the sound waves of the acoustic signal. Thus, it may be possible to realize an increase in low-frequency acoustic efficiency because acoustic energy may be heard that was attenuated by wave cancellation before the corrections were implemented.

FIG. 14 is an expanded block diagram of block 612 from FIG. 6 depicting the implementation of the values corresponding to the selected solution in the sound system. The solution values corresponding to loudspeaker number and location are implemented by positioning one or more loudspeakers at the determined location or locations, as shown at block 1402. Thus, to implement Solution 2 from FIG. 13, a loudspeaker would be placed at potential locations 1, 2, and 3. Similarly, to implement Solution 1 having the least spatial variance, loudspeakers would be placed at potential locations 1 and 2.

Correction settings many be implemented in the sound system 500 in the analog domain (e.g., gain or equalization) or the digital domain (e.g., gain, equalization, or delay) and at any convenient point in the signal path. Gain settings may be implemented in the sound system 500 by independently lowering or raising a gain adjustment (commonly referred to as loudness or volume control) at each loudspeaker, as shown at block 1404. Thus, to implement Solution 2 from FIG. 14, the gain for the loudspeaker at potential location 1 would be reduced by 6 dB from unity, the gain of the loudspeaker at potential location 2 would remain at unity or 0, and the gain of the loudspeaker at potential location 3 would be reduced 12 dB from unity. While gain corrections are generally implemented by attenuating or increasing the electrical signal that the transducer converts to an acoustic signal, they may also be implemented by placing multiple loudspeakers that respond to a common electrical signal at a single location, and the like. Or, the correction settings may be implemented by changing the wiring of the loudspeakers.

Delay settings, such as 10 milliseconds (ms), may be implemented in the sound system 500 in the digital domain at each loudspeaker, as shown at block 1406. The delay setting may be implemented after a surround sound or other processor generates a low-frequency output from an input. For example, if a digital DOLBY DIGITAL 5.1® or DTS® signal is input to a digital surround sound decoder, a LFE (low-frequency effects) signal is output. Prior to converting this output to the analog domain for amplification, delay settings may be introduced. The delay settings may be implemented in the processor 504, which can then output analog signals, or at the loudspeaker, if the loudspeaker electronics can accept a digital input. Thus, to implement Solution 2 from FIG. 13, a delay of 0 ms (no delay) would be applied for the loudspeaker at potential location 1, a delay of 10 ms would be applied to the signal reproduced by loudspeaker at potential location 2, and no delay would be applied for loudspeaker at potential location 3.

Equalization settings may be implemented in the sound system 500 by independently applying equalization at each loudspeaker, as shown at block 1408. Parametric equalization is a convenient method of implementing equalization at each loudspeaker. Parametric equalization allows for the implementation of settings to select the center frequency, the bandwidth, and the amount of amplitude increase or decrease (level) to apply. A center frequency, bandwidth, and level setting may be independently applied to the signal reproduced by each loudspeaker. Thus, to implement Solution 2 from FIG. 14, the center frequency, Q, and level settings would be set to 22 Hz, 1, and −6 dB for loudspeaker 1; and 85 Hz, 1, and −12 dB for loudspeaker 3. Equalization would not be implemented for the loudspeaker at potential location 2 because the level setting is 0 dB or unity. Block 612 may contain fewer or additional steps not depicted in FIG. 14.

EXAMPLES

Seven audio systems were examined. The first five are examples in which home theater systems were examined using the above-referenced analysis. Of the five home theater systems, three were actual existing home theater systems and two were experimental systems in listening rooms. In each of the home theater examples, the optimized system is compared to a relevant base line. Further, in each of the home theater examples, the results are predicted using real measured data. The last two are examples in which vehicles were examined using the above-referenced analysis.

Example 1

Figure 15:
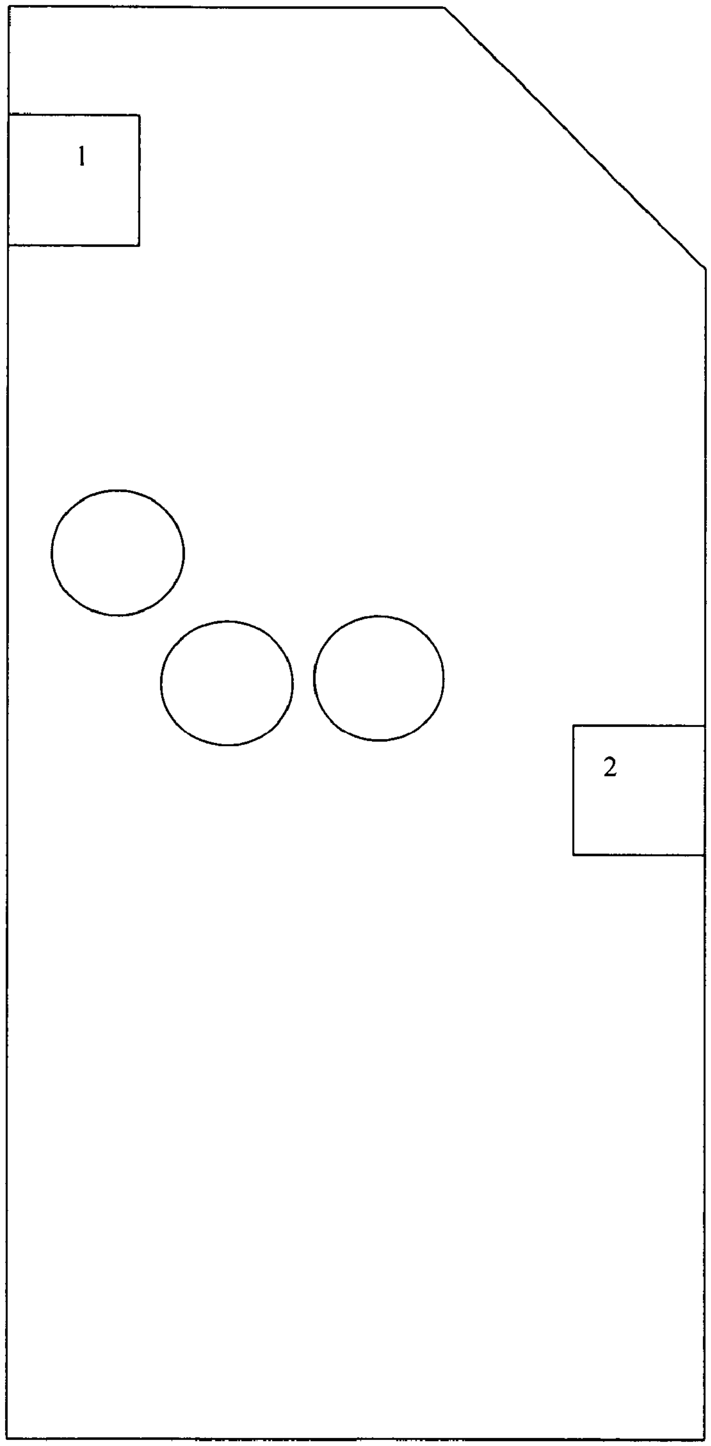
FIG. 15 is an example of a layout of a listening room in Example 1.

The first system investigated is not a dedicated home theater. Therefore, the existing subwoofer locations are a compromise between low frequency performance and aesthetic concerns. FIG. 15 is the layout for the room in Example 1, the scale of which is approximately 100:1. The square boxes represent the two subwoofer locations and the circles represent the three listening positions. The room depicted in FIG. 15 is approximately 27'×13', with a 45° angle for one of the walls, and has a 9' ceiling. The walls and ceiling are constructed of drywall and 2"×6" studs. The floor is constructed of a concrete slab and is covered with ceramic tile. An area rug covers a large portion of the floor.

Figure 16:
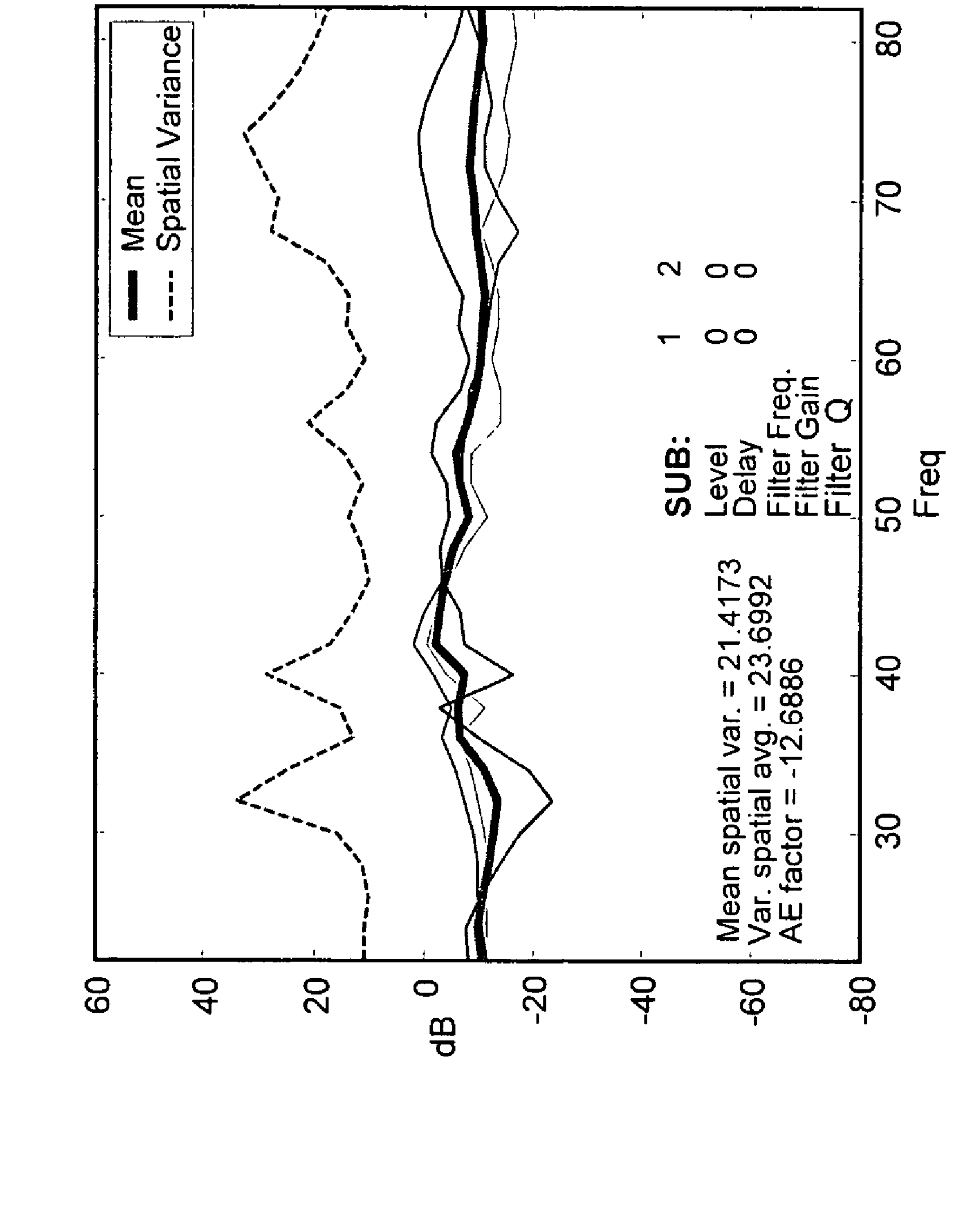
FIG. 16 is a graph of low frequency performance for the listening room in Example 1 without low frequency optimization.
Figure 17:
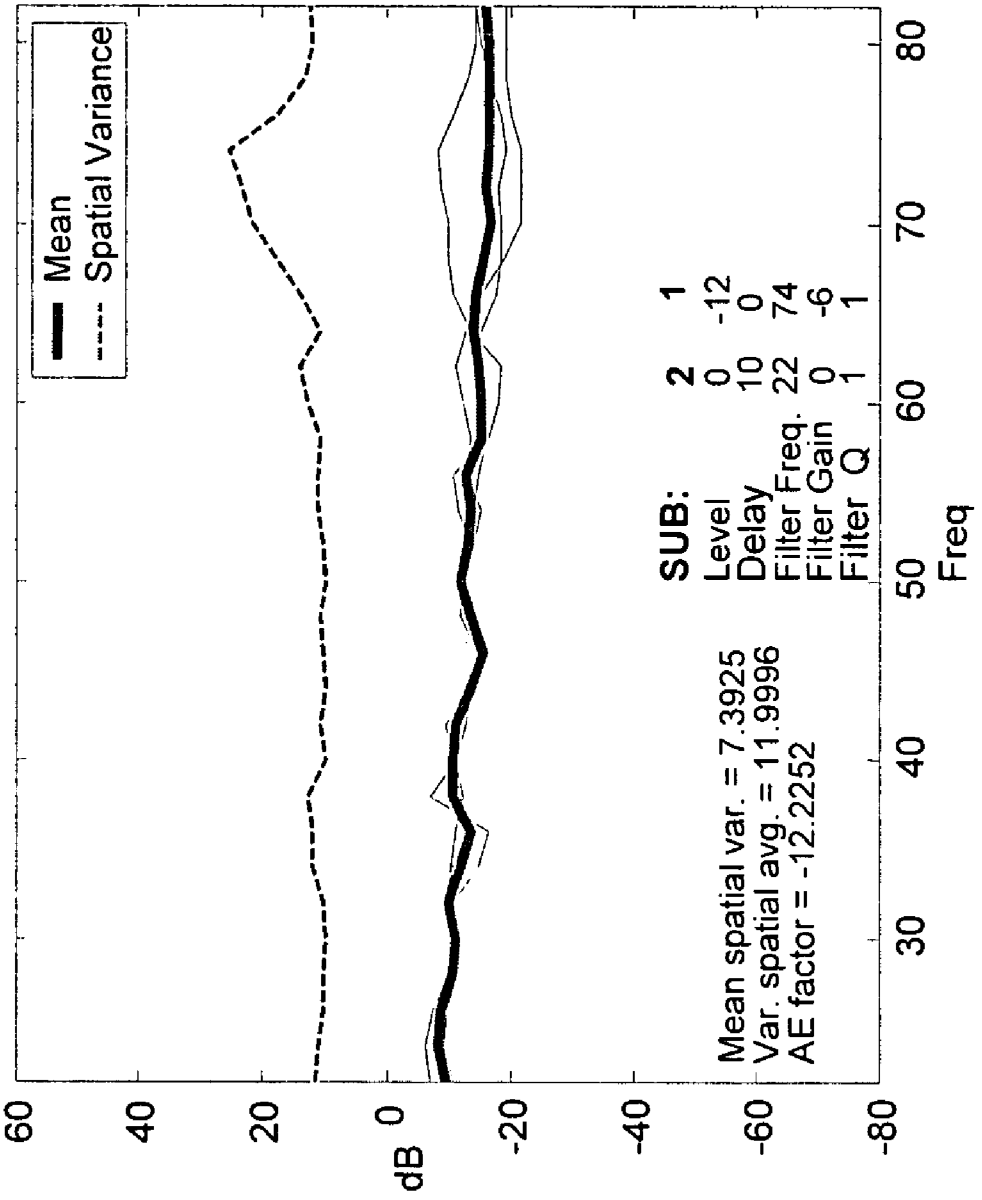
FIG. 17 is a graph of predicted low frequency performance for the listening room in Example 1 with low frequency optimization.

FIG. 16 describes the low frequency performance of the system before low-frequency analysis was applied. The heavy solid curve in the middle of FIG. 16 is the average amplitude response for the three listening positions. The lighter middle curves are the responses at each listening position and the upper dashed curve is the mean spatial variance as a function of frequency, raised by 10 dB for clarity. The text in the bottom left lists the metrics for this configuration, with a mean spatial variance of 21.4173 dB, a variance of the spatial average of 23.6992 dB, and an acoustic efficiency of −12.6886 dB. The text in the bottom right of FIG. 16 shows the parameters for the configuration, with no modification to the correction factors. FIG. 17 is a graph for the predicted performance after low-frequency analysis is applied. Table 1 compares the performance and parameters of the system before and after low-frequency analysis.

TABLE 1

| Active Subwoofers | Low-frequency analysis (yes/no) | Mean Spatial Variance | Variance of the spatial average | Acoustic Efficiency |
|---|---|---|---|---|
| 1, 2 | No | 21.4 dB | 23.7 dB | −12.7 dB |
| 1, 2 | Yes | 7.4 dB | 12.0 dB | −12.3 dB |

Example 1, which has one wall with a 45° angle, shows that the low-frequency analysis may be applied to any room configuration, such as a non-rectangular room. Further, the system in Example 1 has the number and positions of subwoofers predetermined. The low-frequency analysis in Example 1 focuses on correction factors to improve the low-frequency response of the system. For example, correction factors directed to gain, delay, and equalization are applied to at least some of the loudspeakers in Example 1. The results of the low-frequency analysis, as shown in FIGS. 16 and 17 and Table 1 show that with the analysis, the mean spatial variance and variance of the spatial average have decreased dramatically, which is beneficial, and the acoustic efficiency has increased slightly, which is also beneficial.

Example 2

Figure 18:
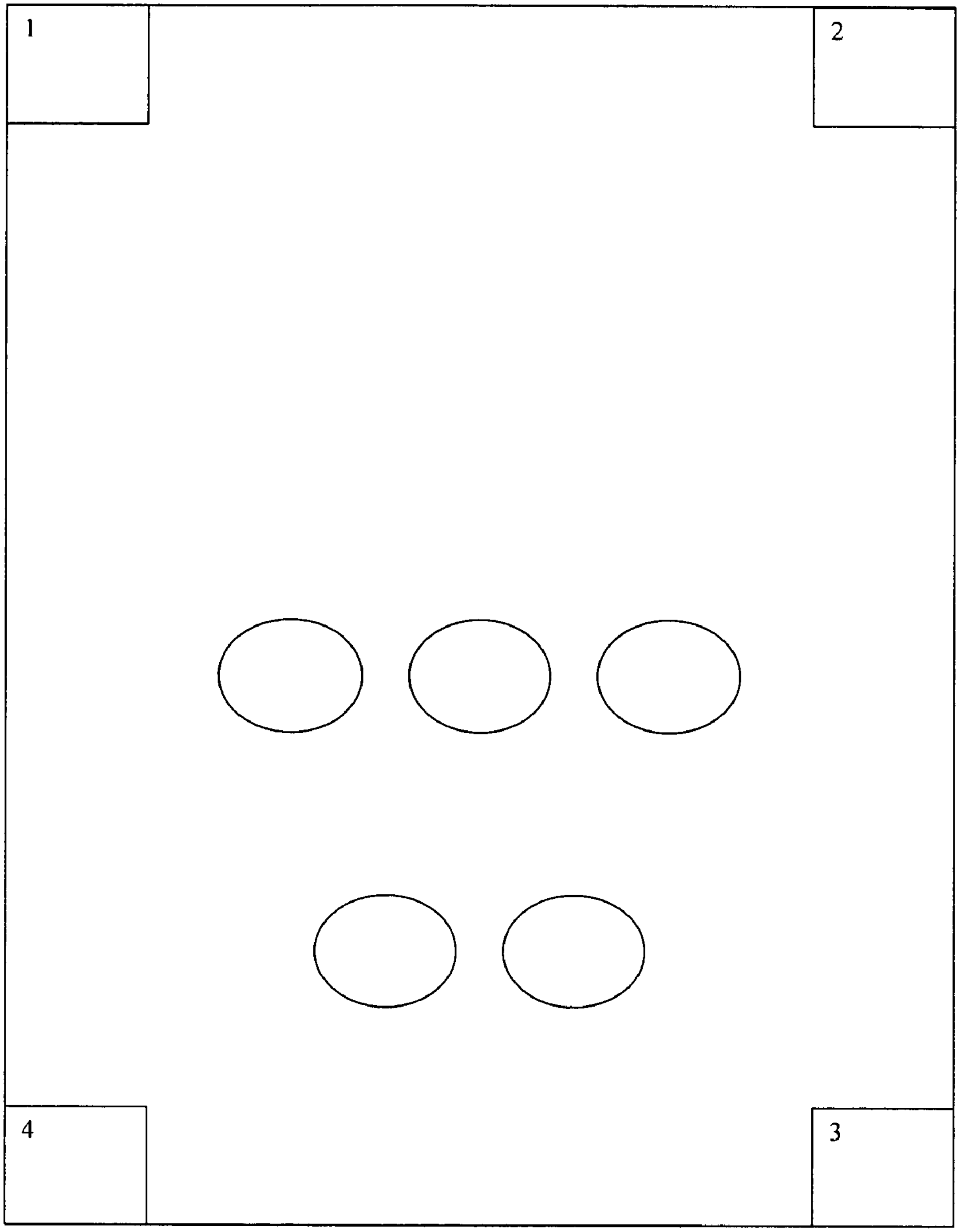
FIG. 18 is an example of a layout of a dedicated home theater system in Example 2.
Figure 19:
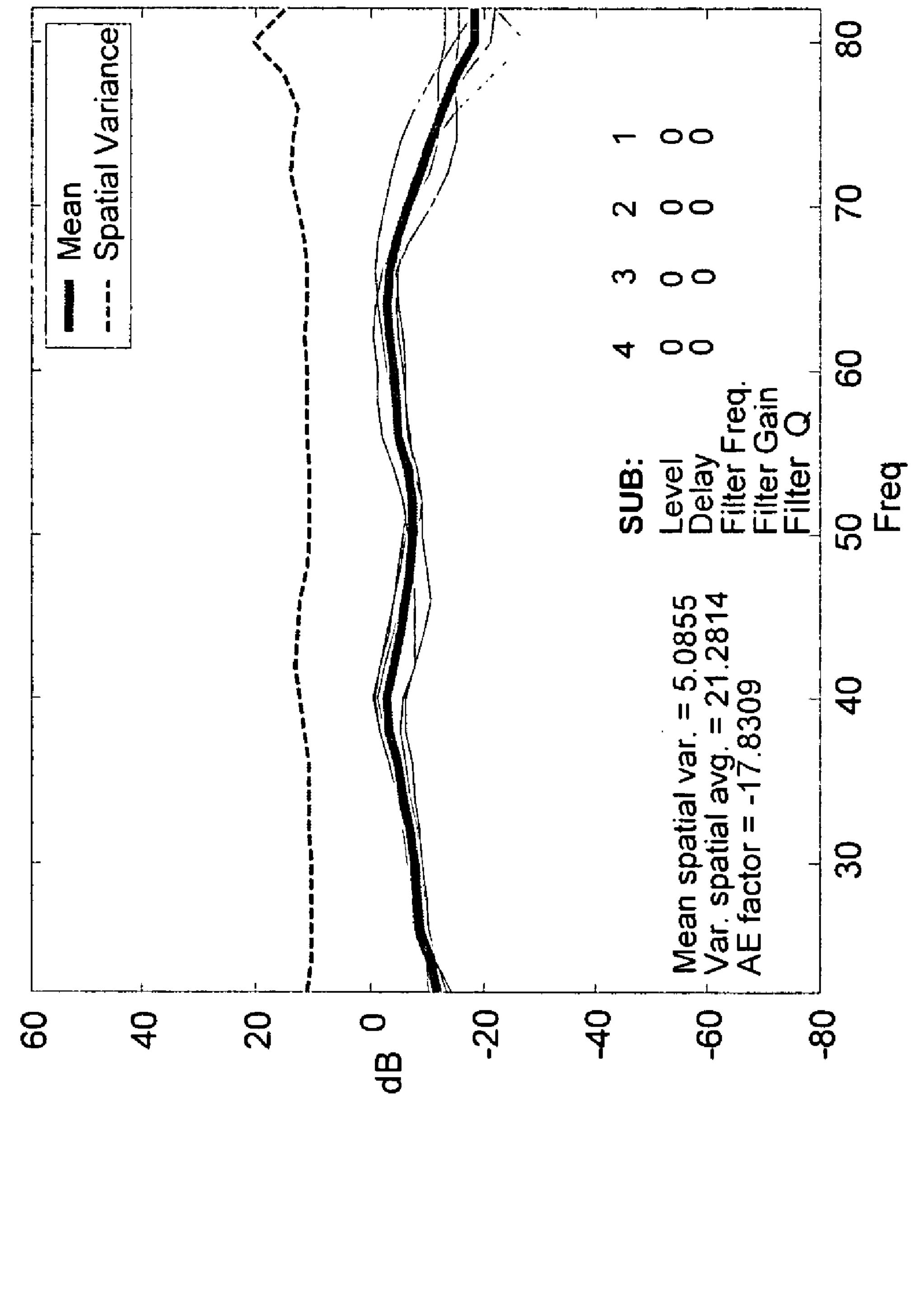
FIG. 19 is a graph of low frequency performance for the dedicated home theater system in Example 2 without low frequency optimization.
Figure 20:
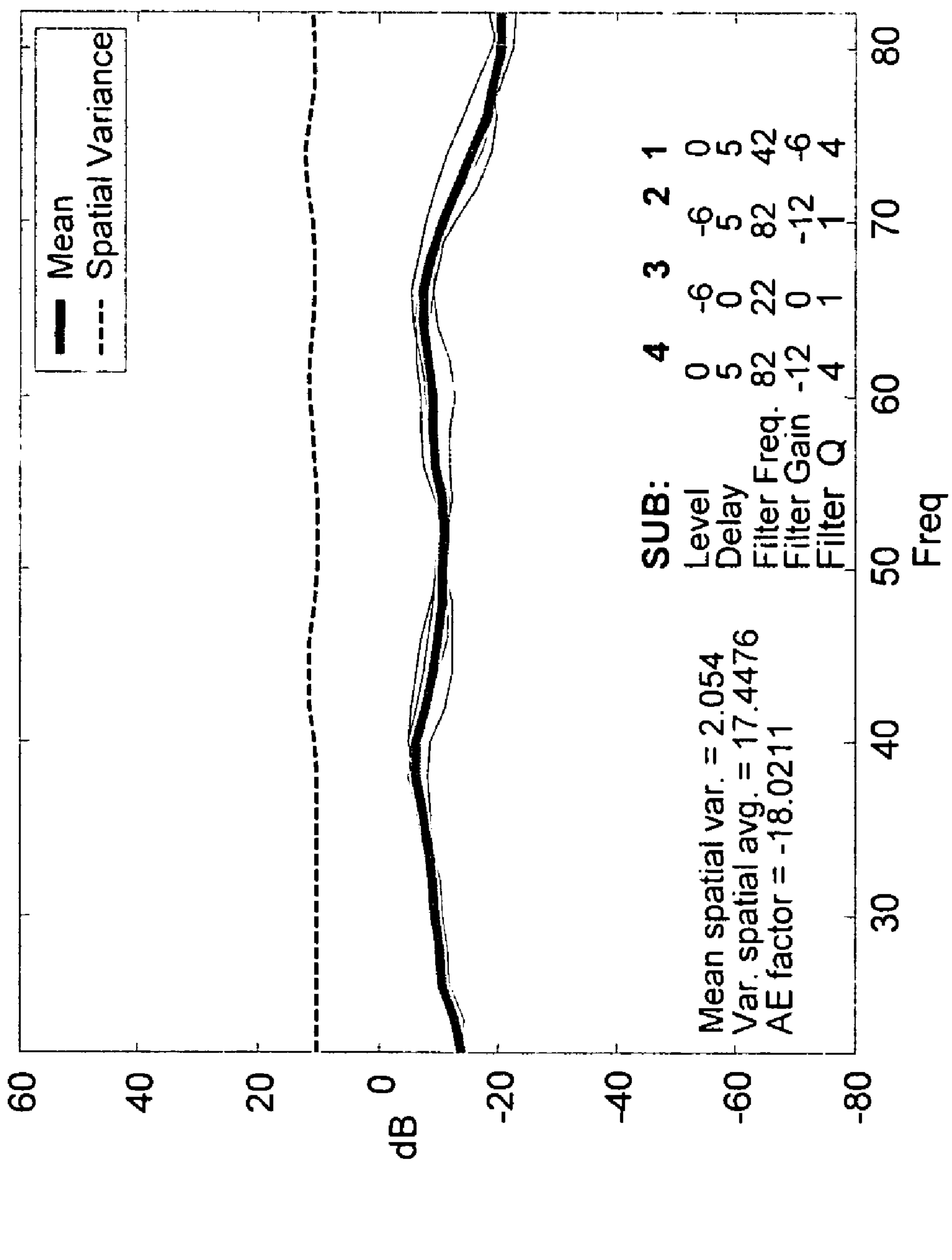
FIG. 20 is a graph of predicted low frequency performance for the dedicated home theater system in Example 2 with low frequency optimization.

The second system investigated in Example 2 is a $300,000+dedicated home theater. FIG. 18 describes the layout of the room in Example 2. The system features one subwoofer in each corner of the room, a front-projection video system and a riser for the second row of seating. The room is approximately 26'×17' and has a 9' ceiling. Two of the walls are constructed of concrete blocks and two of the walls are constructed from drywall and 2"×4" studs. The floor is a carpeted concrete slab. The second row of seating is on an 8" riser constructed of plywood and 2"×4" studs. The room features extensive damping on all walls. FIGS. 19 and 20 define the low frequency performance before and after low-frequency analysis. Table 2 compares the performance of the system in Example 2 before and after low-frequency analysis.

TABLE 2

| Active Subwoofers | Low-frequency analysis (yes/no) | Mean Spatial Variance | Variance of the spatial average | Acoustic Efficiency |
|---|---|---|---|---|
| 1, 2, 3, 4 | No | 5.1 dB | 21.3 dB | −17.3 dB |
| 1, 2, 3, 4 | Yes | 2.1 dB | 17.4 dB | −18.0 dB |

The system in Example 2 has the number and positions of subwoofers predetermined with four subwoofers in each corner of the room. The low-frequency analysis focuses on correction factors to improve the low-frequency response of the system. For example, correction factors directed to gain, delay, and equalization are applied to at least some of the loudspeakers in Example 2. The results of the low-frequency analysis, as shown in FIGS. 19 and 20 and Table 2 show that with the analysis, the mean spatial variance and variance of the spatial average have improved, and the acoustic efficiency has decreased slightly.

Example 3

Figure 21:
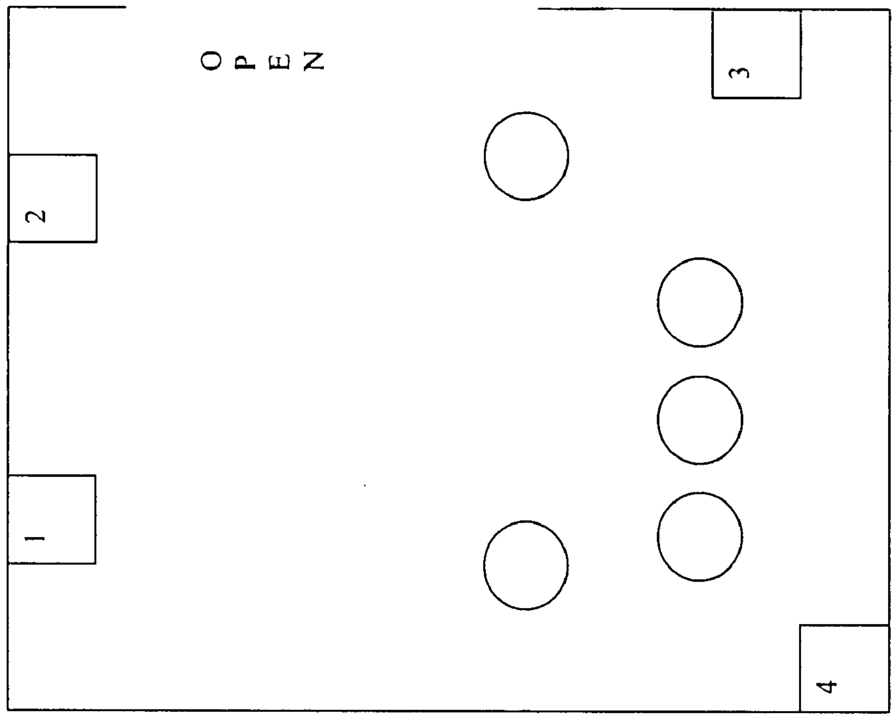
FIG. 21 is an example of a layout of a family room home theater system in Example 3.
Figure 22:
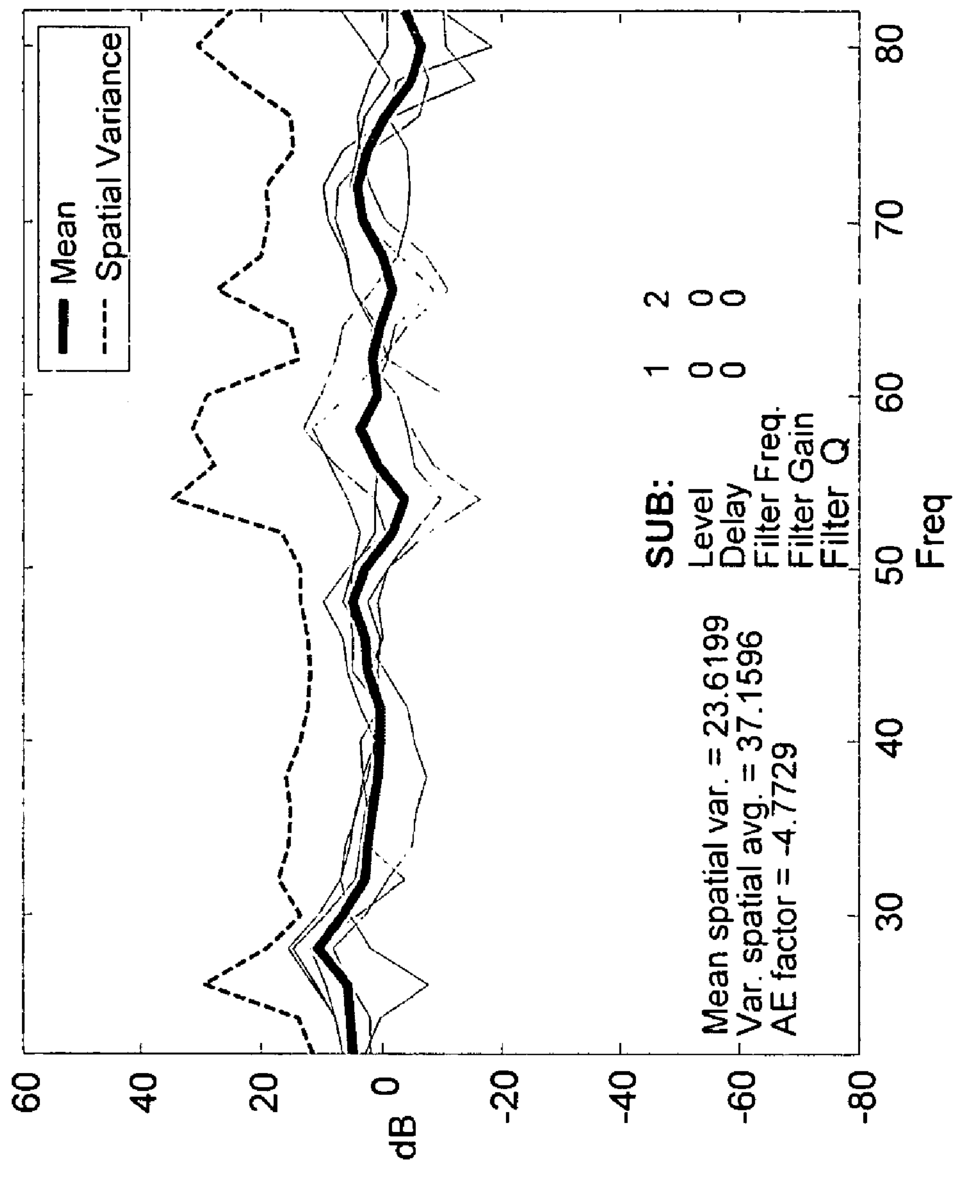
FIG. 22 is a graph of low frequency performance for the family room home theater system in Example 3 without low frequency optimization and with only the front two subwoofers active (subwoofers 1 and 2 shown in FIG. 21).
Figure 23:
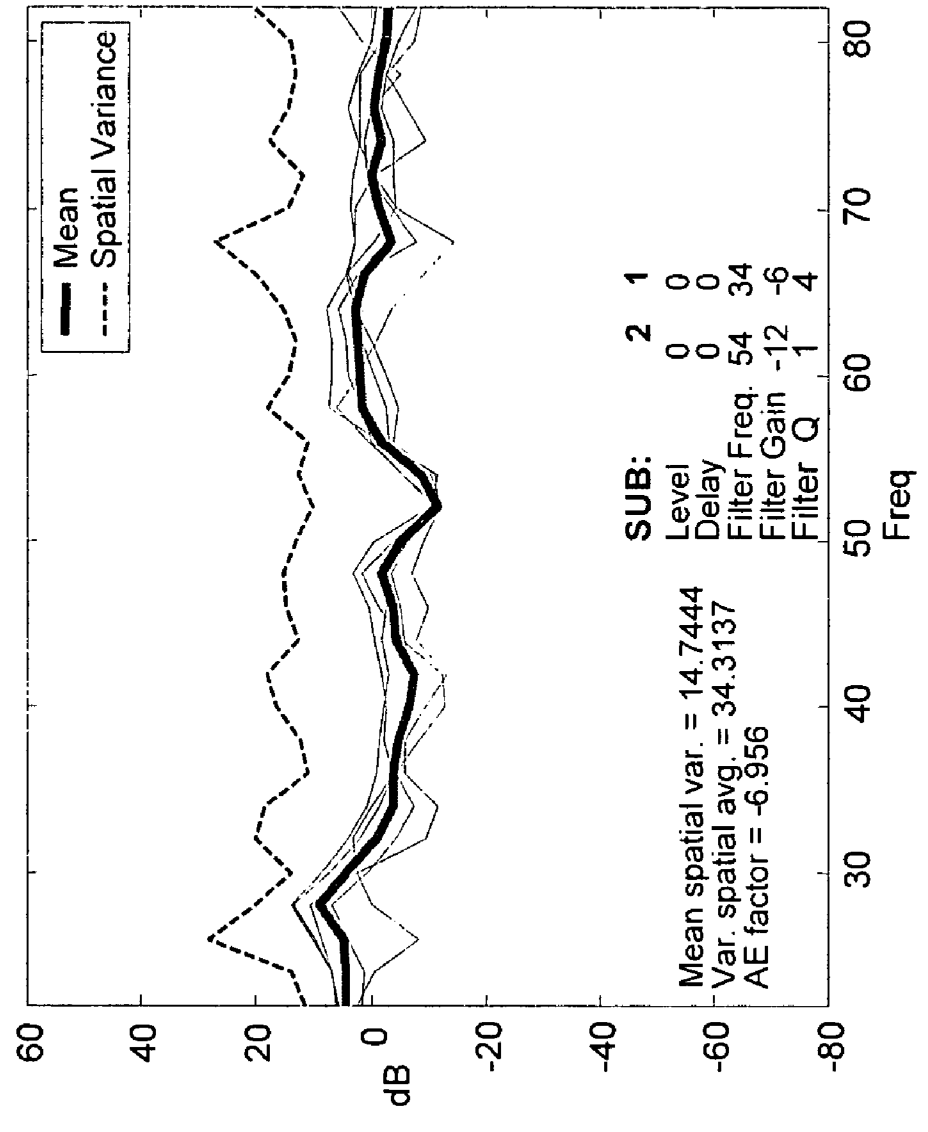
FIG. 23 is a graph of predicted low frequency performance for the family room home theater system in Example 3 with low frequency optimization applied to the front two subwoofers (subwoofers 1 and 2 shown in FIG. 21).

The third system in Example 3 comprises a home theater set-up in a family room. FIG. 21 shows the layout of the room in Example 3. The room is approximately 22'×21' and features a sloped ceiling. The walls and ceiling are constructed of drywall and 2"×4" studs. The floor is a concrete slab with the perimeter covered by tile and the central area carpeted. The left side wall features several windows which can be (and were) covered by heavy drapes. The system originally featured two subwoofers in the front of the room. FIG. 22 describes the low frequency performance in the original configuration before low-frequency analysis was applied, with the system constrained to using subwoofers 1 and 2 in the front of the room. FIG. 23 describes the low frequency performance after low-frequency analysis was applied, with the system constrained to using subwoofers 1 and 2. Two additional subwoofers were placed in the back of the room and low-frequency analysis was applied, the results of which are presented in FIG. 24. Table 3 compares the performance of the system before and after the improvements were made.

TABLE 3

| Active Subwoofers | Low-frequency analysis (yes/no) | Mean Spatial Variance | Variance of the spatial average | Acoustic Efficiency |
|---|---|---|---|---|
| 1, 2 | No | 23.6 dB | 37.2 dB | −4.8 dB |
| 1, 2 | Yes | 14.7 dB | 34.3 dB | −7.0 dB |
| 1, 2, 3, 4 | Yes | 5.7 dB | 11.2 dB | −2.5 dB |

Figure 24:
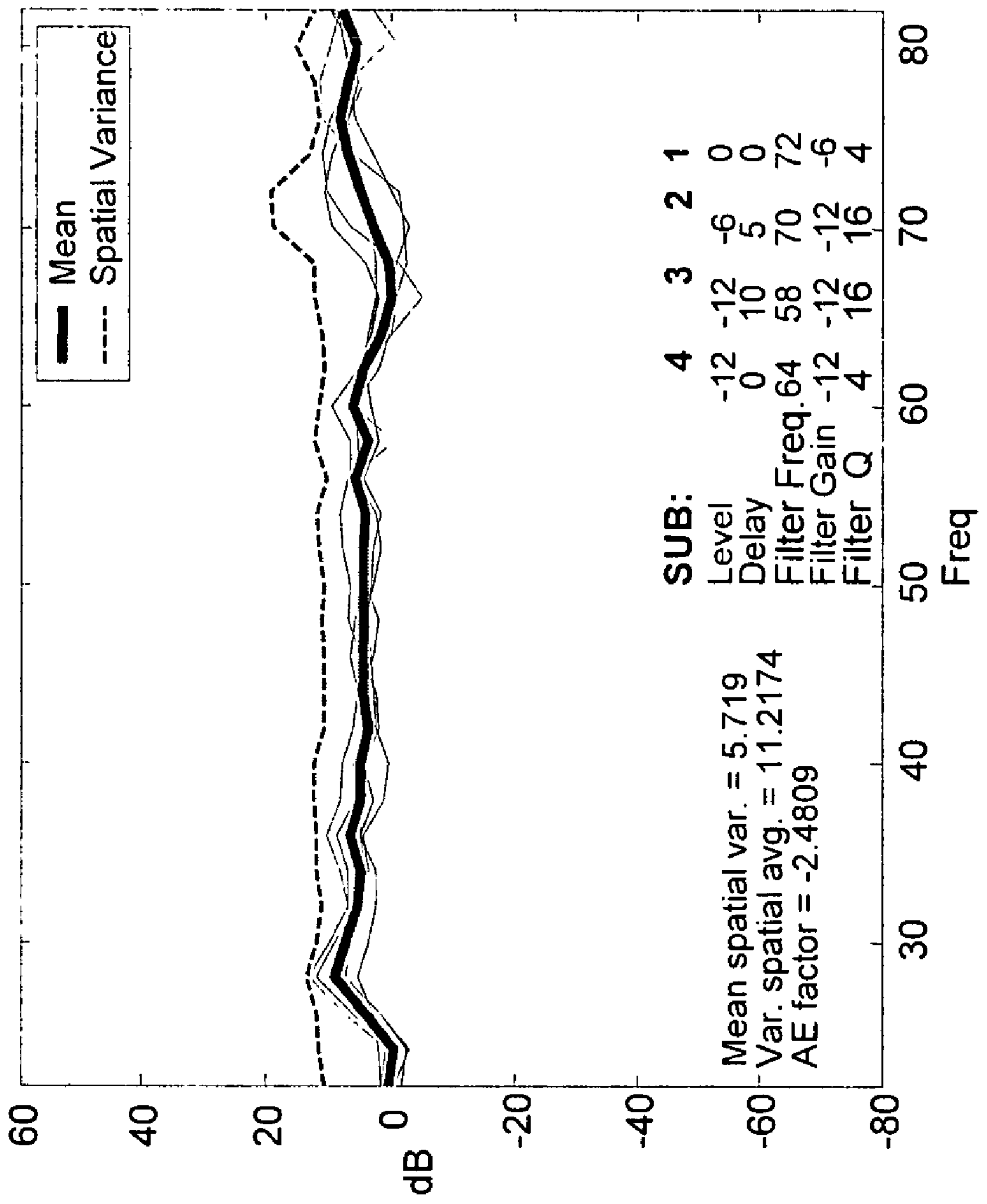
FIG. 24 is a graph of predicted low frequency performance for the family room home theater system in Example 3 with low frequency optimization applied to the four subwoofers in the system (subwoofers 1, 2, 3, and 4 shown in FIG. 21).

Example 3 highlights potentially different solutions based on the number of subwoofers, placement of subwoofers, and correction factors applied. FIG. 23 provides a solution for subwoofers that are placed in the same configuration as shown in FIG. 22. Using low-frequency analysis, FIG. 23 illustrates that with the same configuration, the mean spatial variance decreases dramatically, the variance of the spatial average decreases, and the acoustic efficiency decreases. FIG. 24 provides a solution for subwoofers that are placed in each corner of the room. Using the low-frequency analysis, FIG. 24 shows that the mean spatial variance, variance of the spatial average, and acoustic efficiency are significantly improved.

Example 4

Figure 25:
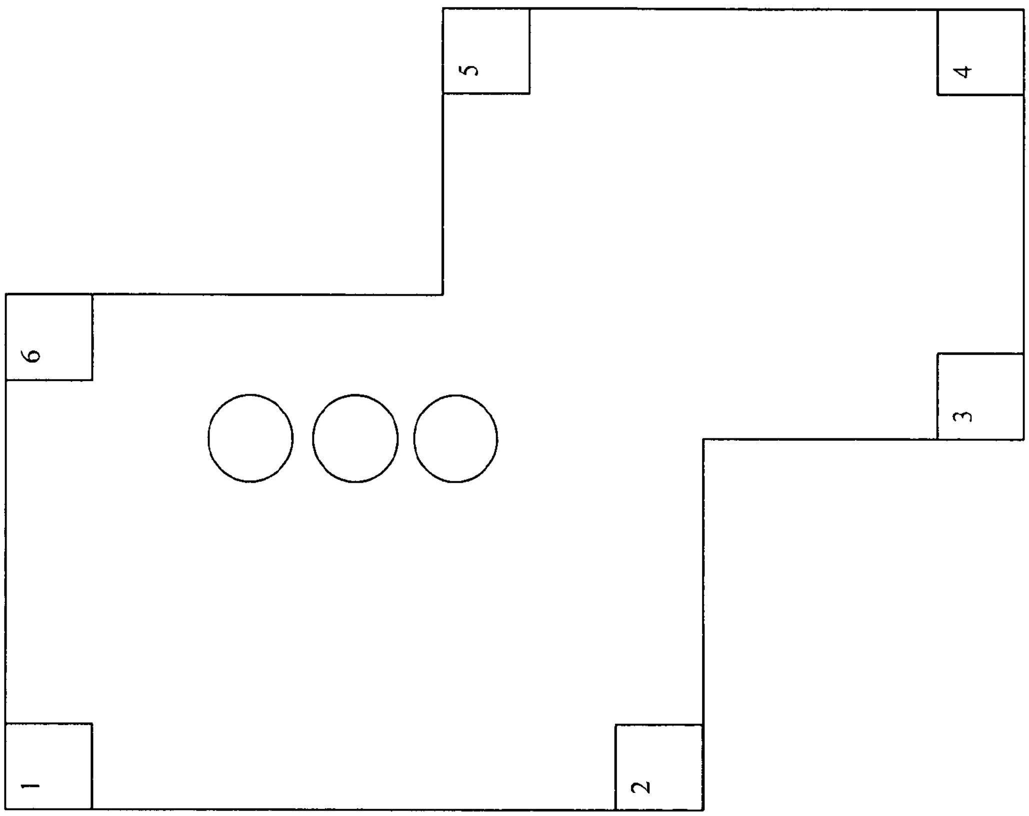
FIG. 25 is an example of a layout of an open room home theater system in Example 4.
Figure 26:
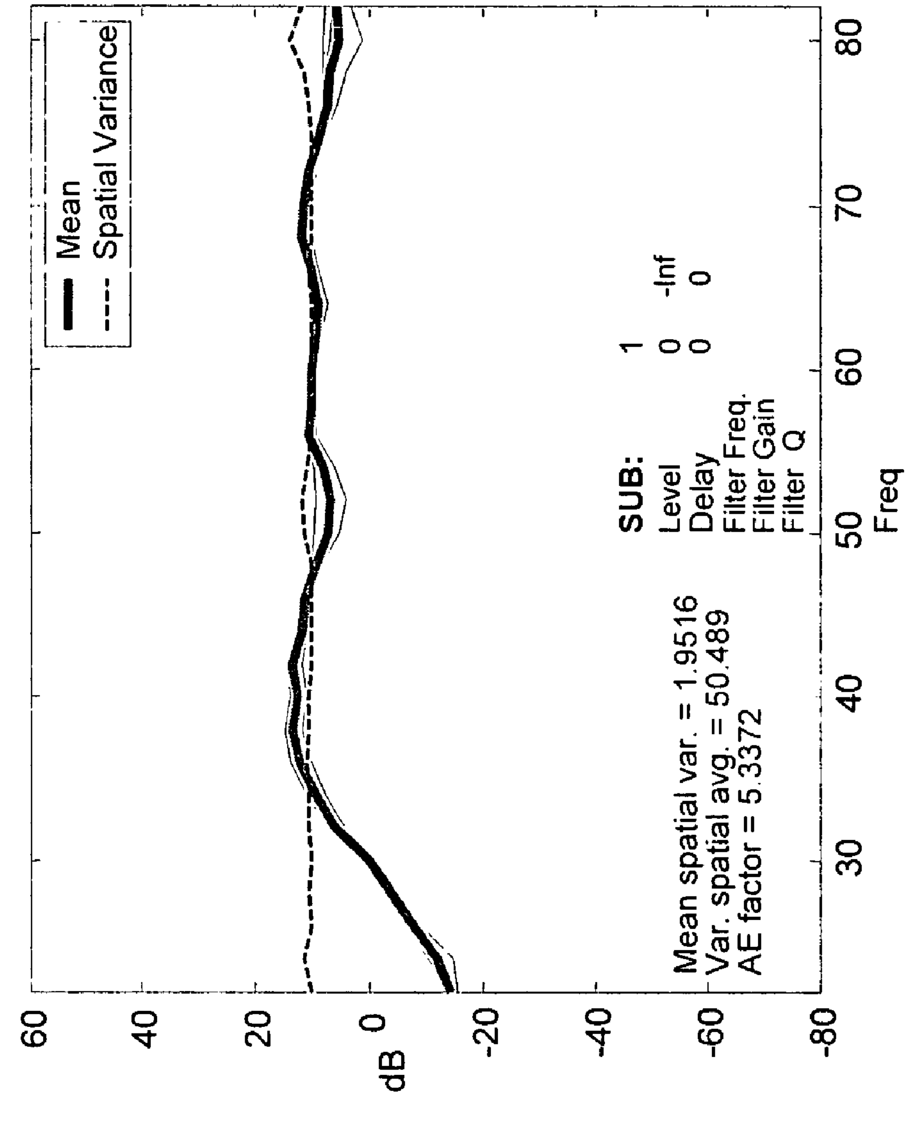
FIG. 26 is a graph of low frequency performance for the open room home theater system in Example 4 without low frequency optimization and with only subwoofer 1 shown in FIG. 25 active.
Figure 27:
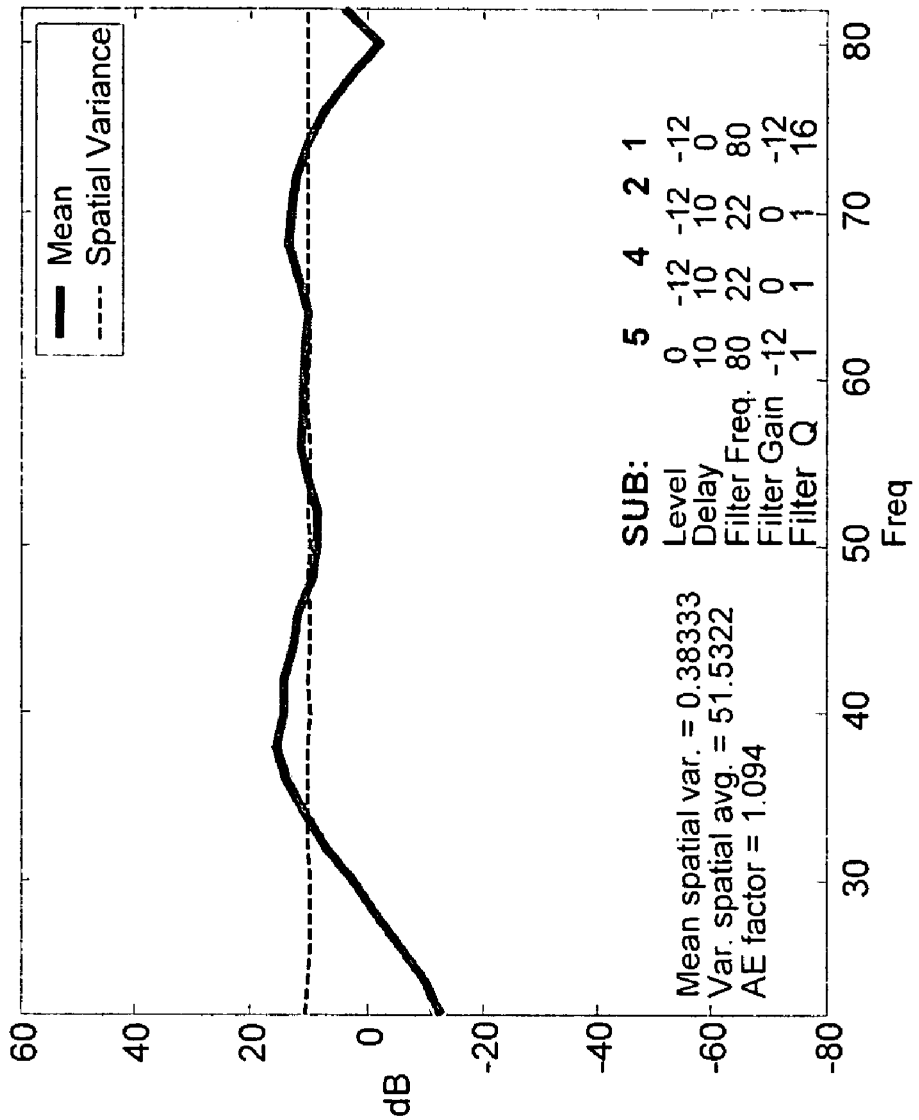
FIG. 27 is a graph of predicted low frequency performance for the open room home theater system in Example 4 with low frequency optimization used to determine that subwoofer locations 1, 2, 4, and 5 shown in FIG. 25 are optimum.

The system in Example 4 is in a room that is open to an adjacent room. FIG. 25 is the layout of the room in Example 4. The main room is 20'×15' and is open to another room that measures 17'×13'. Both rooms have an 8' "dropped ceiling" and a slab concrete floor covered by carpet. All of the walls are constructed from drywall and 2"×4" studs. The original configuration used one subwoofer. FIG. 26 is a graph for the performance of the system in the original configuration. It should be noted that this is an exceptionally good listening room as evidenced by the graph in FIG. 26. Six potential subwoofer locations were measured and low-frequency analysis was used to determine the best four. FIG. 27 is a graph for the performance of the system after low-frequency analysis chose the best four subwoofer locations (subwoofers 1, 2, 4, and 5) and optimized each subwoofer's parameters. Table 4 compares the set-up before and after optimization.

TABLE 4

| Active Subwoofers | Low-frequency analysis (yes/no) | Mean Spatial Variance | Variance of the spatial average | Acoustic Efficiency |
|---|---|---|---|---|
| 1 | No | 2.0 dB | 50.5 dB | 5.3 dB |
| 1, 2, 4, 5 | Yes | 0.4 dB | 51.5 dB | 1.1 dB |

Example 4, similar to Example 3, highlights potentially different solutions based on different aspects of the sound system such as the number of subwoofers, placement of subwoofers, and correction factors applied. Through low-frequency analysis, the number of the subwoofers, the placement of the subwoofers from the potential subwoofer locations, and/or the correction factors may be determined. Specifically, up to six potential subwoofers could have been included in the system in Example 4. Low-frequency analysis determined that four subwoofers were the optimal number. Further, six potential subwoofer locations were available, with positions 1, 2, 4, and 5 selected. Using low-frequency analysis, FIG. 27 shows that the mean spatial variance decreases, the variance of the spatial average increases, and the acoustic efficiency increases.

Example 5

Figure 28:
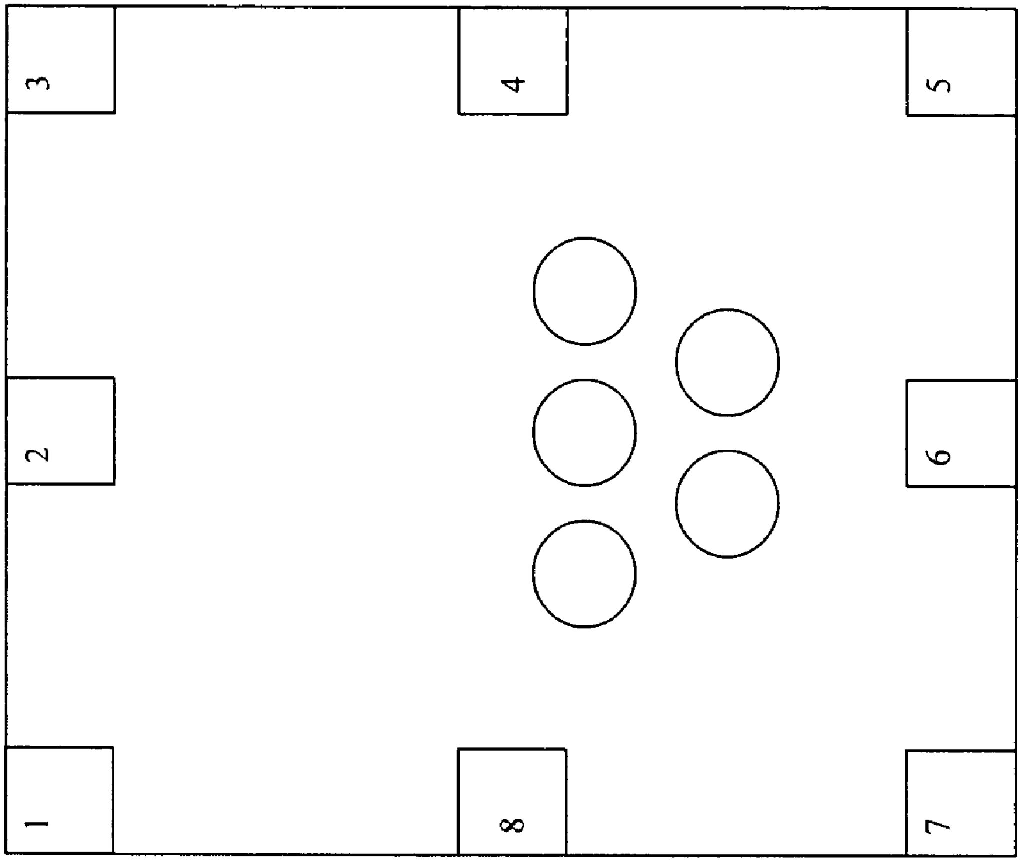
FIG. 28 is an example of a layout of an engineering listening room in Example 5.

The room in Example 5 is an engineering listening room. FIG. 28 shows the layout of the engineering listening room for Example 5. The room is approximately 21'×24' and has a 9' ceiling. The walls and the ceiling are constructed with two layers of drywall and 2"×6" studs. The floor is a concrete slab with wall-to-wall carpeting. Because all the room boundaries are relatively stiff, this room has little damping at low frequencies. In this regard, the room in Example 5 has very different acoustical properties from the room in Example 2, which had significant damping at low frequencies.

A total of 8 potential subwoofer locations and 5 listening positions were measured to yield 40 transfer functions. Several configurations were then simulated, as detailed in FIGS. 29-39. All of the results in this example are predicted using the real measured data from the 40 transfer functions.

Figure 29:
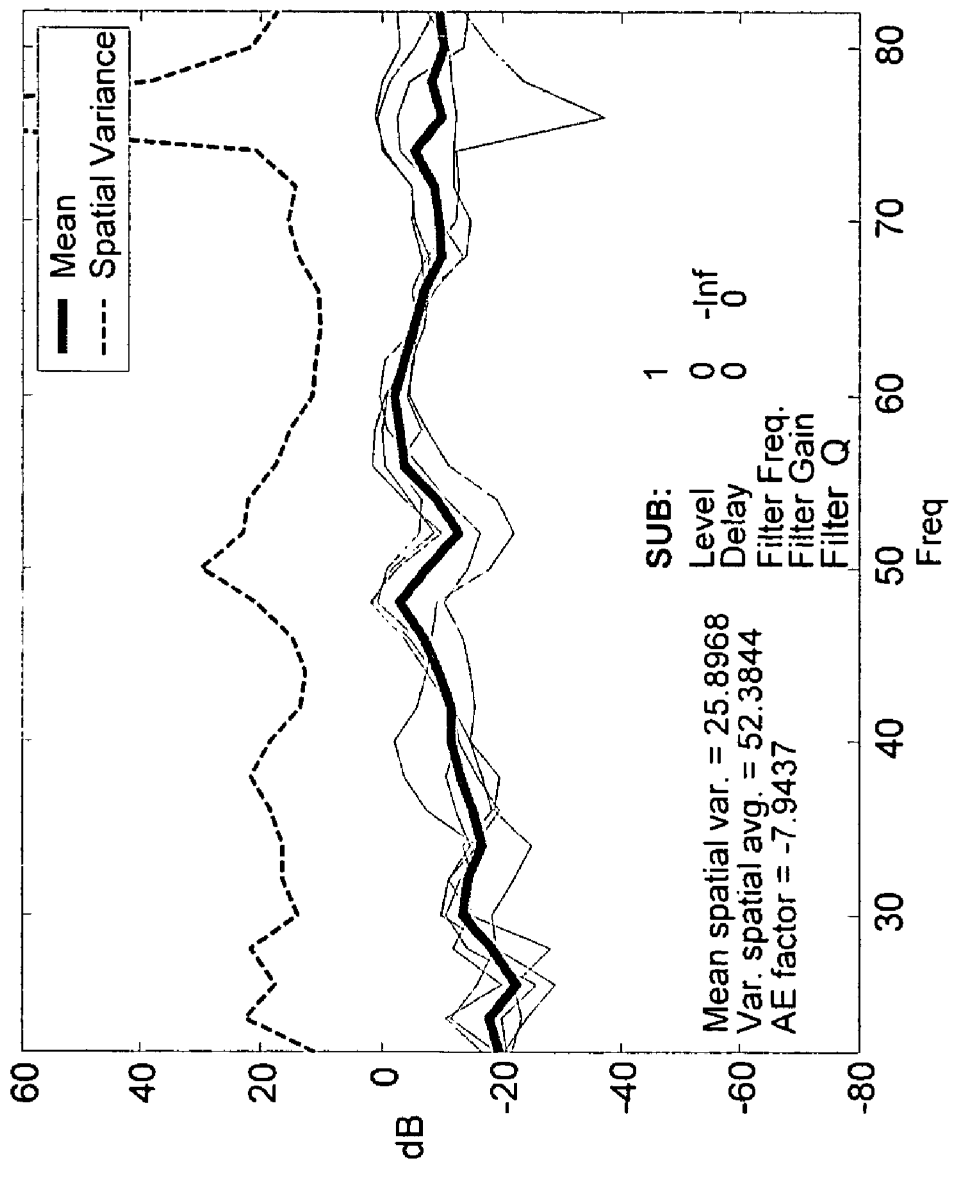
FIG. 29 is a graph of predicted low frequency performance for the engineering listening room in Example 5 without low frequency optimization and with only subwoofer 1 shown in FIG. 28 active.
Figure 30:
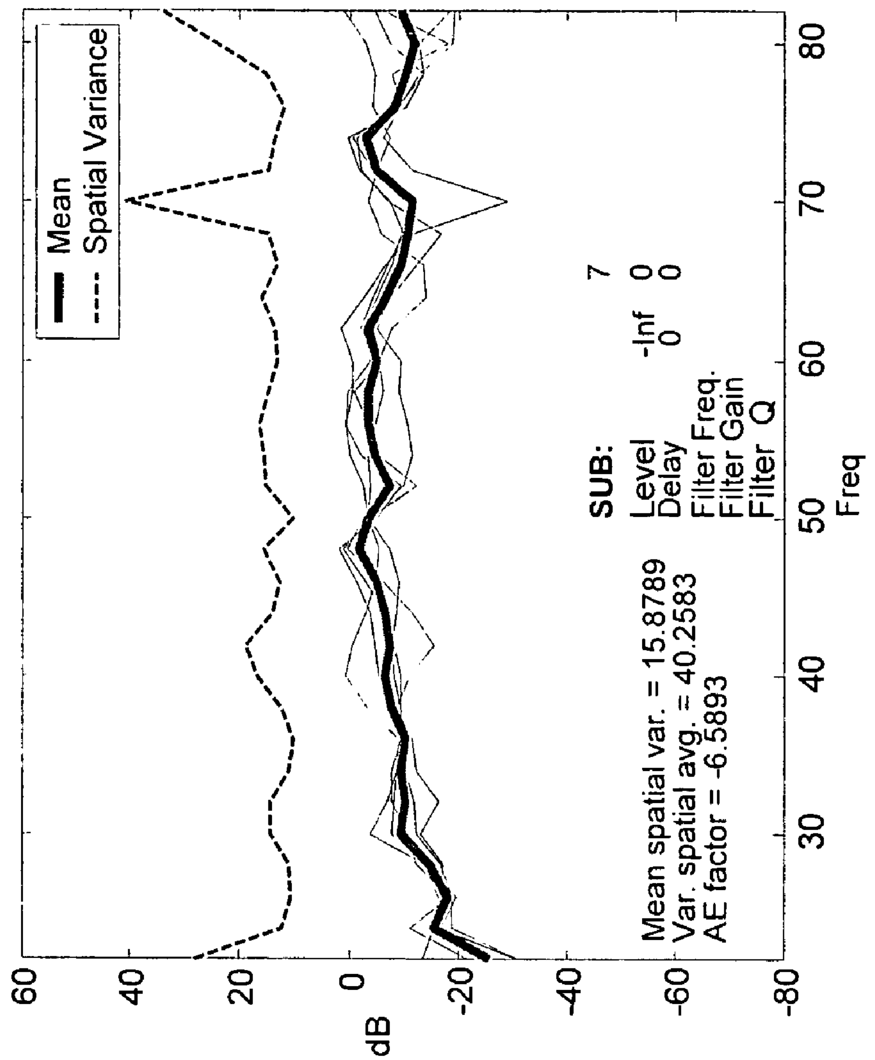
FIG. 30 is a graph of predicted low frequency performance for the engineering listening room in Example 5 with low frequency optimization for one active subwoofer.
Figure 31:
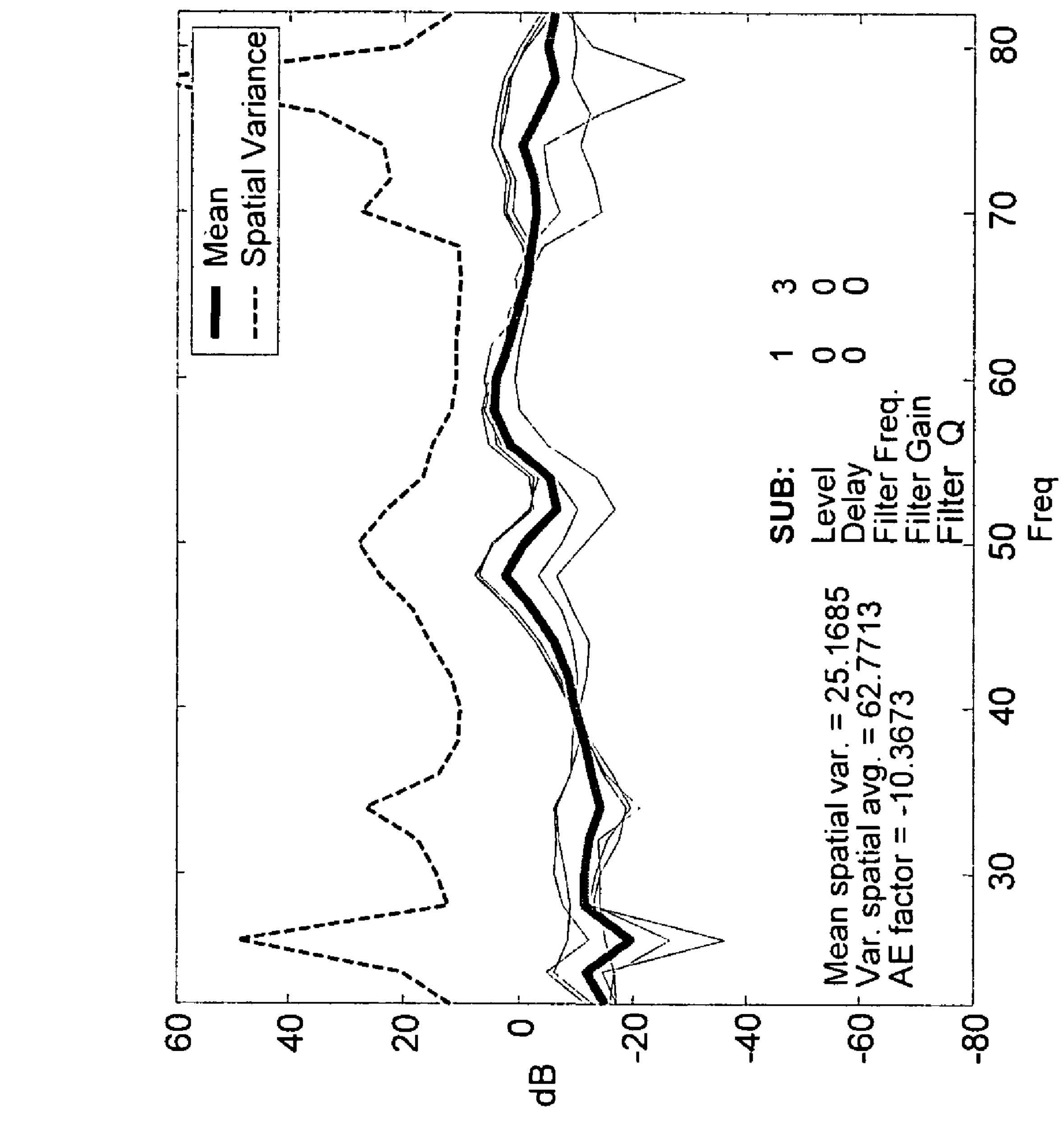
FIG. 31 is a graph of predicted low frequency performance for the engineering listening room in Example 5 without low frequency optimization with the two front corner subwoofers active (subwoofers 1 and 3 shown in FIG. 28).
Figure 32:
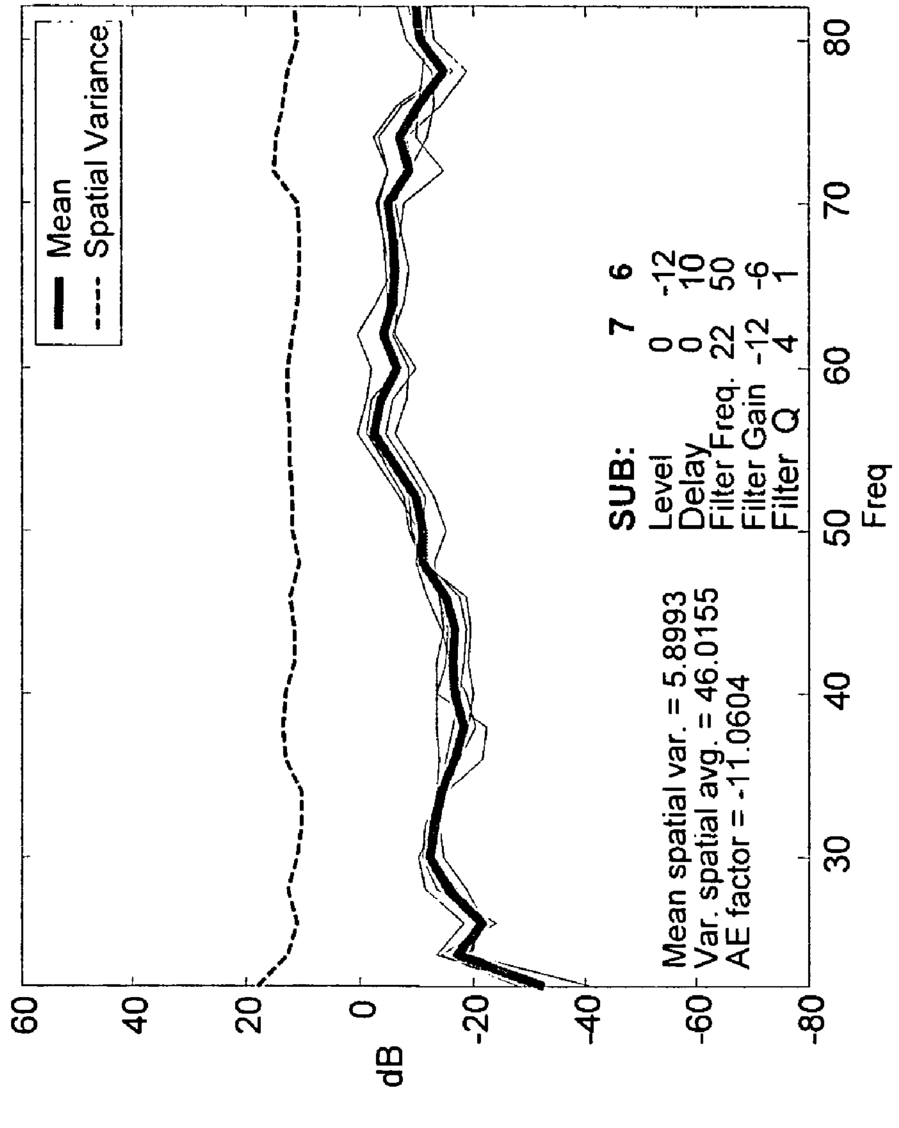
FIG. 32 is a graph of predicted low frequency performance for the engineering listening room in Example 5 with low frequency optimization for two active subwoofers.

FIG. 29 is a graph for the low frequency performance for the common scenario of a single subwoofer in a front corner (subwoofer 1 in FIG. 28). This is compared to a single best subwoofer configuration found by low-frequency analysis in FIG. 30. FIG. 31 is a graph for the low frequency performance for the common "stereo subwoofer" configuration using subwoofers 1 and 3. FIG. 32 is a graph for the performance of a two subwoofer system using low-frequency analysis where the low-frequency analysis is constrained to finding the best solution for a pair of subwoofers. As shown in FIG. 32, the best pair solution uses subwoofers 6 and 7 shown in FIG. 28.

Figure 33:
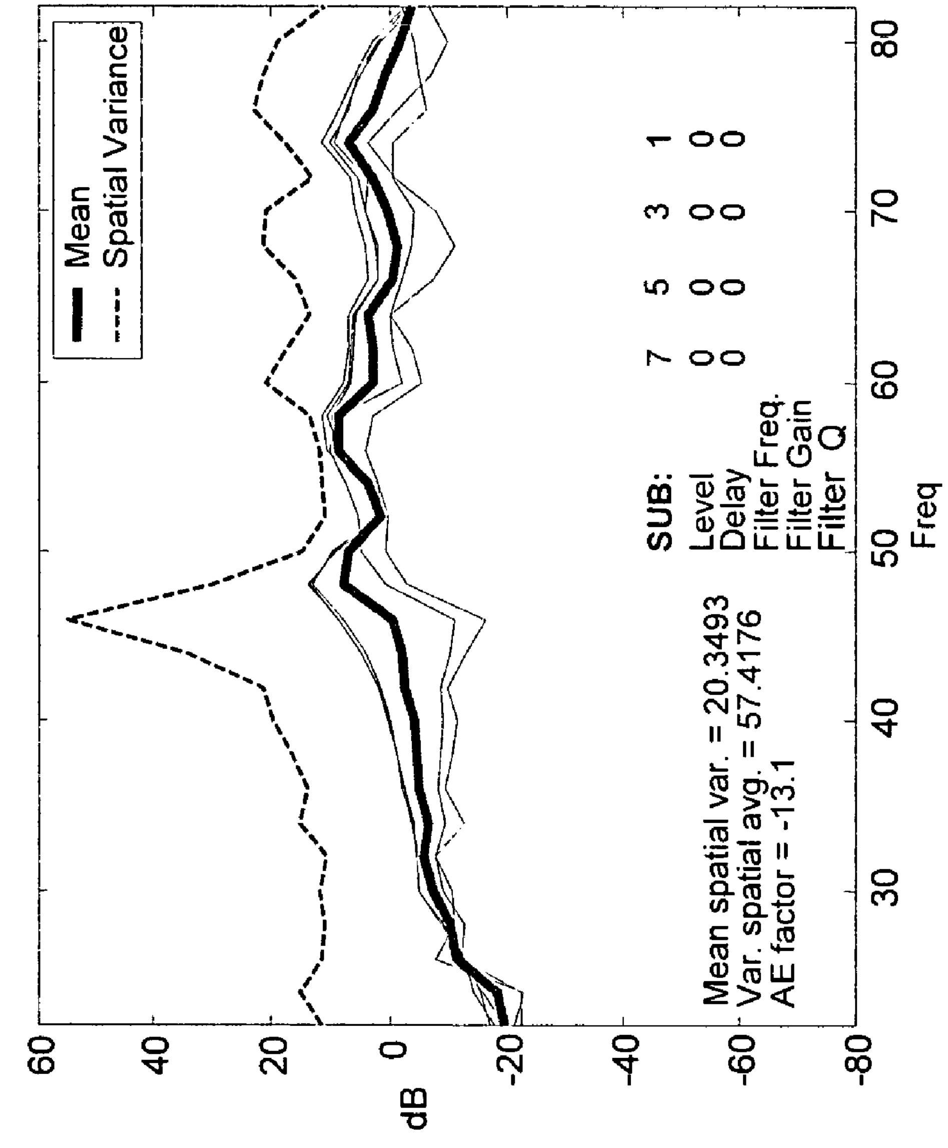
FIG. 33 is a graph of predicted low frequency performance for the engineering listening room in Example 5 without low frequency optimization using a four-corner subwoofer configuration (subwoofers 1, 3, 5, and 7 shown in FIG. 28).
Figure 34:
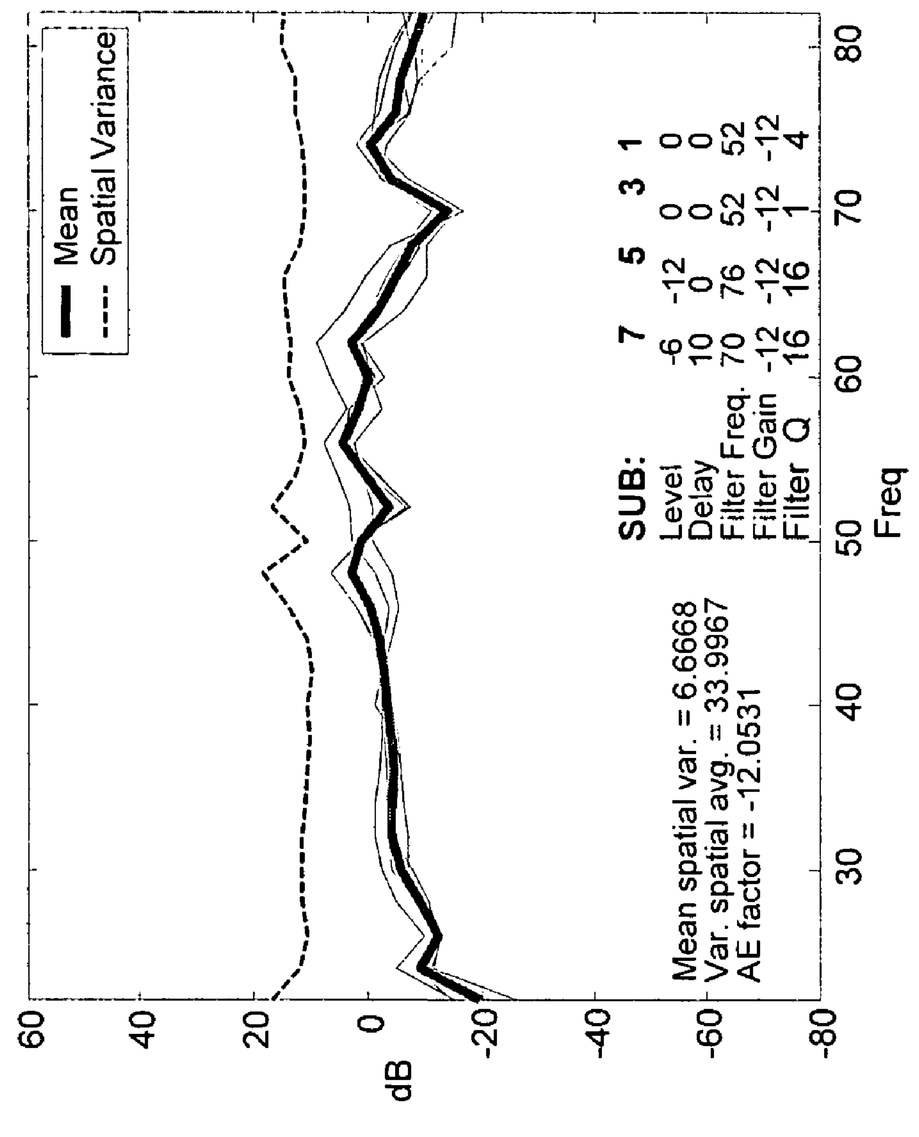
FIG. 34 is a graph of predicted low frequency performance for the engineering listening room in Example 5 with low frequency optimization using a four-corner subwoofer configuration (subwoofers 1, 3, 5, and 7 shown in FIG. 28).
Figure 35:
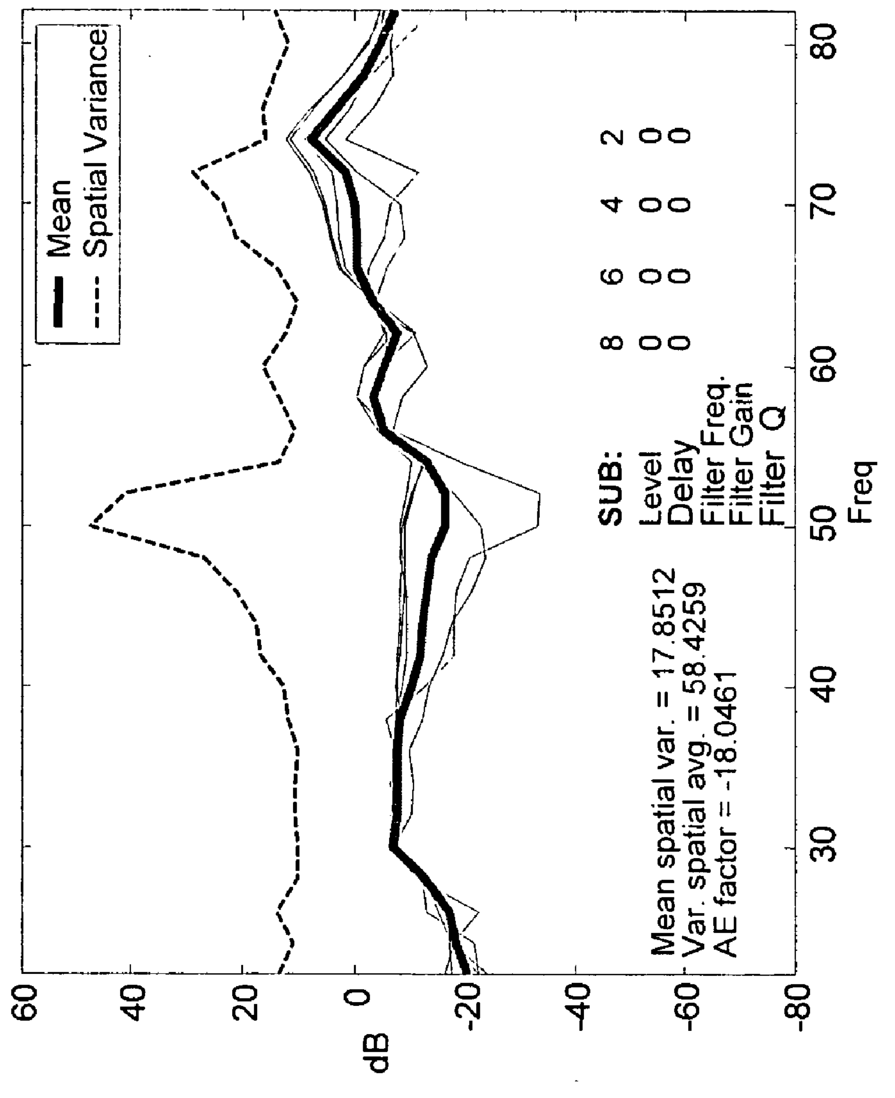
FIG. 35 is a graph of predicted low frequency performance for the engineering listening room in Example 5 without low frequency optimization using a four-midpoint subwoofer configuration (subwoofers 2, 4, 6, and 8 shown in FIG. 28).
Figure 36:
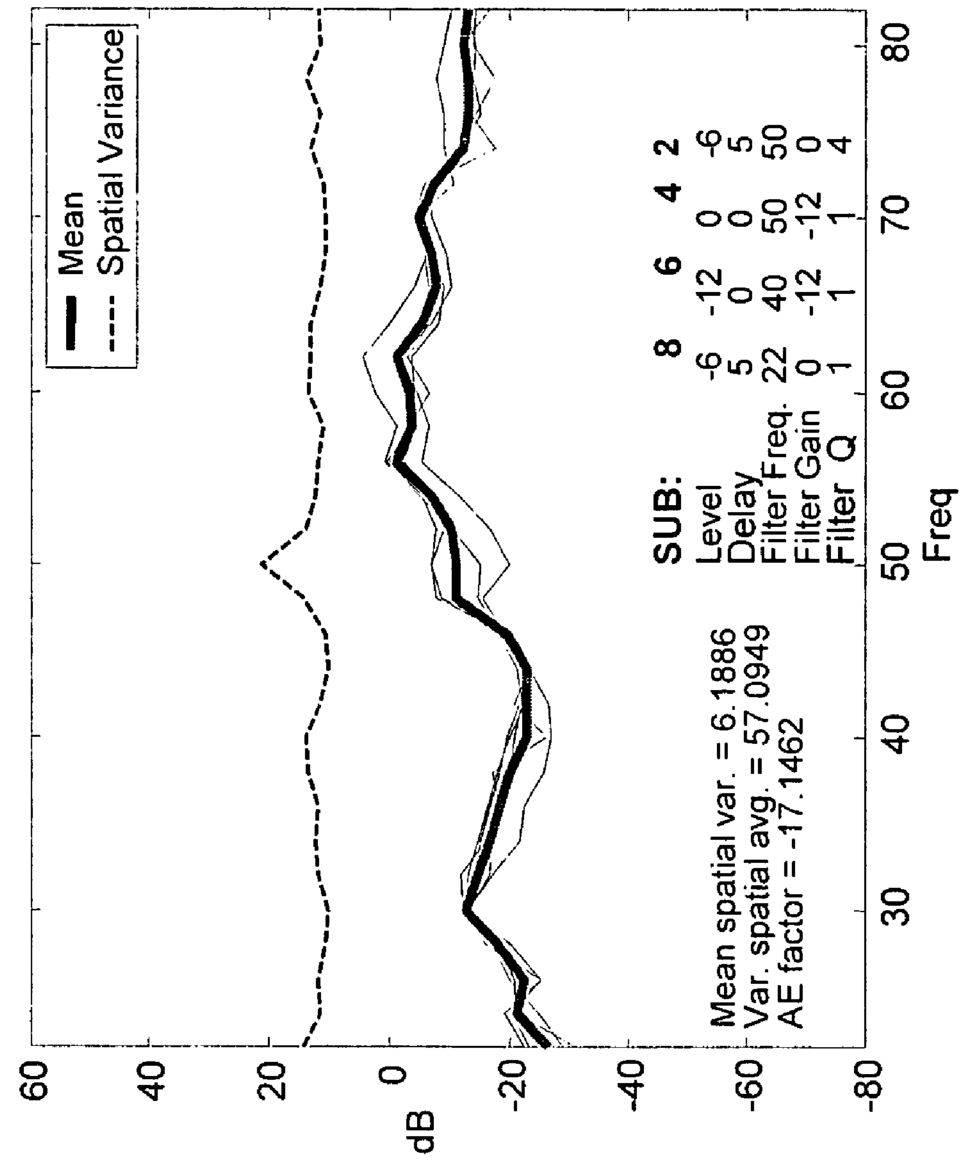
FIG. 36 is a graph of predicted low frequency performance for the engineering listening room in Example 5 with low frequency optimization using a four-midpoint subwoofer configuration (subwoofers 2, 4, 6, and 8 shown in FIG. 28).

FIG. 33 is a graph for the low frequency performance for a four-corner configuration using subwoofers 1, 3, 5, and 7. FIG. 34 is a graph for the performance of the same four subwoofers once low-frequency analysis has been applied. FIG. 35 is a graph for the low frequency performance for a four-midpoint configuration using subwoofers 2, 4, 6, and 8. FIG. 36 is a graph for the low frequency performance of the same four subwoofers once low frequency analysis has been applied.

Figure 37:
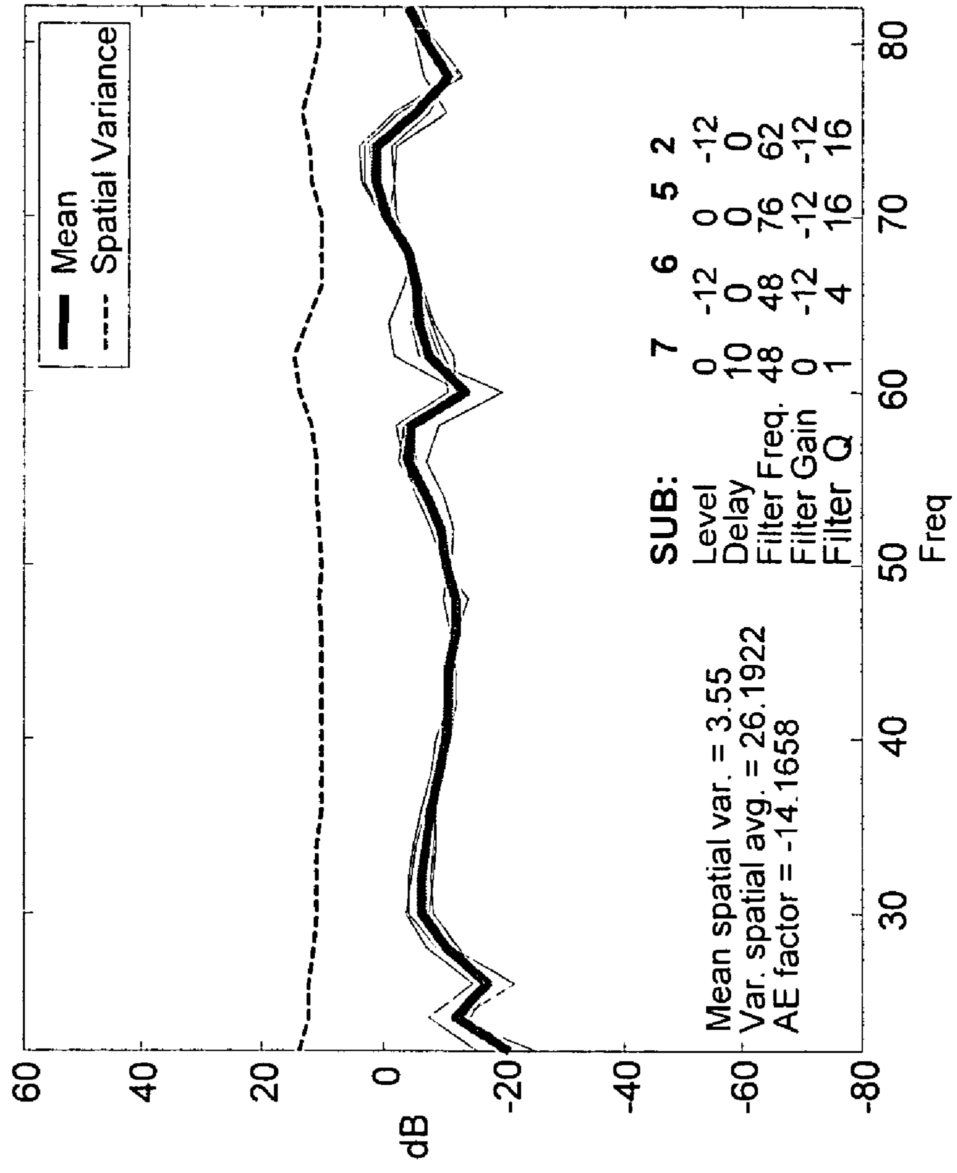
FIG. 37 is a graph of predicted low frequency performance for the engineering listening room in Example 5 with low frequency optimization determining an optimum four-subwoofer configuration based on using spatial variance as the ranking factor (subwoofers 2, 5, 6, and 7 shown in FIG. 28).
Figure 38:
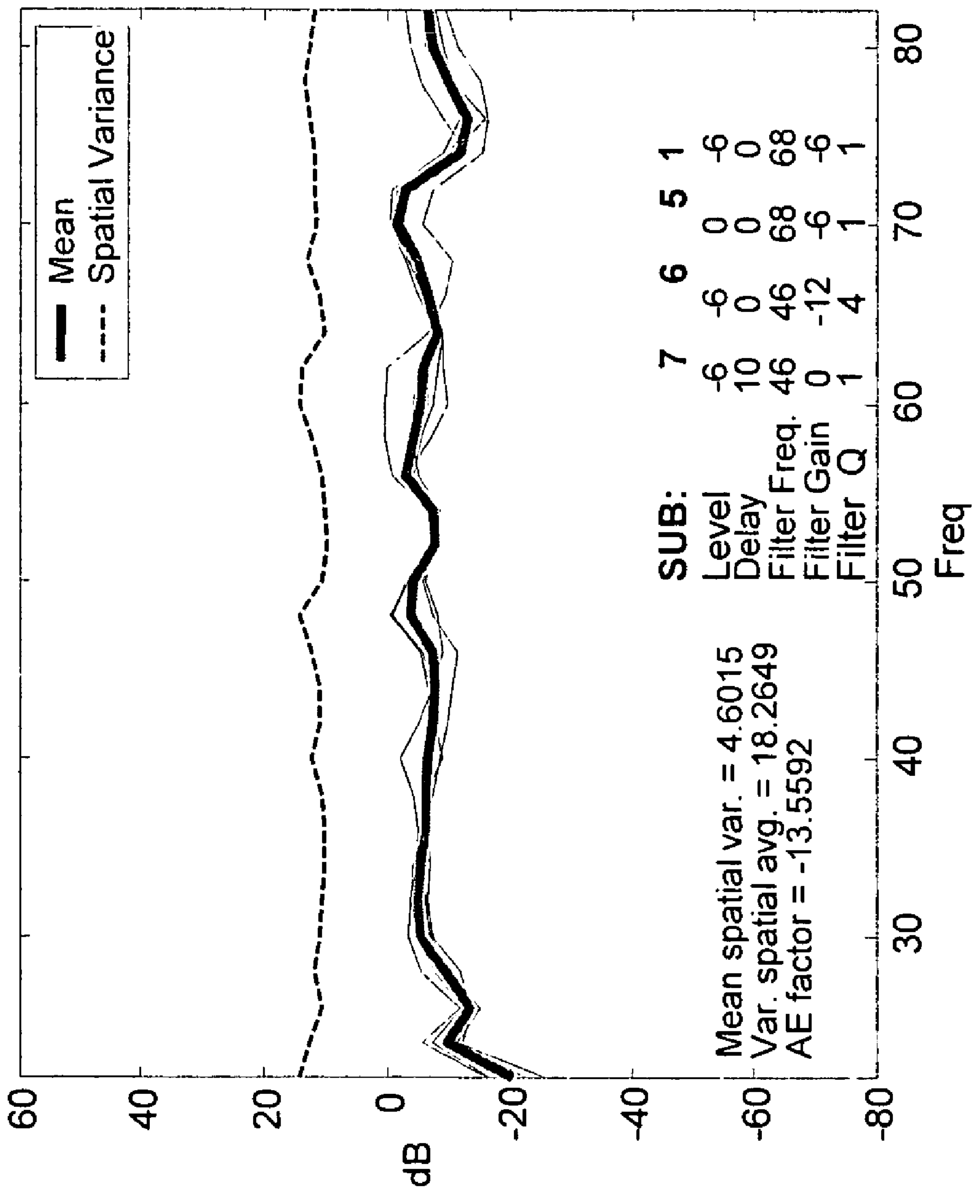
FIG. 38 is a graph of predicted low frequency performance for the engineering listening room in Example 5 with low frequency optimization determining an optimum four-subwoofer configuration based on using spatial variance and variance of the spatial average as the ranking factors (subwoofers 1, 5, 6, and 7 shown in FIG. 28).
Figure 39:
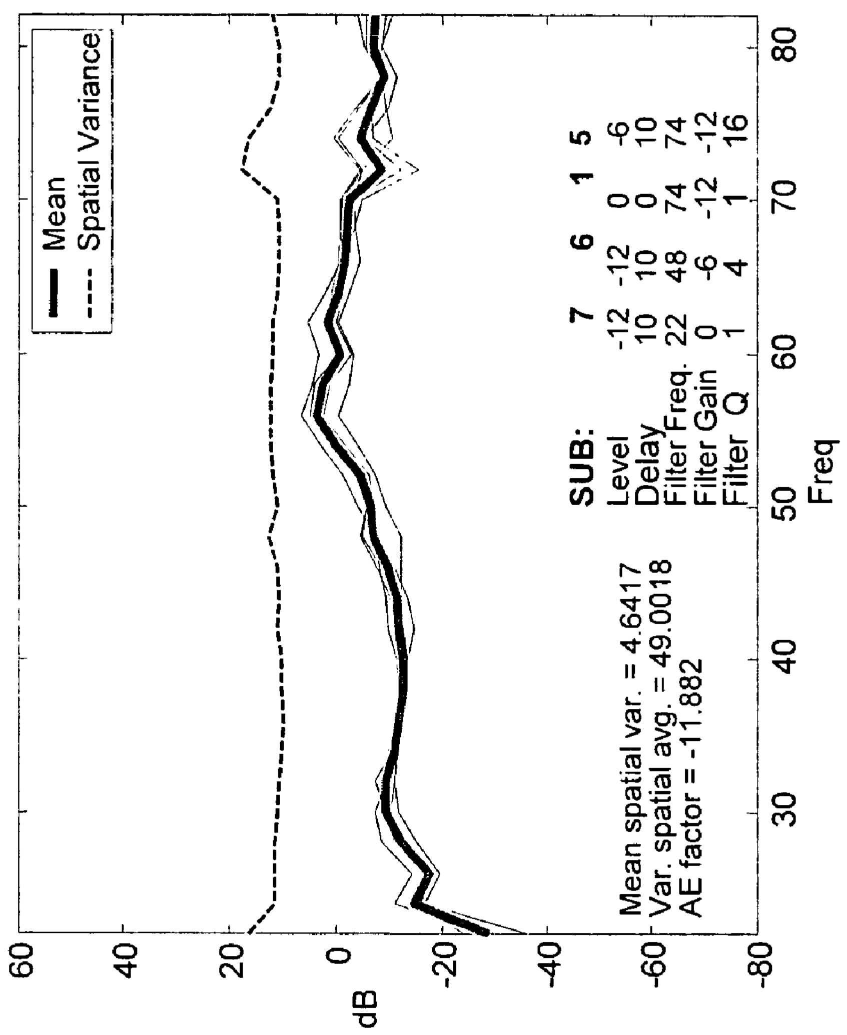
FIG. 39 is a graph of predicted low frequency performance for the engineering listening room in Example 5 with low frequency optimization determining an optimum four-subwoofer configuration based on using spatial variance and acoustic efficiency as the ranking factors (subwoofers 1, 5, 6, and 7 shown in FIG. 28).

FIG. 37 is a graph for the low frequency performance of a four-subwoofer "optimum" configuration. The "optimum" configuration is based on ranking results of the analysis using Spatial Variance as the sole ranking factor. As shown in FIG. 37, the "optimum" four-subwoofer configuration includes subwoofers placed at positions 2, 5, 6, and 7. Further, the "optimum" configuration shown in FIG. 37 includes correction factors for each of the subwoofers. Similarly, FIGS. 38 and 39 show the low frequency performance of other four-subwoofer "optimum" configurations. The "optimum" configurations in FIGS. 38 and 39 are based on ranking results of the analysis using mean spatial variance and variance of the spatial average, and mean spatial variance and acoustic efficiency, respectively.

Figure 40:
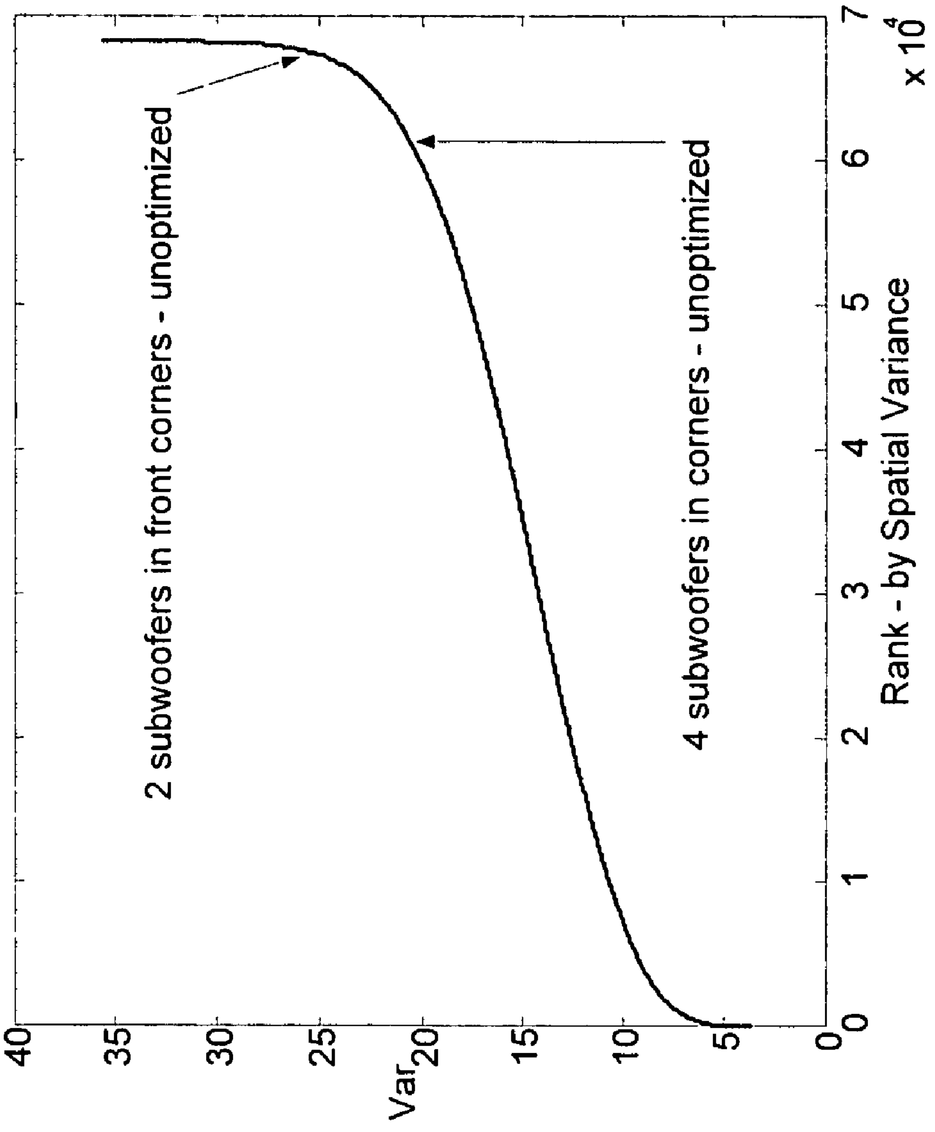
FIG. 40 is a graph ranking the solutions by spatial variance for the low frequency performance in FIGS. 29-39.

FIG. 40 shows the mean spatial variance for all the simulated configurations investigated for the engineering room in Example 5. The points in FIG. 40 where the typical "stereo subwoofer" and "four corner" configurations fall on the plot have been highlighted.

Table 5 compares the low frequency performance of all the configurations simulated in Example 5.

TABLE 5

| Active Subwoofers | Low-frequency analysis (yes/no) | Mean Spatial Variance | Variance of the spatial average | Acoustic Efficiency |
|---|---|---|---|---|
| 1 | No | 25.9 dB | 52.4 dB | −7.9 dB |
| 7 | Yes | 15.9 dB | 40.25 dB | −6.6 dB |
| 1, 3 | No | 25.2 dB | 62.8 dB | −10.4 dB |
| 6, 7 | Yes | 5.9 dB | 46.0 dB | −11.0 dB |
| 1, 3, 5, 7 | No | 20.3 dB | 57.4 dB | −13.1 dB |
| 1, 3, 5, 7 | Yes | 6.7 dB | 34.0 dB | −12.1 dB |
| 2, 4, 6, 8 | No | 17.9 dB | 58.4 dB | −18.0 dB |
| 2, 4, 6, 8 | Yes | 6.2 dB | 57.1 dB | −17.1 dB |
| 2, 5, 6, 7 | Yes | 3.6 dB | 26.2 dB | −14.2 dB |
| 1, 5, 6, 7 | Yes | 4.6 dB | 18.3 dB | −13.5 dB |
| 1, 5, 6, 7 | Yes | 4.6 dB | 49.0 dB | −11.9 dB |

Examining the results in Table 5, low-frequency analysis may improve the low-frequency performance of the sound system when using the parameters of position of the subwoofers and/or correction factors. Comparing FIGS. 29 and 30, which constrains the number of subwoofers to one, low frequency performance was improved using low-frequency analysis. The analysis suggested a location for the subwoofer (location 7), resulting in decreasing the mean spatial variance and the variance of the spatial average, and increasing the acoustic efficiency.

Comparing FIGS. 31 and 32, which constrains the number of subwoofers to two, low frequency performance was again improved using low-frequency analysis. The analysis suggested locations for the subwoofers (locations 6 and 7) and correction factors, resulting in decreasing the mean spatial variance and the variance of the spatial average, and a slight decrease in the acoustic efficiency.

Comparing FIGS. 33 and 34, which constrains the number and the position of the subwoofers (i.e., a subwoofer in each corner of the room), the low-frequency performance was improved using the low-frequency analysis. The analysis suggested correction factors, resulting in decreasing the mean spatial variance and variance of the spatial average, and increasing the acoustic efficiency. Comparing FIGS. 35 and 36, which constrains the number and the position of the subwoofers (i.e., a subwoofer in the four-midpoints of the room), the low-frequency performance was improved using the low-frequency analysis. The analysis suggested correction factors, resulting in decreasing the mean spatial variance and variance of the spatial average, and increasing the acoustic efficiency.

There are several criteria by which to rank solutions generated by the low-frequency analysis. Ranking may be based on spatial variance, variance of the spatial average, acoustic efficiency, or any combination thereof. FIGS. 36-38, each of which constrain the number of subwoofers to four, illustrate examples of selecting positions for the subwoofers and correction factors based on various types of ranking criteria. FIG. 36 ranks the solutions solely based on spatial variance, so that its preferred solution has the lowest spatial variance. FIG. 37 ranks the solutions based on a combination of spatial variance and variance of the spatial average, so that its preferred solution selects different subwoofer locations, has a higher spatial variance, and has a lower variance of the spatial average than the preferred solution in FIG. 36. FIG. 38 ranks the solutions based on a combination of spatial variance and acoustic efficiency, so that its preferred solution selects different subwoofer locations, has a higher spatial variance, and has a higher acoustic efficiency than the preferred solution in FIG. 36.

Figure 41:
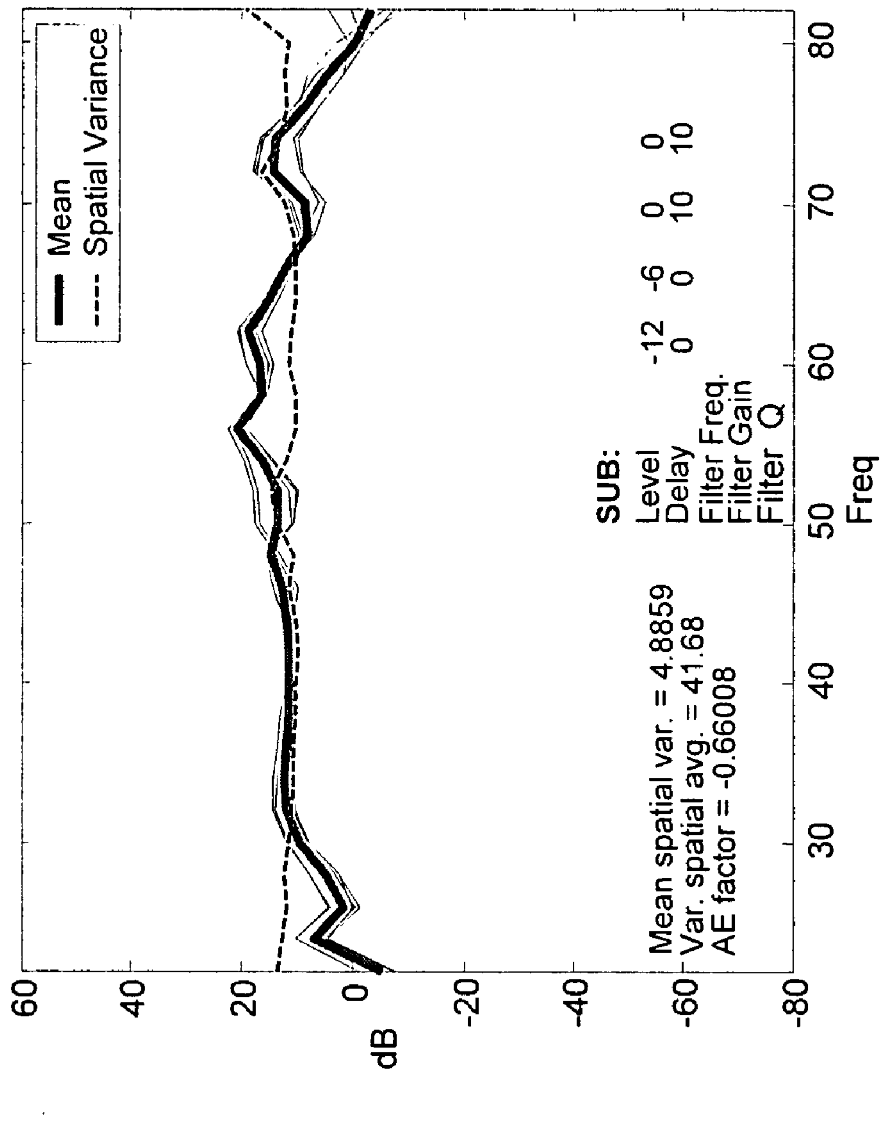
FIG. 41 is a graph of predicted low frequency performance for the engineering listening room in Example 5 using four-corner subwoofer configuration (subwoofers 1, 3, 5, and 7 shown in FIG. 28) with gain and delay being optimized.
Figure 42:
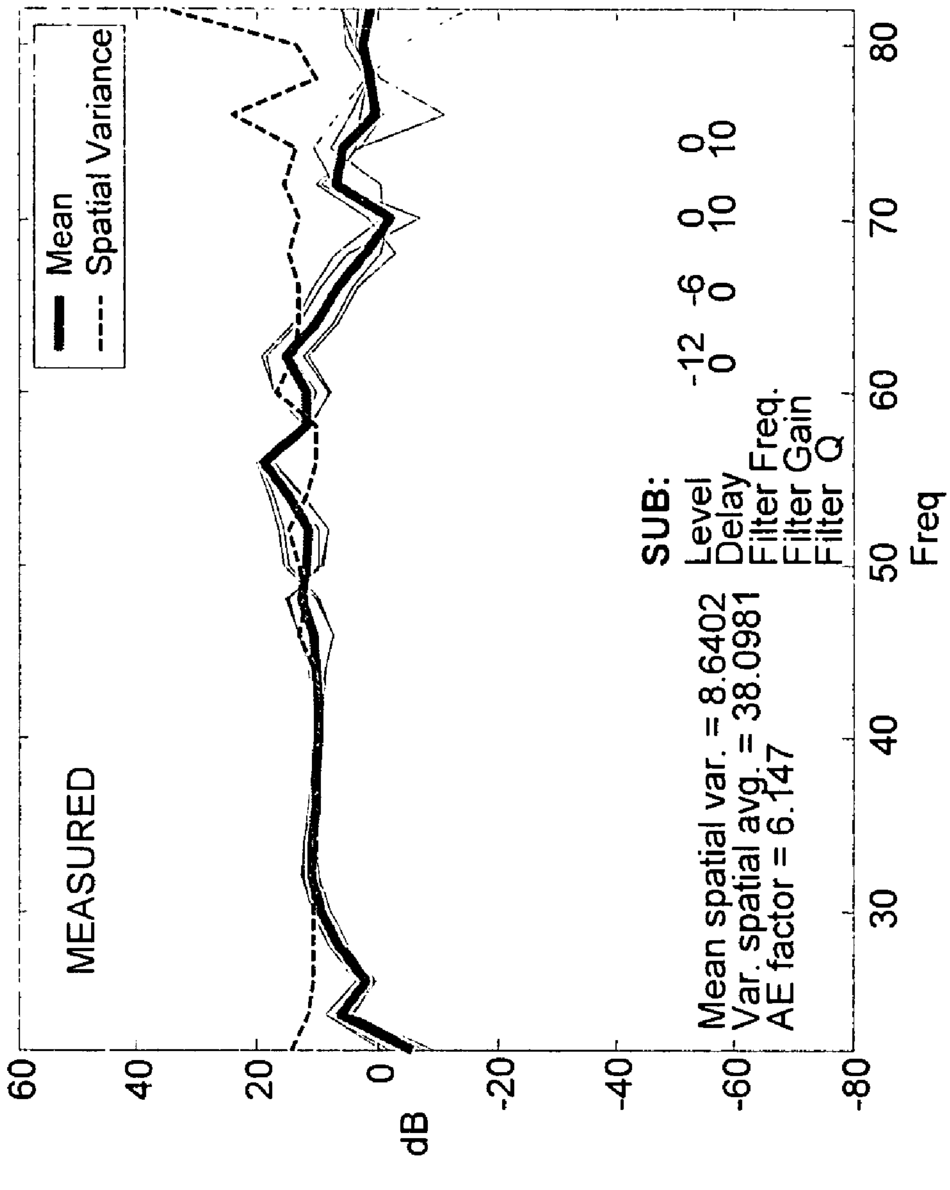
FIG. 42 is a graph of measured low frequency performance for the engineering listening room in Example 5 using four-corner subwoofer configuration (subwoofers 1, 3, 5, and 7 shown in FIG. 28) with gain and delay being optimized.

FIG. 41 shows the predicted low frequency performance of a typical four-corner subwoofer configuration using low-frequency analysis, focusing on optimizing amplitude and delay correction factors. FIG. 42 is the actual low frequency performance after optimization. Comparing FIGS. 41 and 42, agreement between the predicated and actual performance below 70 Hz is excellent. Thus, there is substantial agreement between performance predicted by low-frequency analysis and actual performance.

Example 6

Figure 43:
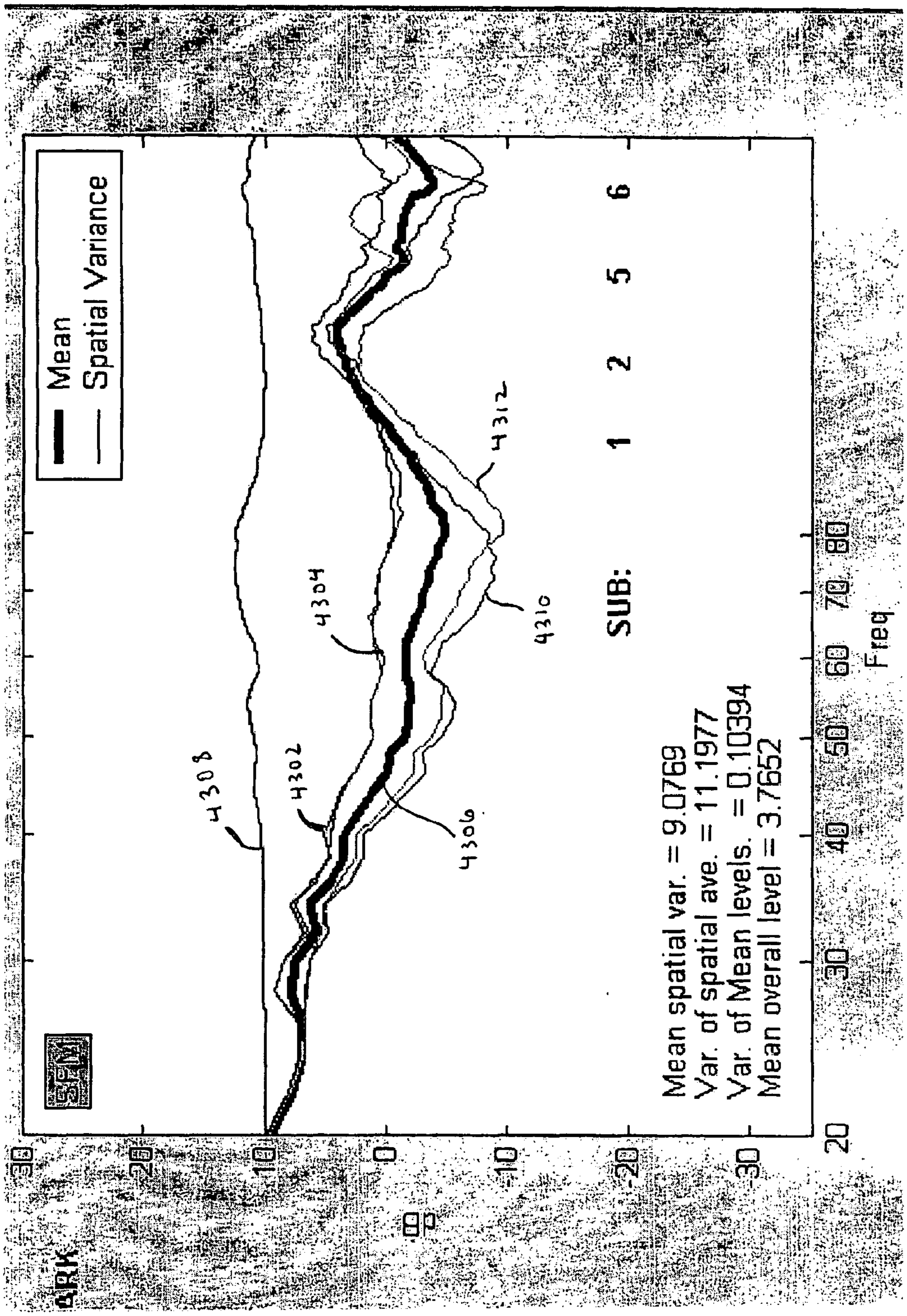
FIG. 43 is a graph of a predicted low frequency response in a typical sedan automobile with speakers in the front doors and the rear deck speakers driven "equally".

As discussed above, the teachings in the present application may be applied to a sound system in any type of space, including a vehicle. Examples of vehicles include, but are not limited to, automobiles and trucks. One of the problems when "tuning" a vehicle, such as an automobile, is getting consistent bass in the front and back row seats. The sixth example of application of the analysis is using a sedan automobile. FIG. 43 shows a graph of the frequency response for an automobile from 20-200 Hz with speakers low in the front doors and on the rear deck. The curves labeled 4302 and 4304 are the frequency responses for the front two seats. The curves labeled 4310 and 4312 are the frequency responses for two back seats. The heavy black curve, labeled 4306, is the average response in all four seats and the light black curve, labeled 4308, is the spatial variance. As shown in FIG. 43, the back row has about 7 dB less bass for a full octave centered at 75 Hz.

Figure 44:
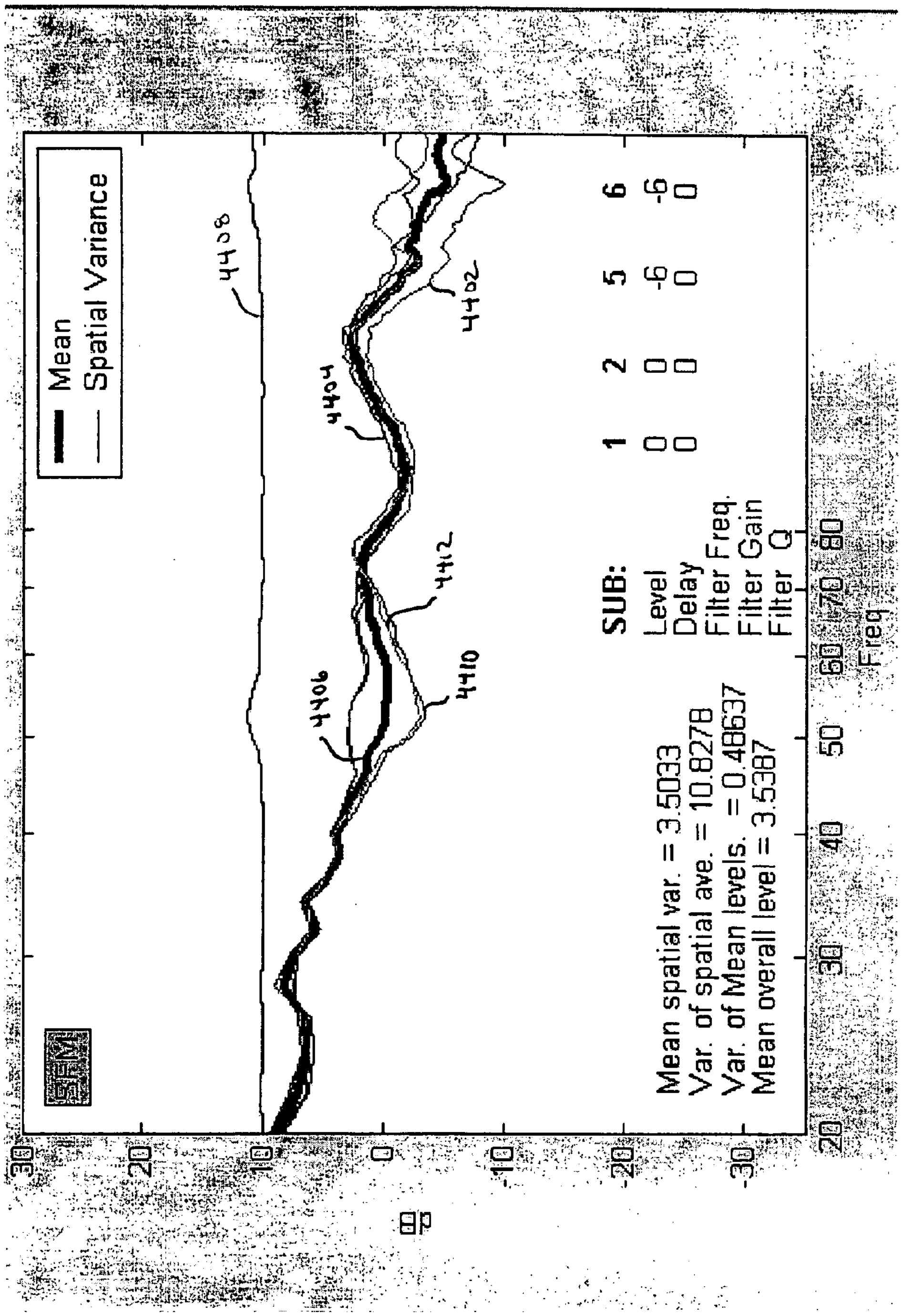
FIG. 44 is a graph of a predicted low frequency response in a typical sedan automobile with speakers in the front doors and the rear deck optimized using sound field management.

Referring to FIG. 44, there is shown a graph of a frequency response In FIG. 44 we have reduced the drive level to the rear deck speakers by 6 dB (shown in FIG. 44 as −6 in the row marked Level). The curves labeled 4402 and 4404 are the frequency responses for the front two seats. The curves labeled 4410 and 4412 are the frequency responses for two back seats. The heavy black curve, labeled 4406, is the average response in all four seats and the light black curve, labeled 4408, is the spatial variance. As shown in FIG. 44, the frequency response is more consistent in the bass region than FIG. 43. The maximum difference from front to back row of the vehicle is now approximately 5 dB and covers only one half of an octave. This is a marked improvement over what was achieved with "equal drive" shown in FIG. 43. The spatial variance is also improved (from 9.0769 to 3.5033). The mean overall level in the low frequencies has dropped by about 0.2 dB, but this is with approximately 2.5 dB less drive. Efficiency at the listening locations has improved by nearly 2.3 dB, which is a significant improvement. Also, the average frequency response is improved. This is consistent with the above-disclosure directed to home theater set-ups. Specifically, frequency response and efficiency tend to improve as seat-to-seat variation decreases. FIG. 44 shows parameters such as level (in dB), delay (in mSec), and equalization (including filter freq. (in Hz), filter gain (in dB) and filter Q). As shown in FIG. 44, with this speaker arrangement, optimizing delay and equalization of the individual speakers did not significantly improve seat-to-seat variation.

Figure 45:
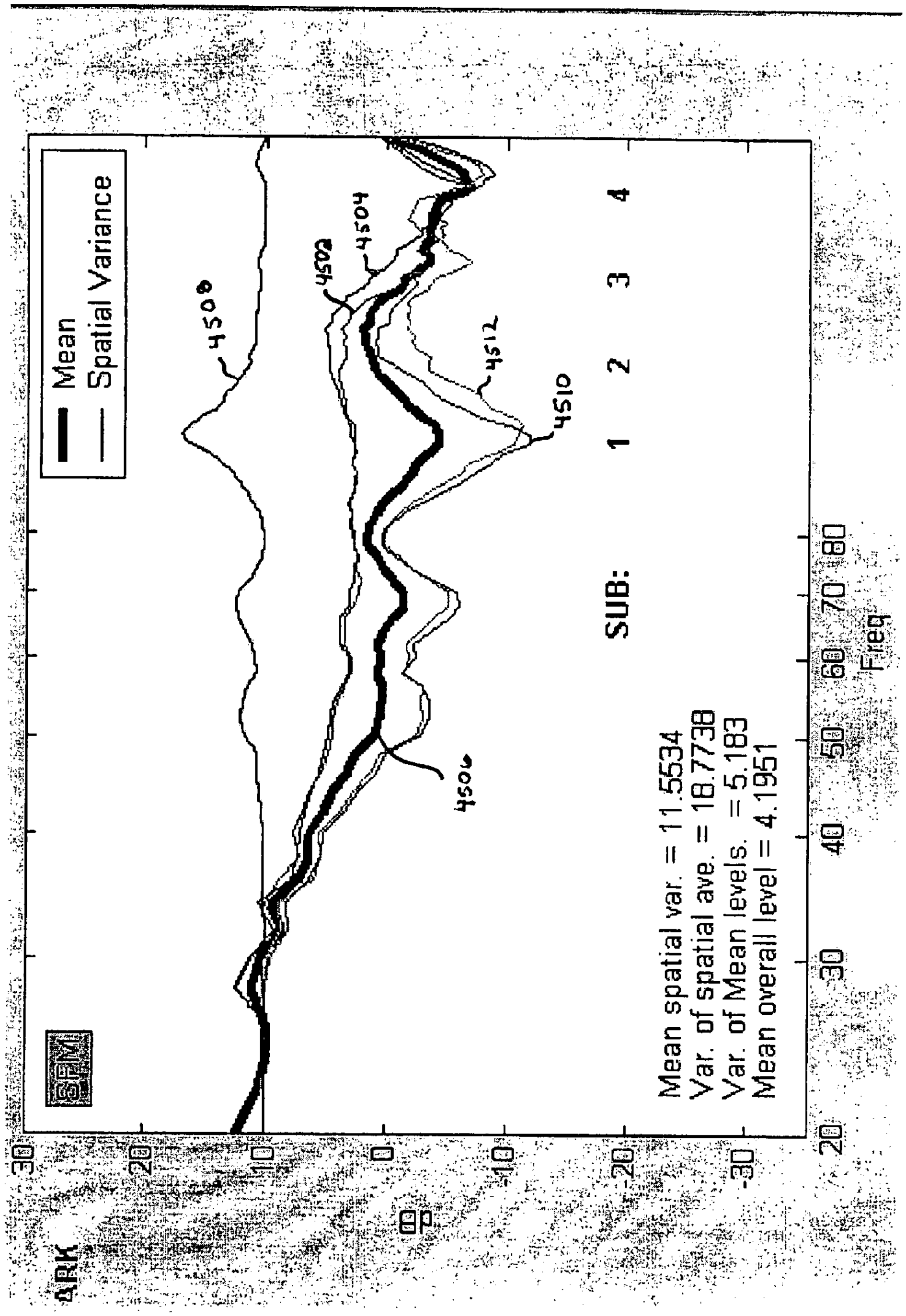
FIG. 45 is a graph of a predicted low frequency response in a typical sedan automobile with speakers in all four doors and the rear deck speakers driven "equally".
Figure 46:
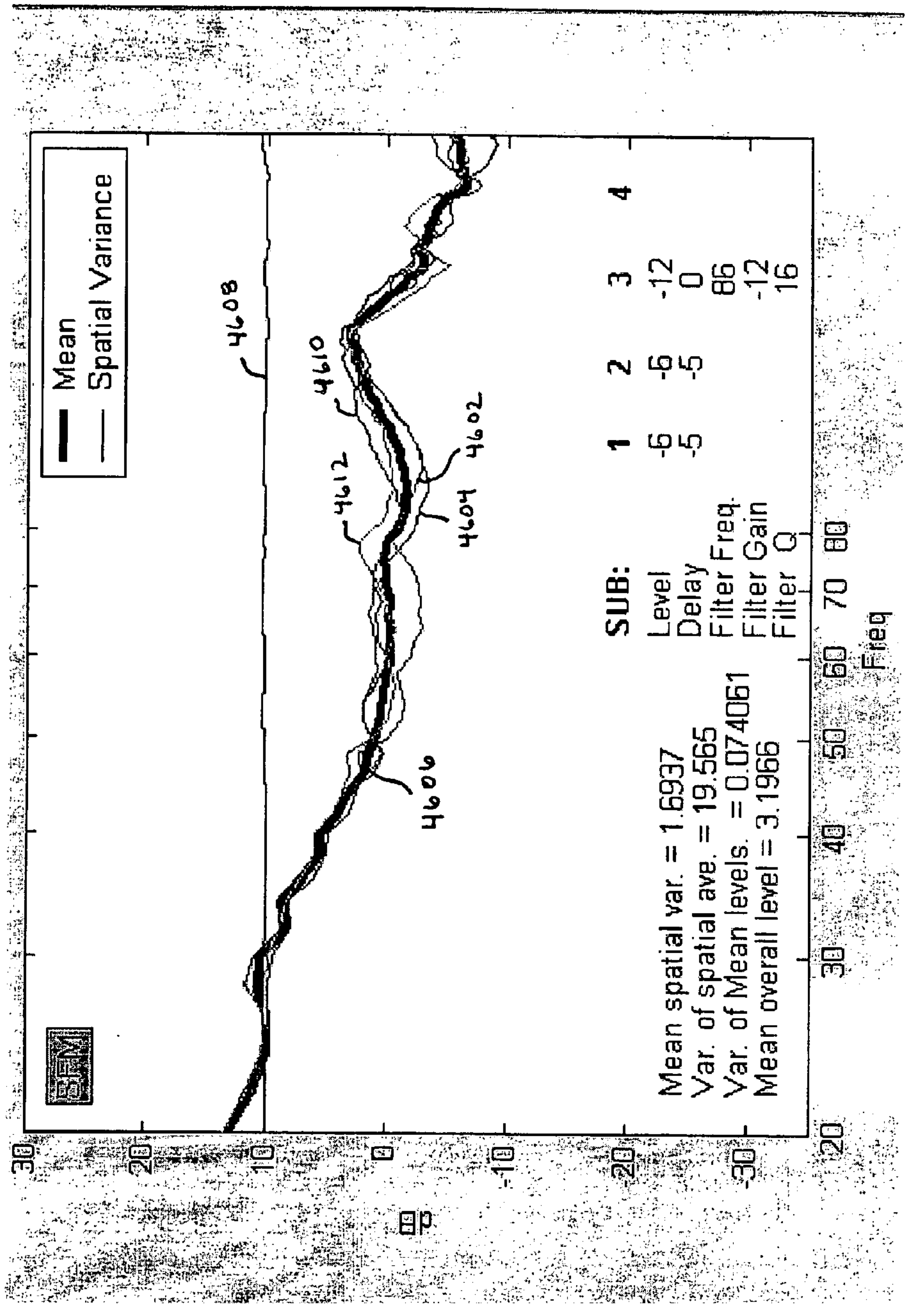
FIG. 46 is a graph of a predicted low frequency response in a typical sedan with speakers in all four doors and the rear deck optimized using sound field management.

The car used for FIGS. 43 and 44 has speakers low in the front doors and on the rear deck. However, systems with speakers in each of the four doors and on the rear deck are becoming more common even in less expensive automobiles. Using this system configuration, an additional pair of speakers was placed low in the rear doors with the optimization routine being run again. FIG. 45 shows the performance of the system before optimization. As shown in FIG. 45, the curves labeled 4502 and 4504 are the frequency responses for the front two seats, the curves labeled 4510 and 4512 are the frequency responses for two back seats, the heavy black curve, labeled 4506, is the average response in all four seats, and the light black curve, labeled 4508, is the spatial variance. FIG. 46 shows the performance of the system after optimization. As shown in FIG. 46, the curves labeled 4602 and 4604 are the frequency responses for the front two seats, the curves labeled 4610 and 4612 are the frequency responses for two back seats, the heavy black curve, labeled 4606, is the average response in all four seats, and the light black curve, labeled 4608, is the spatial variance. Seat-to-seat variation has been reduced dramatically (see flatter spatial variance in FIG. 46 as compared to FIG. 45), and frequency response is flatter at each seat. The overall output at low frequencies has been reduced by 1 dB, but this is with approximately 6 dB less overall drive level, i.e.; system efficiency has improved by approximately 5 dB.

Example 7

Figure 47:
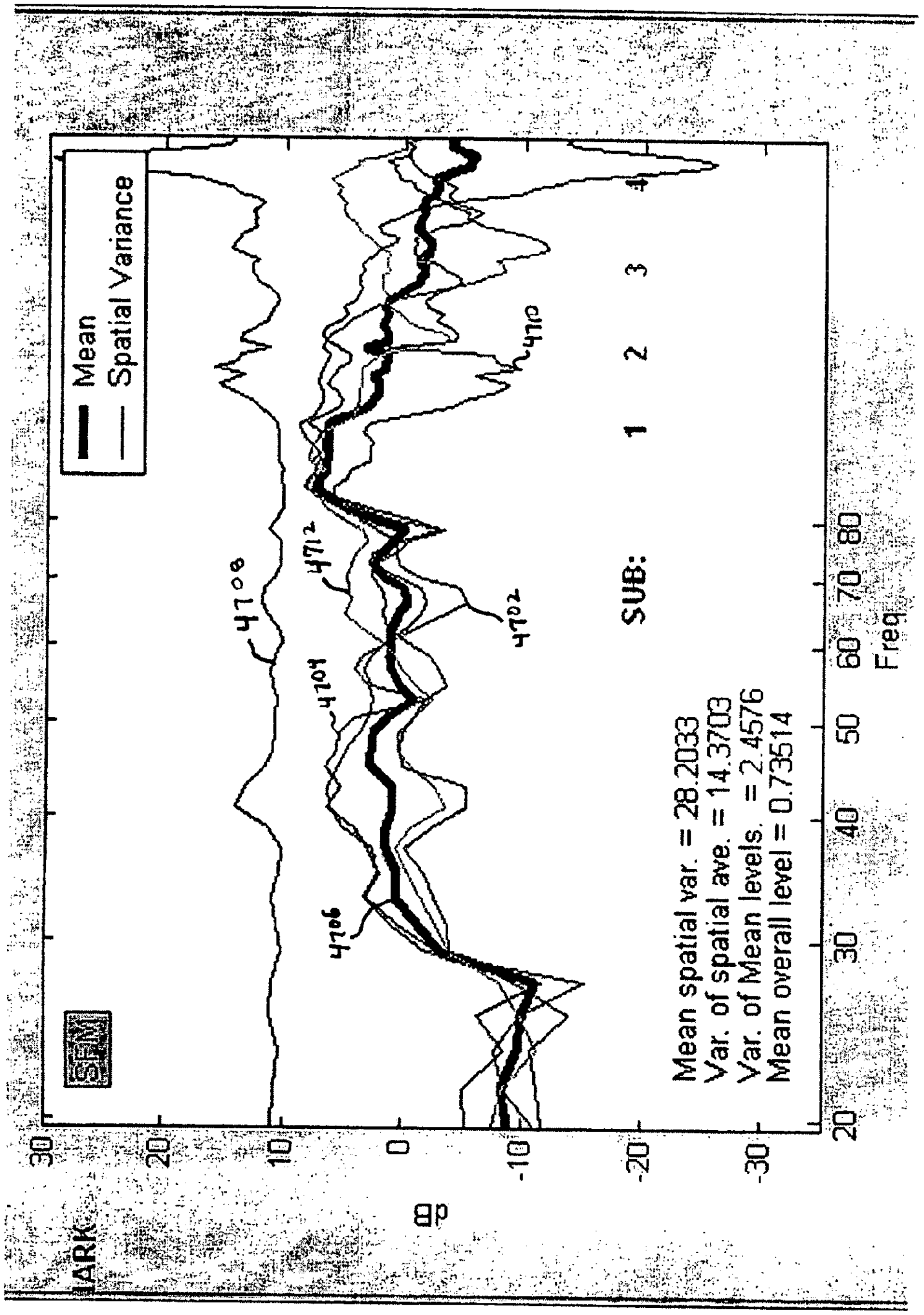
FIG. 47 is a graph of a predicted low frequency response of a Sport Utility Vehicle (SUV) "benchmark" set up.

In addition to the sound system in a sedan vehicle, sound systems in other types of vehicles, such as Sport Utility Vehicles (SUV) may use the optimization routine. The seventh example of application of the analysis is using an SUV. The audio system in the SUV had 4 main speakers and a single subwoofer. To create a "benchmark," a high pass filter was used for the main speakers at approximately 50 Hz. High pass filters may be used to reduce low frequency signals in order to: (1) reduce the likelihood of the doors rattling (since the main speakers are mounted in the door; and (2) reduce the likelihood that the speakers operate outside its preferred operating range which may cause audible distortion or damage the speaker. Also, to create a benchmark, a low pass filter was used for the subwoofer at 250 Hz. The electrical gain of each channel was set to the same value. The performance of this benchmark is detailed in FIG. 47. As shown in FIG. 47, the curves labeled 4702 and 4704 are the frequency responses for the front two seats, the curves labeled 4710 and 4712 are the frequency responses for two back seats, the heavy black curve, labeled 4706, is the average response in all four seats, and the light black curve, labeled 4708, is the spatial variance.

The optimization routine was run, yielding the following parameters:

TABLE 6

| Sub | LF | RF | LR | RR | SUB |
|---|---|---|---|---|---|
| Drive Level (dB) | −6 | −6 | −6 | 0 | −12 |
| Delay (msec) | 5 | 0 | 0 | 0 | 10 |
| Filter Freq. (Hz) | 39.06 | 193.35 | 78.12 | 39.06 | 183.59 |
| Filter Gain (dB) | −12 | −12 | −12 | −12 | −12 |
| Filter Q | 1 | 16 | 4 | 16 | 16 |

Figure 48:
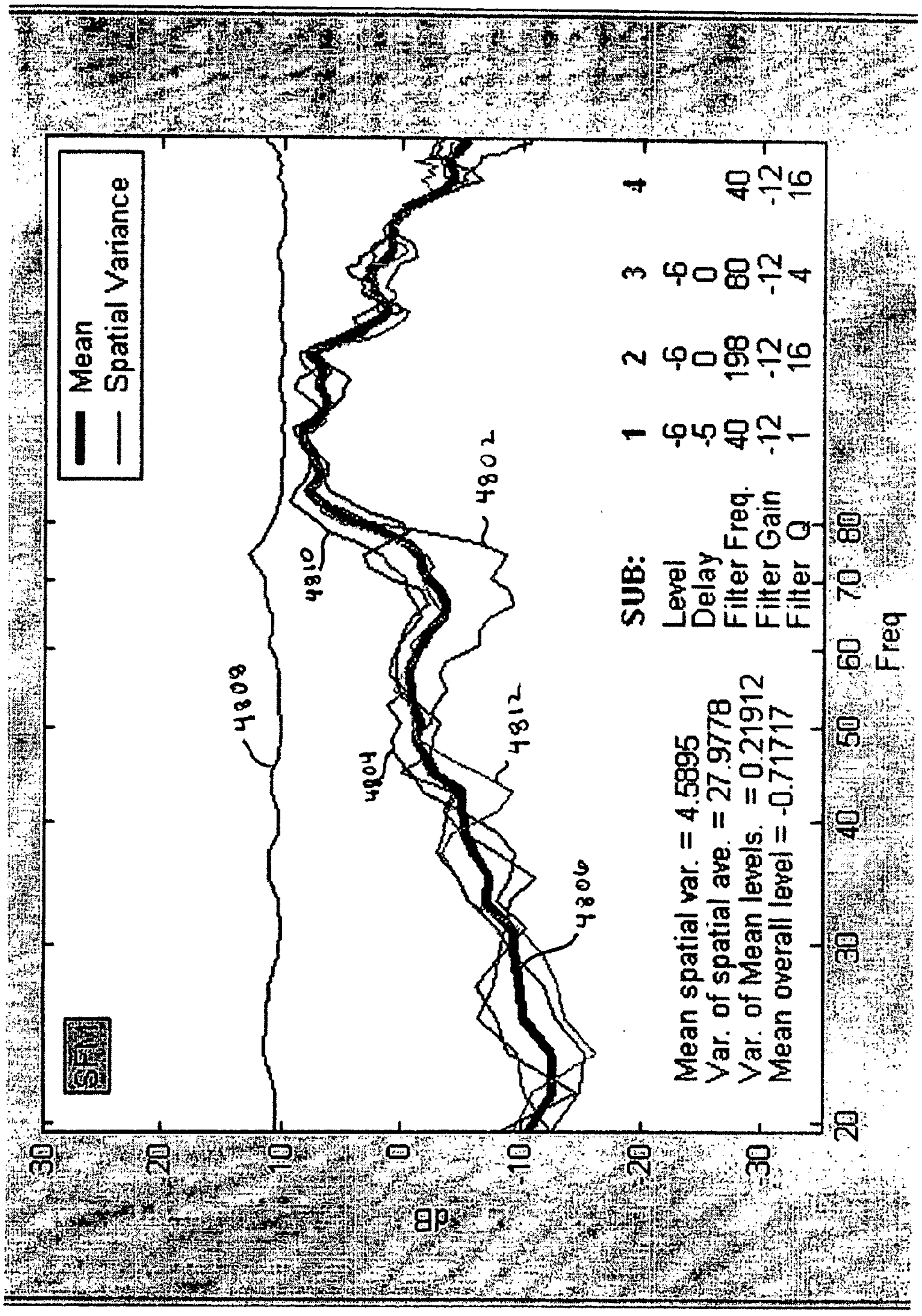
FIG. 48 is a graph of a predicted low frequency response of an SUV after optimizing using sound field management.

Performance with these parameters is presented in FIG. 48. As shown in FIG. 48, the curves labeled 4802 and 4804 are the frequency responses for the front two seats, the curves labeled 4810 and 4812 are the frequency responses for two back seats, the heavy black curve, labeled 4806, is the average response in all four seats, and the light black curve, labeled 4808, is the spatial variance. FIG. 48 shows the parameters for sub 1 (left front (LF)), sub 2 (right front (RF)), sub 3 (left rear (LR)), and sub 4 (right rear (RF)). The parameters for the subwoofer are not show in FIG. 48, but are shown in the table above. As shown in FIGS. 47 and 48, the seat-to-seat variation has been reduced by a factor of 6 (see mean spatial variance reduced by approximately a factor of 6 from 28.2033 to 4.5895) and the frequency response is significantly flatter. Moreover, efficiency has improved by approximately 3.5 dB.

Figure 49:
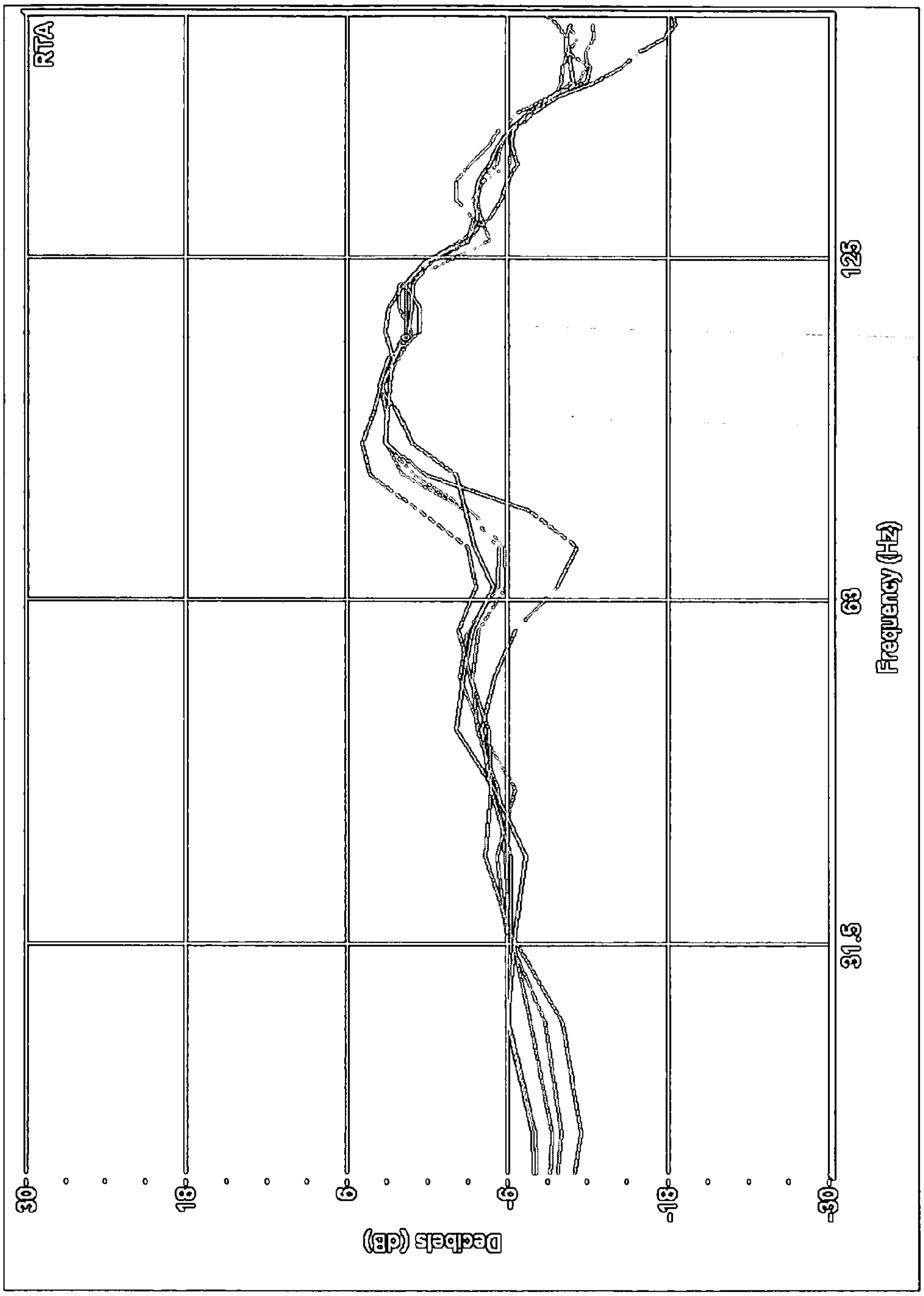
FIG. 49 is a graph of an actual frequency response using a single microphone at each seat for the SUV in FIG. 47.
Figure 50:
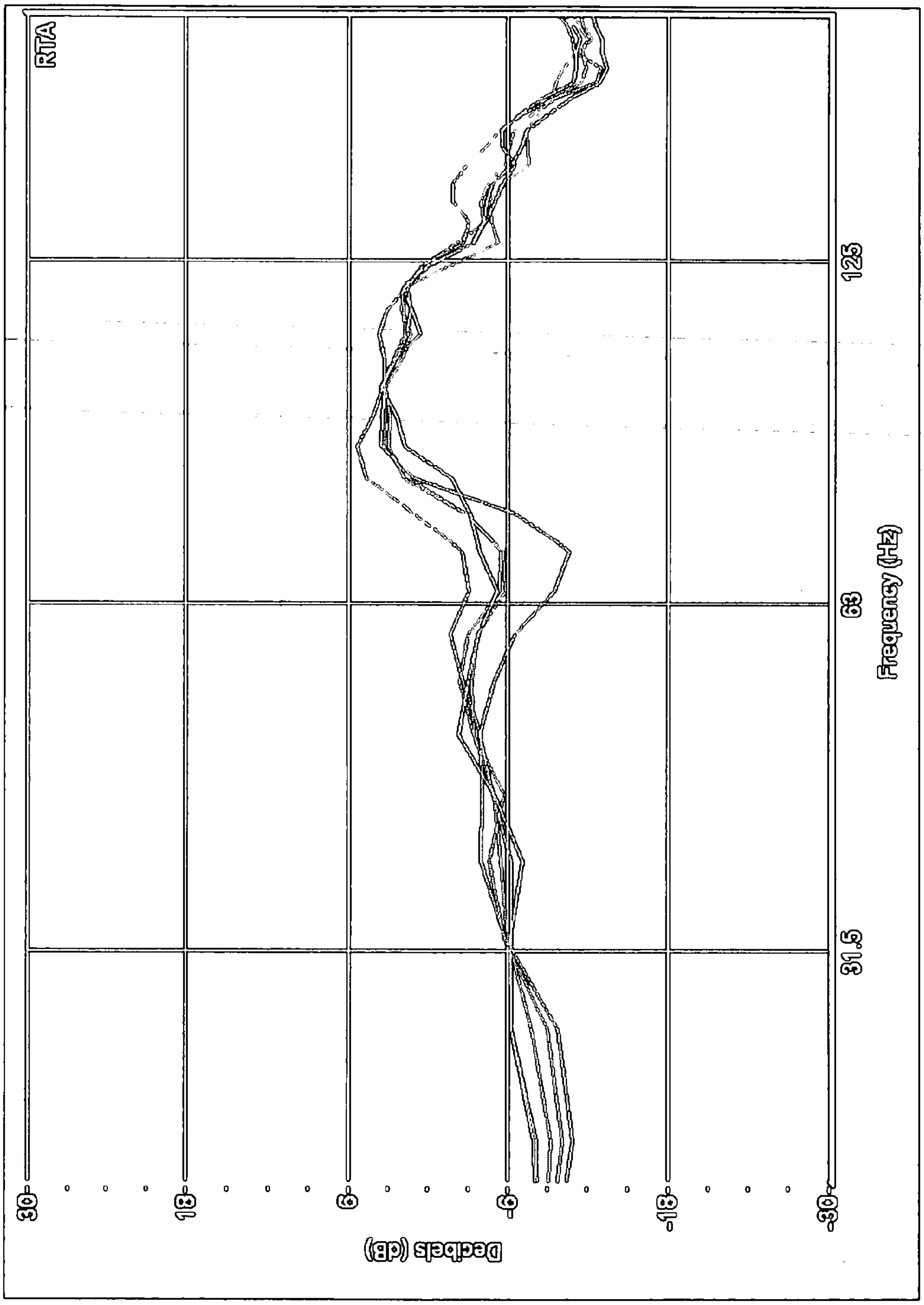
FIG. 50 is a graph of an actual frequency response using the microphone array at each seat for the SUV in FIG. 47.

Referring to FIG. 49, there is shown the actual frequency response using a single microphone at each listening position. As discussed above, the acoustic signals (such as the frequency response) received at the listening positions may be measured using a single microphone at one, some or all of the potential listening positions. (FIG. 48 is the predicted response from the raw measured data). FIG. 50 is a graph of the response of the typical microphone array (as opposed to a single microphone as used in FIG. 49) at each listening position in the vehicle. The results shown in FIGS. 49 and 50 are consistent with the above disclosure regarding home theaters. Specifically, the methodology may improve or optimize system performance over a listening area, not just at the discrete microphone locations.

As discussed above, one approach to improving the frequency response of the system is to (1) modify the configuration of one, some or all of the channels so that the frequency responses for the various listening positions improve based on at least one metric (such as flatness, consistency, efficiency, smoothness, etc.); and (2) globally improve the frequency responses for the various listening positions. For example, one approach is to (1) reduce the variation (e.g., reduce the spatial variance) of the frequency responses across a multitude of listening positions by selecting a configuration for the audio system (such as by selecting correction factors (gain, delay, equalization), position of speakers, types of speakers, number of speakers, etc.); and (2) once the frequency responses across the multitude of listening positions are more consistent, apply global correction to the system (such as global equalization) in order to improve the systems performance as a whole (such as flatten the frequency responses for the multitude of listening positions. Merely attempting a global correction of the system as a whole, without attempting to reduce the variation of the frequency responses across the listening positions, may improve the response of the system at discrete points (such as a particular listening position), but may not improve (or may worsen) the frequency response at other points.

Using a two-pronged correction methodology (correction of the individual channel level and correction on the global level) allows for a more improved response across a listening area. Moreover, even if using correction factors on the individual channel level improves the consistency of the responses for the various listening positions (e.g., the spatial variance for the various listening positions is reduced), but does not significantly improve the frequency responses (e.g., the frequency responses for the various listening positions still has peaks and valleys), since the frequency responses of the various listening positions are more consistent, the global correction may globally improve the frequency responses for the listening area.

Figure 51:
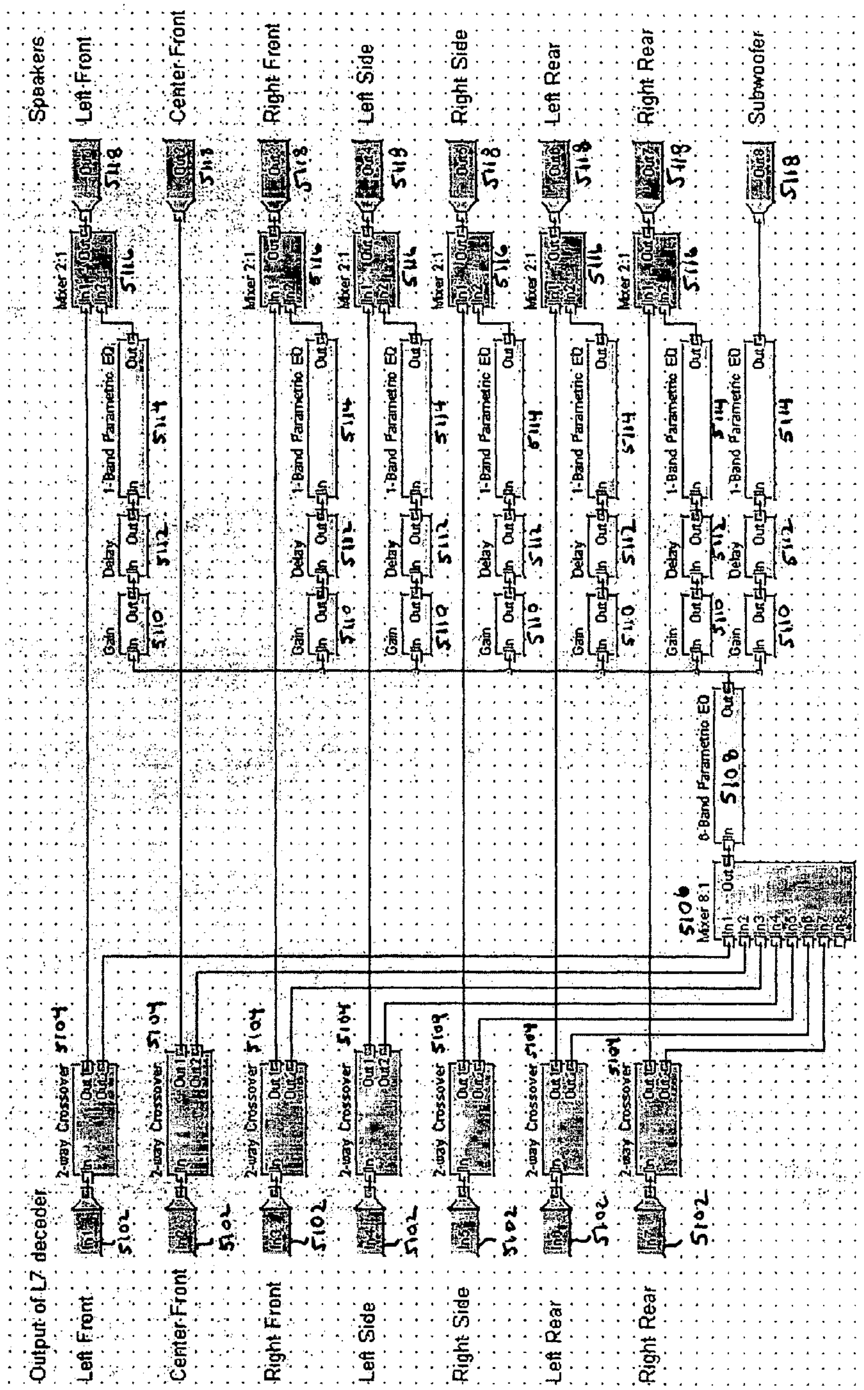
FIG. 51 is a block diagram for a 7-channel sound system configuration which may be improved or optimized.

Referring to FIG. 51, there is shown a block diagram for a sound system configuration which may be improved or optimized using the methodology disclosed in the present application. FIG. 51 shows a 7-channel system, with left front, center front, right front, left side, right side, left rear, and right rear channels. Using inputs 5102, the seven channels may be input to a plurality of 2-way crossovers 5104. A crossover may include a high-pass filter and a low-pass filter, with the outputs of the crossover comprising the outputs of the high-pass filter and a low-pass filter. For example, Out1 of the 2-way crossover 5104 may comprise the output for the high-pass filter, and Out2 of the 2-way crossover 5104 may comprise the output for the low-pass filter. The 2-way crossover may be set such that gross seat-to-seat variance in the low frequency range can be addressed with the sound field management concepts, including the correction factors. The crossover can thus be chosen such that the correction factors (e.g., as gain, delay, and equalization) do not degrade timbre and spatial performance in a range of frequencies, such as the midrange. The outputs of the low-pass filter (Out2), which may represent the bass from all the channels, may be sent to mixer 5106. Mixer 5106 may then sum the outputs into a single channel. The sum of the outputs may be improved or optimized, and redistributed to the various channels.

FIG. 51 shows an example of the two-pronged approach where the audio system includes correction of at least one of the individual channels and global correction. As shown in FIG. 51, the output of mixer 5106 is globally equalized, using a 6-band parametric equalization 5108. Though a 6-band equalizer is shown, an equalizer with a fewer or greater number of bands may be used. Further, other types of equalizers may be used. The output of the 6-band parametric equalization 5108 may be input to the individual channels. As shown in FIG. 51, each of the channels may have correction factors, such as a gain block 5110, delay block 5112, and parametric equalization block 5114. A single band equalization block may be used. Alternatively, a multiple band equalization block may be used. While FIG. 51 shows a sequence of a gain block 5110, a delay block 5112, and a parametric equalization block 5114, the blocks merely provide an example configuration. The blocks may be in any sequence. Further, one, some or all of the channels may include correction factors. As shown in FIG. 51, the center front channel does not include any correction factors. In some audio configurations, the center front speaker is in the front dashboard and does not have bass capability (so that the dashboard does not vibrate). In those instances, lower frequencies may be filtered from the channel. Further, the channels may include one, some or all of the correction factors.

As shown in FIG. 51, the outputs of the correction factor or factors may be input to a mixer 5116. The mixer 5116 may sum the high and low frequencies for the various channels, and send them to outputs 5118 for the various channels. As shown in FIG. 51, the audio system includes a subwoofer, which receives a low frequency output as well. The low frequency signal for the subwoofer, similar to other channels, may be optimized using correction factors.

Using the sound field management parameters (including the correction factors) may reduce overall output of the audio system, but it may not reduce total efficiency. In fact, efficiency may improve using the sound field management parameters. Since most amp power and speaker excursion is needed for bass reproduction, channels that get attenuated by the sound field management parameters could have smaller amps and/or shorter voice coils. For example, the total audio system can be made to play louder for a given amount of total amp power and cone-excursion since having 6 (or 7) equal amps driving the 6 (or 7) main speakers (all of which have similar total cone excursions) is not optimum from an efficiency standpoint.

Further, once the front and back seats of the vehicle are more consistent, one may globally equalize the frequency responses for the front seats, and assume that the frequency responses for the back seats will improve as well. In effect, one approach is to focus on improving the responses for the front seats, and the back seats may “come along for the ride”. This will make both the front and back sound better since the front seat performance will never have to be compromised to solve gross problems in the back.

Figure 52:
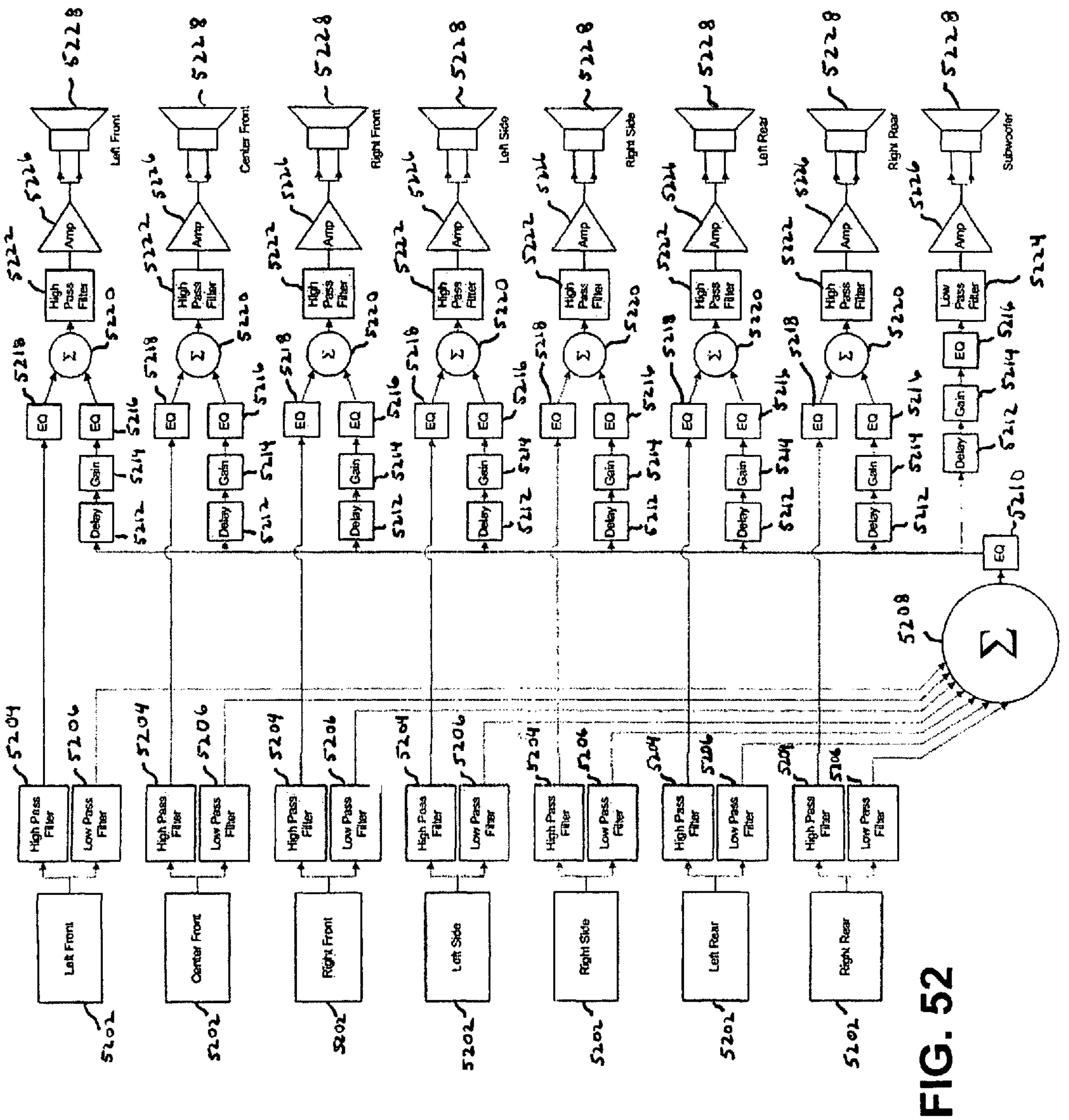
FIG. 52 is another block diagram for a 7-channel sound system configuration which may be improved or optimized.

Referring to FIG. 52, there is shown a block diagram for a sound system configuration which may be improved or optimized using the methodology disclosed in the present application. Once parameters for an audio system are selected, other audio systems may be configured based on the selected parameters. For example, in the vehicle context, once parameters are selected for a particular vehicle, such as a particular model, audio systems installed in the particular vehicle may be configured (e.g., programmed) with the parameters without the need to re-test the vehicle. Specifically, production-line vehicles do not necessarily need to be re-tested, but rather can be programmed with the parameters for the audio system previously determined during testing.

FIG. 52 shows a 7-channel audio system. However, fewer or greater audio channels may be used. The seven channels may be left front, center front, right front, left side, right side, left rear, and right rear. The inputs to the seven channels are shown at block 5202. The seven channels may be sent to a high pass filter 5204 and a low pass filter 5206. Similar to the 2-way crossover in FIG. 51, the high pass filter 5204 and a low pass filter 5206 may filter the incoming signal into two different frequency bands. Though only a high pass filter and a low pass filter are shown for each of the channels, more than two filters may be implemented to have greater than two frequency bands. The outputs of the low pass filters 5206 may be sent to a summation block 5208. One example of a summation block may comprise a mixer, as shown in FIG. 51. The output of the summation block 5208 may be sent to an equalizer 5210. The equalizer 5210 may include global equalization of the summed low frequency signal. As discussed above, global equalization may comprise applying one or more filters. The output of the equalizer 5210 may be sent to the correction factors for the various channels.

As shown in FIG. 52, the correction factors may include delay block 5212, a gain block 5214, and an equalization block 5216. As discussed above, the sequence of blocks is merely for illustrative purposes. As discussed above, using the methodology disclosed, the correction factors for the individual channels may be selected to improve at least one metric for the audio system, such as to reduce the seat-to-seat variation in the frequency responses. Further, equalization may be applied to the higher frequency band, as shown at equalization block 5218. For example, equalization block 5218 may focus on attempting to equalize a certain frequency range, such as the mid-range frequencies. The outputs of the high and low frequencies may be sent to a summation block 5220, thereby combining the frequencies. The output of summation block 5220 may be sent to a filter. As shown in FIG. 52, the filter for the seven channels is high pass filter 5222. As shown in FIG. 52, the high pass filter is included for seven of the speakers. However, fewer high pass filters, or other filters may be used. As discussed above, the high pass filters may be used in an audio system, such as a vehicle audio system to reduce door rattle and reduce the chance that the speakers operate outside its preferred operating range, which may cause audible distortion or may damage the speaker. Similarly, a low pass filter 5224 may be included for the signal to the subwoofer. As in the high pass filter, the low pass filter may reduce the chance that the subwoofer operates outside its preferred range, such as at too high a frequency range. Thus, as a general matter, filters may be selected so that the speakers associated with the filter have better performance. Moreover, FIG. 52 shows an audio system with seven main speakers and one subwoofer. Fewer or greater main speakers may be used. Moreover, zero or more than one subwoofers may be used.

As discussed above, several parameters may be varied in order to select an improved or optimum audio configuration. Examples of the parameters include, without limitation, the position of the loudspeakers, the number of loudspeakers, the type of loudspeakers, the listening positions, the correction factors (e.g., delay, parametric equalization, frequency independent gain), etc. Typically, in a vehicle, the position of the loudspeakers is set. However, there are instances where the positions of the loudspeakers may vary (e.g., a slight repositioning of the speaker in the door, the rear deck, etc.).

In addition to these parameters, a crossover filter, such as a high pass, a low pass, a notch filter, or a combination of such filters may filter the signal for one, some or all of the speakers. Specifically, crossover filter 5222, 5224 may provide an additional degree of freedom by which the performance of at least one metric of the audio system may be improved. For example, if seat-to-seat variation is of importance, the filters (such as low pass, high pass, notch, or other types of filters) may be another parameter through which the seat-to-seat variation is improved. As discussed above, the transfer functions may be measured for one, some or all of the listening positions. A statistical analysis may then be performed using potential values for parameters, such as potential values for the filters, of the system to generate predicted transfer functions. The statistical analysis may indicate which potential value(s) of the filters improve the metric. Any statistical analyses discussed herein may be used including, without limitation, (1) consistency of the predicted transfer functions across the multiple listening positions (e.g., mean spatial variance, mean spatial standard deviation, mean spatial envelope (i.e., min and max), and mean spatial maximum average; (2) flatness of the predicted transfer functions (e.g., variance of spatial average, standard deviation of the spatial average, envelope of the spatial average, and variance of the spatial minimum); (3) differences in overall sound pressure level from seat to seat for the predicted transfer functions (e.g., variance of mean levels, standard deviation of mean levels, envelope of mean levels, and maximum average of mean levels); (4) efficiency of the predicted transfer functions at a single listening position or multiple listening positions (e.g., acoustic efficiency); and (5) output of predicted transfer functions at the single listening position or the multiple listening positions. For example, one statistical analysis examines seat-to-seat variation. The actual values for the crossover filters may then be selected, either directly from the potential values for the filters which exhibit improvement of the metric, or derived from those potential values of the filters. The selected values for the crossover filters may then be used in an audio system, such as an audio system for a vehicle.

Merely for illustrative purposes, potential values for high pass filters may include values for the 3 dB point (e.g., 50 Hz, 70 Hz, or 100 Hz) and/or the order of the filter ($1^{st}$, $2^{nd}$, or $3^{rd}$ order). Other potential values for the filters may be used. In the illustrative example, nine potential filters may be analyzed for the statistical analysis. Similarly, potential values for low pass filter may vary based on the 3 dB point (e.g., 100 Hz, 140 Hz, or 200 Hz) and/or the order of the filter ($2^{nd}$, $3^{rd}$, or $4^{th}$ order). Again, the potential values for the filters are merely for illustrative purposes. Other potential values for the filters may be used, or other types of filters may be used.

The statistical analysis may analyze the potential filters, such as the potential high pass and low pass filters, based on at least one metric (such as seat to seat variation) in order to determine which potential filter is selected.

The outputs of filters 5222 and 5224 are sent to amplifiers 5226. The outputs of the amplifiers are then sent to the respective speakers 5228, including left front, center front, right front, left side, right side, left rear, right rear, and subwoofer.

In the above examples, spatial variance was significantly improved using the low-frequency analysis. The improvement in spatial variance ranged from a factor of 1.5 to 5. The improvement in spatial variance was usually accompanied by an improvement in variance of the spatial average and acoustic efficiency. One way to understand this is to examine the difference between peaks and dips in the modal response of rooms. Dips tend to be more location dependent than peaks. This means that dips will tend to cause more seat-to-seat variation and higher spatial variance than the spatially broader peaks. Thus, optimum solutions tend to be free of dips, which in turn improves variance of the spatial average and the efficiency factor.

Low-frequency analysis may work well with a variety of subwoofer systems, including those having two and four subwoofers. Low-frequency analysis may improve the performance with predetermined subwoofer locations and predetermined subwoofer number (e.g., a home theater system that has already been set-up such as those in Examples 1 and 2). Low-frequency analysis may generally perform better when it is free to choose the subwoofer locations, subwoofer number, and/or corrections, such as was discussed in Example 5.

Low-frequency analysis may focus on adjusting one, some, or all of the parameters discussed above including position of subwoofers, number of subwoofers, type of subwoofers, correction factors, or any combination thereof. Further, low-frequency analysis may focus on adjusting one, some, or all of the correction factors such as adjusting gain, delay and filtering simultaneously. However, all three correction factors do not need to be optimized to improve system performance. Finally, the analysis focuses on low-frequency performance; however, any frequency range may be optimized.

The flow charts described in FIGS. 4-12 and FIG. 14 may be performed by hardware or software. If the process is performed by software, the software may reside in any one of, or a combination of, the hard disk, external disk 548, ROM 530 or RAM 524 in measurement device 520 or a hard disk, external disk, ROM, or RAM in computational device 570. The software may include an ordered listing of executable instructions for implementing logical functions (i.e., "logic" that may be implemented either in digital form such as digital circuitry or source code or in analog form such as analog circuitry or an analog source such an analog electrical, sound or video signal), may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium," "machine-readable medium," "propagated-signal" medium, and/or "signal-bearing medium" is any means that may contain, store, communicate, propagate, or transport the program for use by or in connection with the instruction execution system, apparatus, or device. The machine-readable medium may selectively be, for example but not limited to, an electronic, magnetic, optical, electromagnetic, infrared, or semiconductor system, apparatus, device, or propagation medium. A non-exhaustive list of the machine-readable medium may include the following: an electrical connection "electronic" having one or more wires, a portable computer diskette (magnetic), a RAM (electronic), a ROM (electronic), an erasable programmable read-only memory (EPROM or Flash memory) (electronic), an optical fiber (optical), and a portable compact disc read-only memory "CDROM" (optical). The machine-readable medium may also comprise paper or another suitable medium upon which the program is printed, as the program may be electronically captured, via for instance optical scanning of the paper or other medium, then compiled, interpreted or otherwise processed in a suitable manner if necessary, and then stored in a computer and/or machine memory.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. An audio system comprising at least one crossover filter, the crossover filter for the audio system selected by a process comprising:

generating acoustic signals from at least one loudspeaker placed at potential loudspeaker locations;

recording transfer functions for the generated acoustic signals at a plurality of listening positions;

storing the recorded transfer functions in at least one memory;

modifying, using at least one processor, the stored transfer functions based on potential crossover filters in order to generate predicted transfer functions for at least two of the plurality of listening positions;

statistically analyzing across at least one frequency of the predicted transfer functions for the at least two of the plurality of listening positions; and selecting a crossover filter for the audio system based on the statistical analysis.

2. The audio system of claim 1, where the audio system is in a vehicle.

3. The audio system of claim 2, where the audio system comprises a plurality of speakers; and where the crossover filters associated with each speaker are selected based on the process.

4. The audio system of claim 1, where the potential crossover filters vary based on 3 dB down point and order of the filters.

5. The audio system of claim 1, where statistically analyzing across at least one frequency of the predicted transfer functions for the plurality of listening positions comprises statistically analyzing for at least one metric; and selecting a crossover filter based on the statistical analysis comprises selecting a potential crossover filter based on the at least one metric.

6. The audio system of claim 1, where the statistical analysis is selected from the group consisting of mean spatial variance, mean spatial standard deviation, mean spatial envelope, and mean spatial maximum average.

7. The audio system of claim 1, where the statistical analysis comprises mean spatial variance.

8. The audio system of claim 7, where the mean spatial variance is based on an average of spatial variance across the listening positions for a plurality of frequencies.

9. The audio system of claim 8, where selecting a crossover filter based on the statistical analysis comprises selecting a potential crossover filter which has a lower mean spatial variance than other potential crossover filters.

10. The audio system of claim 1, where the audio system comprises at least one loudspeaker with an operating range, and where the selected crossover filter attenuates frequencies outside of the operating range of the loudspeaker.

11. The audio system of claim 10, where the audio system comprises at least one main speaker and at least one subwoofer, and where the crossover filter for the main speaker comprises a high-pass filter; and where the crossover filter for the subwoofer comprises a low-pass filter.

12. The audio system of claim 1, where crossover filter is selected from the group consisting of low-pass filter and high-pass filter.

13. A method of selecting a crossover filter for an audio system, the method comprising:

generating acoustic signals from at least one loudspeaker placed at potential loudspeaker locations;

recording transfer functions for the generated acoustic signals at a plurality of listening positions;

storing the recorded transfer functions in at least one memory;

modifying, using at least one processor, the stored transfer functions based on potential crossover filters in order to generate predicted transfer functions for at least two of the plurality of listening positions;

statistically analyzing across at least one frequency of the predicted transfer functions for the at least two of the plurality of listening positions; and selecting the crossover, filter for the audio system based on the statistical analysis.

14. The method of claim 13, where the audio system is in a vehicle.

15. The method of claim 13, where the potential crossover filters vary based on 3 dB down point and order of the filters.

16. The method of claim 13, where statistically analyzing across at least one frequency of the predicted transfer functions for the plurality of listening positions comprises statistically analyzing for at least one metric; and selecting a crossover filter based on the statistical analysis comprises selecting a potential crossover filter based on the at least one metric.

17. The method of claim 13, where the statistical analysis is selected from the group consisting of mean spatial variance, mean spatial standard deviation, mean spatial envelope, and mean spatial maximum average.

18. The method of claim 13, where the statistical analysis comprises mean spatial variance.

19. The method of claim 18, where the mean spatial variance is based on an average of spatial variance across the listening positions for a plurality of frequencies.

20. The method of claim 19, where selecting a crossover filter based on the statistical analysis comprises selecting a potential crossover filter which has a lower mean spatial variance than other potential crossover filters.

* * * * *